United States Patent
Terada et al.

(10) Patent No.: US 7,446,992 B2
(45) Date of Patent: Nov. 4, 2008

(54) CONNECTOR

(75) Inventors: Yuji Terada, Tokyo (JP); Koichi Ishii, Tokyo (JP); Takeshi Yanata, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/525,935

(22) Filed: Sep. 25, 2006

(65) Prior Publication Data
US 2007/0076343 A1    Apr. 5, 2007

(30) Foreign Application Priority Data
Sep. 30, 2005    (JP)    ............... 2005-288220

(51) Int. Cl.
H01C 7/12    (2006.01)
(52) U.S. Cl. ...................... 361/117; 361/119
(58) Field of Classification Search ............. 361/117, 361/118, 119, 120
See application file for complete search history.

(56) References Cited

U.S. PATENT DOCUMENTS

| | | | |
|---|---|---|---|
| 3,340,458 A | 9/1967 | Keller | |
| 4,554,608 A | 11/1985 | Block | |
| 4,870,534 A | 9/1989 | Harford | |
| 5,124,873 A | 6/1992 | Wheeler et al. | |
| 5,668,511 A | 9/1997 | Furutani et al. | |
| 5,966,283 A | 10/1999 | Glaser et al. | |
| 6,137,352 A | 10/2000 | Germann | |
| 6,236,551 B1 | 5/2001 | Jones et al. | |
| 6,384,705 B1 | 5/2002 | Huang et al. | |
| 6,785,110 B2 | 8/2004 | Bartel et al. | |
| 6,937,115 B2 * | 8/2005 | Perreault et al. | 333/177 |
| 7,085,118 B2 * | 8/2006 | Inoue et al. | 361/119 |
| 7,221,550 B2 | 5/2007 | Chang et al. | |
| 2004/0145849 A1 | 7/2004 | Chang et al. | |
| 2004/0264087 A1 * | 12/2004 | Bishop | 361/91.1 |
| 2006/0038635 A1 | 2/2006 | Richiuso et al. | |

FOREIGN PATENT DOCUMENTS

| | | |
|---|---|---|
| EP | 1303004 | 4/2003 |
| GB | 2302621 A | 1/1997 |
| JP | A-03274815 | 12/1991 |
| JP | A-04129312 | 4/1992 |
| JP | A 2001-060838 | 3/2001 |
| JP | A-2005-136736 | 5/2005 |
| KR | 10-0470115 B1 | 1/2005 |
| KR | 10-0470116 B1 | 1/2005 |
| KR | 10-2005-0014094 | 2/2005 |
| WO | WO 03/103091 A2 | 12/2003 |

* cited by examiner

*Primary Examiner*—Michael J Sherry
*Assistant Examiner*—Danny Nguyen
(74) *Attorney, Agent, or Firm*—Oliff & Berridge, PLC

(57) ABSTRACT

A connector which can reduce electrostatic surges without deteriorating high-speed signals is provided. The connector in accordance with the first embodiment of the present invention comprises a first terminal, a second terminal connected to the first terminal, and a surge absorbing circuit provided between the first and second terminals. The surge absorbing circuit comprises (a) a first inductor having one end connected to the first terminal; (b) a second inductor, electromagnetically coupled to the first inductor, having one end connected to the other end of the first inductor and the other end connected to the second terminal; and (c) a surge absorbing element having one end connected to the other end of the first inductor and the one end of the second inductor and the other end connected to a ground terminal.

6 Claims, 26 Drawing Sheets

CONNECTOR

BACKGROUND OF THE INVENTION

1. Field of the Invention

The present invention relates to a connector.

2. Related Background Art

Connectors have been known as a device for connecting signal transmission lines between instruments. The connectors are exposed to the outside in general. Therefore, there is a possibility of electrostatic surges being inputted through a connector from the outside and breaking circuit elements in the instruments.

As measures against such electrostatic surges, surge absorbing elements such as varistors may be used. However, the surge absorbing elements such as varistors have stray capacitance components and stray inductance components. Therefore, employing a surge absorbing element in a circuit handling a high-speed signal may deteriorate the high-speed signal. For employing a surge absorbing element in a circuit handling a high-speed signal, rise and delay characteristics of the high-speed signal cannot be kept from deteriorating unless the stray capacitance component in the surge absorbing element is made small. However, lowering the stray capacitance component of a surge absorbing element increases the control voltage of the surge absorbing element and decreases the energy tolerance in the surge absorbing element.

Known as a surge absorbing element which alleviates the influence of the stray capacitance component is one comprising an inductor and two varistors (see, for example, Patent Document 1: Japanese Patent Application Laid-Open No. 2001-60838). The surge absorbing device disclosed in Patent Document 1 comprises a parallel circuit composed of a first varistor and an inductor, a second varistor electrically connected in series to the parallel circuit, and an I/O electrode and a ground electrode which are connected to both ends of a series circuit constructed by the second varistor and parallel circuit.

SUMMARY OF THE INVENTION

However, it is difficult for the surge absorbing element disclosed in Patent Document I to effect impedance matching over a wide band for a transmission line connected to the surge absorbing device, since the stray capacitance of the first varistor and the inductor construct a bandpass filter. Therefore, employing the surge absorbing element disclosed in Patent Document 1 in a circuit handling a high-speed signal may fail to realize a sufficient characteristic for the high-speed signal. Surge absorbing elements employed in circuits handing high-speed signals are desired to not only achieve favorable impedance matching for the high-speed signals, but also reduce the size of the elements themselves.

Therefore, it is an object of the present invention to provide a connector which can lower electrostatic surges without deteriorating high-speed signals.

A first connector of the present invention comprises a first terminal, a second terminal connected to the first terminal, and a surge absorbing circuit provided between the first and second terminals. The surge absorbing circuit comprises (a) a first inductor having one end connected to the first terminal; (b) a second inductor having one end connected to the other end of the first inductor and the other end connected to the second terminal, the first and second inductors being electromagnetically coupled together so as to increase each other's inductance; and (c) a surge absorbing element having one end connected to the other end of the first inductor and the one end of the second inductor and the other end connected to a ground terminal.

The surge absorbing circuit of the first connector has a surge absorbing circuit which is excellent in reducing electrostatic surges, and thus can lower the electrostatic surges. Also, this surge absorbing circuit has first and second inductors electromagnetically coupled to each other, and thus can set such a coupling factor as to keep a constant input impedance over a wide band. Further, this surge absorbing circuit can set the inductance of the first inductor and the inductance of the second inductor with respect to the stray capacitance component of the surge absorbing element such that the input impedance of the surge absorbing circuit and a characteristic impedance of a transmission line match each other. Therefore, this surge absorbing circuit is excellent in reducing electrostatic surges, and enables impedance matching over a wide band. Hence, the first connector equipped with this surge absorbing circuit can reduce electrostatic surges without deteriorating transmitted/received signals.

A second connector of the present invention comprises a first terminal, a second terminal connected to the first terminal, and a surge absorbing circuit provided between the first and second terminals. The surge absorbing circuit further comprises a capacitance element provided between the one end of the first inductor and the other end of the second inductor in addition to the surge absorbing circuit in the fist connector.

The surge absorbing circuit in the second connector can set the coupling factor between the first and second inductors and the capacitance value of the capacitance element such as to keep a constant input impedance over a wide band. Further, this surge absorbing circuit can set the respective inductances of the first and second inductors and their coupling factor with respect to the stray capacitance component of the surge absorbing element such that the input impedance of the surge absorbing circuit and a characteristic impedance of a transmission line match each other.

Even when the stray inductance component of the first surge absorbing element must be taken into consideration, the electromagnetic coupling between the first and second inductors can yield a negative inductance component which cancels out the stray inductance component of the surge absorbing element. Further, the respective inductances of the first and second inductors, their coupling factor, and the capacitance value of the capacitance element can be set such that the input impedance matches the characteristic impedance of the transmission line while being kept constant over a wide band. Therefore, the second connector equipped with this surge absorbing circuit can reduce electrostatic surges without deteriorating transmitted/received signals.

A third connector of the present invention comprises a first terminal, a second terminal connected to the first terminal, and a surge absorbing circuit provided between the first and second terminals. The surge absorbing circuit comprises (a) a first inductor having one end connected to the first terminal; (b) a second inductor having one end connected to the other end of the first inductor and the other end connected to the second terminal; (c) a surge absorbing element having one end connected to the other end of the first inductor and the one end of the second inductor and the other end connected to a ground terminal; and (d) a capacitance element provided between the one end of the first inductor and the other end of the second inductor.

The surge absorbing circuit of the third connector has a surge absorbing circuit which is excellent in reducing electrostatic surges, and thus can lower the electrostatic surges.

Also, this surge absorbing circuit can set the capacitance value of the capacitance element such as to keep a constant input impedance over a wide band. Further, this surge absorbing circuit can set the inductance of the first inductor and the inductance of the second inductor with respect to the stray capacitance component of the surge absorbing element such that the input impedance of the surge absorbing circuit and a characteristic impedance of a transmission line match each other. Therefore, this surge absorbing circuit is excellent in reducing electrostatic surges, and enables impedance matching over a wide band. Hence, the third connector equipped with this surge absorbing circuit can reduce electrostatic surges without deteriorating transmitted/received signals.

A fourth connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit comprises (a) a first inductor having one end connected to the first terminal; (b) a second inductor having one end connected to the other end of the first inductor and the other end connected to the second terminal, the first and second inductors being electromagnetically coupled together so as to increase each other's inductance; (c) a third inductor having one end connected to the third terminal; (d) a fourth inductor having one end connected to the other end of the third inductor and the other end connected to the fourth terminal, the third and fourth inductors being electromagnetically coupled together so as to increase each other's inductance; (e) a first surge absorbing element having one end connected to the other end of the first inductor and the one end of the second inductor and the other end connected to a ground terminal; and (f) a second surge absorbing element having one end connected to the other end of the third inductor and the one end of the fourth inductor and the other end connected to the ground terminal.

The surge absorbing circuit of the fourth connector has first and second surge absorbing elements which are excellent in reducing electrostatic surges, and thus can lower the electrostatic surges. Also, this surge absorbing circuit has first and second inductors which are electromagnetically coupled together and third and fourth inductors which are electromagnetically coupled together, and thus can set the coupling factor between the first and second inductors and the coupling factor between the third and fourth inductors such as to keep a constant input impedance over a wide band. Further, this surge absorbing circuit can set the inductance of the first inductor and the inductance of the second inductor with respect to the stray capacitance component of the first surge absorbing element and the inductance of the third inductor and the inductance of the fourth inductor with respect to the stray capacitance component of the second surge absorbing element such that the input impedance of the surge absorbing circuit and a characteristic impedance of a transmission line match each other. Therefore, this surge absorbing circuit is excellent in reducing electrostatic surges, and enables impedance matching over a wide band. Hence, the fourth connector equipped with this surge absorbing circuit can reduce electrostatic surges without deteriorating differential transmitted/received signals.

A fifth connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit further comprises a first capacitance element provided between the one end of the first inductor and the other end of the second inductor and a second capacitance element provided between the one end of the third inductor and the other end of the fourth inductor in addition to the surge absorbing circuit in the fourth connector.

The surge absorbing circuit of the fifth connector can set the coupling factor between the first and second inductors, the coupling factor between the third and fourth inductors, the capacitance value of the first capacitance element, and the capacitance value of the second capacitance element so as to keep a constant input impedance over a wide band. Further, this surge absorbing circuit can set the respective inductances of the first, second, third, and fourth inductors, the coupling factor between the first and second inductors, and the coupling factor between the third and fourth inductors with respect to the stray capacitance component of the first surge absorbing element and the stray capacitance component of the second surge absorbing element such that the input impedance of the surge absorbing circuit and a characteristic impedance of a transmission line match each other.

Even when the stray inductance components of the first and second surge absorbing elements must be taken into consideration, the electromagnetic coupling between the first and second inductors can yield a negative inductance component which cancels out the stray inductance component of the first surge absorbing element, whereas the electromagnetic coupling between the third and fourth inductors can yield a negative inductance component which cancels out the stray inductance component of the second surge absorbing element. Further, the respective inductances of the first and second inductors, their coupling factor, the respective inductances of the third and fourth inductors, their coupling factor, and the capacitance value of the capacitance element can be set such that the input impedance matches the characteristic impedance of the transmission line while being kept constant over a wide band. Therefore, the fifth connector equipped with this surge absorbing circuit can reduce electrostatic surges without deteriorating differential transmitted/received signals.

A sixth connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit comprises (a) a first inductor having one end connected to the first terminal; (b) a second inductor having one end connected to the other end of the first inductor and the other end connected to the second terminal; (c) a third inductor having one end connected to the third terminal; (d) a fourth inductor having one end connected to the other end of the third inductor and the other end connected to the fourth terminal; (e) a first surge absorbing element having one end connected to the other end of the first inductor and the one end of the second inductor and the other end connected to a ground terminal; and (f) a second surge absorbing element having one end connected to the other end of the third inductor and the one end of the fourth inductor and the other end connected to the ground terminal. The first, second, third, and fourth inductors are electromagnetically coupled together so as to increase each other's inductance when a differential signal is applied thereto.

The surge absorbing circuit of the sixth connector has first and second surge absorbing elements which are excellent in reducing electrostatic surges, and thus can lower the electrostatic surges. Also, this surge absorbing circuit has first to fourth inductors which are electromagnetically coupled together, and thus can set the coupling factor among the first to fourth inductors such as to keep a constant input impedance over a wide band. Further, this surge absorbing circuit can set the respective inductances of the first to fourth inductors and their coupling factor with respect to the stray capacitance components and stray inductance components of the first and second surge absorbing elements such that the input impedance of the first surge absorbing element and a characteristic impedance of the transmission line match each other. Therefore, this surge absorbing circuit is excellent in reducing electrostatic surges, and enables impedance matching over a wide band. Hence, the sixth connector equipped with this surge absorbing circuit can reduce electrostatic surges without deteriorating differential transmitted/received signals.

A seventh connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit further comprises a first capacitance element provided between the one end of the first inductor and the other end of the second inductor and a second capacitance element provided between the one end of the third inductor and the other end of the fourth inductor in addition to the surge absorbing circuit in the sixth connector.

The surge absorbing circuit of the seventh connector can set the coupling factor among the first, second, third, and fourth inductors and the respective capacitance values of the first and second capacitance elements so as to keep a constant input impedance over a wide band. Further, this surge absorbing circuit can set the respective inductances of the fist, second, third, and fourth inductors and their coupling factor with respect to the stray capacitance components of the first and second surge absorbing elements such that the input impedance of the surge absorbing circuit and a characteristic impedance of a transmission line match each other.

Even when the stray inductance components of the first and second surge absorbing elements must be taken into consideration, the electromagnetic coupling among the first, second, third, and fourth inductors can yield a negative inductance component which cancels out the stray inductance components of the first and second surge absorbing elements. Further, the respective inductances of the first, second, third, and fourth inductors, their coupling factor, and the respective capacitance values of the first and second capacitance elements can be set such that the input impedance matches the characteristic impedance of the transmission line while being kept constant over a wide band. Therefore, the seventh connector equipped with this surge absorbing circuit can reduce electrostatic surges without deteriorating differential transmitted/received signals.

An eighth connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit comprises (a) a first inductor having one end connected to the first terminal; (b) a second inductor having one end connected to the other end of the first inductor and the other end connected to the second terminal; (c) a third inductor having one end connected to the third terminal, the first and third inductors being electromagnetically coupled together so as to increase each other's inductance when a differential signal is applied thereto; (d) a fourth inductor having one end connected to the other end of the third terminal and the other end connected to the fourth terminal, the second and fourth inductors being electromagnetically coupled together so as to increase each other's inductance when a differential signal is applied thereto; (e) a first surge absorbing element having one end connected to the other end of the first inductor and the one end of the second inductor and the other end connected to a ground terminal; (f) a second surge absorbing element having one end connected to the other end of the third inductor and the one end of the fourth inductor and the other end connected to the ground terminal; (g) a first capacitance element provided between the one end of the first inductor and the other end of the second inductor, and (h) a second capacitance element provided between the one end of the third inductor and the other end of the fourth inductor.

The surge absorbing circuit of the eighth connector has first and second surge absorbing elements which are excellent in reducing electrostatic surges, and thus can lower the electrostatic surges. Also, this surge absorbing circuit can set the respective capacitance values of the first and second capacitance elements so as to keep a constant input impedance over a wide band. Further, this surge absorbing circuit has first and third inductors which are electromagnetically coupled together and second and fourth inductors which are electromagnetically coupled together, and thus can set the respective inductances of the first, second, third, and fourth inductors, the coupling factor between the first and third inductors, and the coupling factor between the second and fourth inductors with respect to the stray capacitance components and stray inductance components of the first and second surge absorbing elements such that the input impedance of the first surge absorbing element and a characteristic impedance of the transmission line match each other. Therefore, this surge absorbing circuit is excellent in reducing electrostatic surges, and enables impedance matching over a wide band. Hence, the eighth connector equipped with this surge absorbing circuit can reduce electrostatic surges without deteriorating differential transmitted/received signals.

A ninth connector of the present invention comprises a first terminal, a second terminal connected to the first terminal, a third terminal, a fourth terminal connected to the third terminal, and a surge absorbing circuit provided between the first and second terminals and between the third and fourth terminals. The surge absorbing circuit comprises (a) a first inductor having one end connected to the first terminal; (b) a second inductor having one end connected to the other end of the first inductor and the other end connected to the second terminal; (c) a third inductor having one end connected to the third terminal; (d) a fourth inductor having one end connected to the other end of the third inductor and the other end connected to the fourth terminal; (e) a first surge absorbing element having one end connected to the other end of the first inductor and the one end of the second inductor and the other end connected to a ground terminal; (f) a second surge absorbing element having one end connected to the other end of the third inductor and the one end of the fourth inductor and the other end connected to the ground terminal; (g) a first capacitance element provided between the one end of the first inductor and the other end of the second inductor; and (h) a second capacitance element provided between the one end of the third inductor and the other end of the fourth inductor.

The surge absorbing circuit of the ninth connector has first and second surge absorbing elements which are excellent in reducing electrostatic surges, and thus can lower the electrostatic surges. Also, this surge absorbing circuit can set the respective capacitance values of the first and second capacitance elements so as to keep a constant input impedance over a wide band. Further, this surge absorbing circuit can set the respective inductances of the first and second inductors with respect to the stray capacitance component of the first surge absorbing element and the respective inductances of the third and fourth inductors with respect to the stray capacitance component of the second surge absorbing element such that the input impedance of the surge absorbing circuit and a characteristic impedance of a transmission line match each other. Therefore, this surge absorbing circuit is excellent in reducing electrostatic surges, and enables impedance matching over a wide band. Hence, the ninth connector equipped with this surge absorbing circuit can reduce electrostatic surges without deteriorating differential transmitted/received signals.

Preferably, each of surge absorbing circuits in the above-mentioned first to ninth conductors is constructed by a multilayer body having a conductor pattern therewithin and on a surface thereof. This structure can make the surge absorbing circuit smaller and reduce the stray capacitance component.

The present invention provides connectors which can reduce electrostatic charges without deteriorating high-speed signals.

DESCRIPTION OF THE PREFERRED EMBODIMENTS

Figure 1:
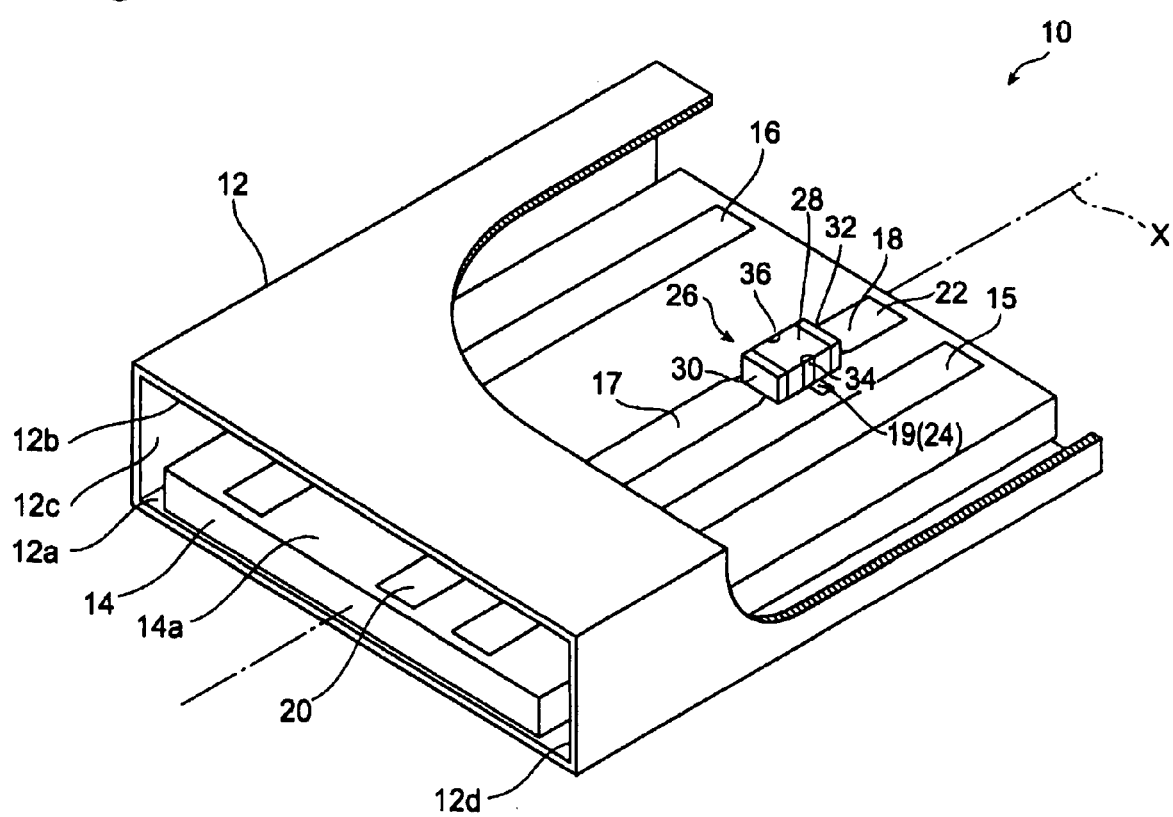
FIG. 1 is a partly broken perspective view showing the connector in accordance with a first embodiment of the present invention.

In the following, preferred embodiments of the present invention will be explained in detail with reference to the drawings. In the drawings, the same or equivalent parts will be referred to with the same numerals.

First Embodiment

FIG. 1 is a partly broken perspective view showing the connector in accordance with a first embodiment of the present invention. This connector 10 comprises a frame 12, a substrate 14, and a multilayer surge absorbing component 26.

The frame 12 has a rectangular cylindrical form extending along an axis X. Specifically, the frame has inner faces 12a, 12b, 12c, 12d defining an inner hole. The inner faces 12a and 12b are substantially parallel to each other, whereas the inner faces 12c and 12d are substantially parallel to each other. The inner faces 12c and 12d are substantially orthogonal to the inner faces 12a and 12b. The substrate 14 is provided on the inner face 12a of the fame 12.

The substrate 14 is fixed to the inner face 12a of the frame 12. One main face 14a of the substrate 14 is separated from the inner face 12b. External connectors to connect with the connector 10 are inserted between the substrate 14 and inner face 12b.

Provided on the main face 14a of the substrate 14 are a first power wiring pattern 15, a second power wiring pattern (e.g., grounding pattern) 16, a first signal wiring pattern 17, a second signal wiring pattern I 8, and a ground pattern 19 which are used for connecting with the external connectors.

The first power wiring pattern 15 and second power wiring pattern 16 are conductor patterns extending along the axis X. The first power wiring pattern 15 and second power wiring pattern 16 are leads for feeding a power between an instrument connected to the connector 10 and an instrument connected to an external connector. The first signal wiring pattern 17 and second signal wiring pattern 18 are provided between the first power wiring pattern 15 and second power wiring pattern 16.

The first signal wiring pattern 17 and second signal wiring pattern 18 are conductor patterns extending along the axis X, and are successively provided along the axis X. One end part of the first signal wiring pattern 17 in the direction of the axis X is used as a first terminal 20. The other end part of the second signal wiring pattern 18 in the direction of the axis X is used as a second terminal 22. The ground pattern 19 is provided between the first signal wiring pattern 17 and second wiring pattern 18. The ground pattern 19 is a conductor pattern extending in a direction orthogonal to the axis X. The ground pattern 19 is used as a ground terminal 24. The ground pattern 19 is connected to the second power wiring pattern 16 acting as a grounding pattern, for example, through a via and a conductor pattern provided on a main face opposing the main face 14a of the substrate 14. The ground pattern 19 may be connected to the second power wiring pattern 16 acting as a grounding pattern through a conductor pattern provided on the main face 14a of the substrate 14 as well. The ground pattern 19 may also be connected to other grounding patterns through a via and a conductor pattern provided on the main face opposing the main face 14a of the substrate 14. The multilayer surge absorbing component 26 is mounted between the first signal wiring pattern 17 and second signal wiring pattern 18.

The multilayer surge absorbing component 26 has a first electrode 30, a second electrode 32, and third electrodes 34, 36 on surfaces of a substantially rectangular parallelepiped multilayer body 28. The first electrode 30 is connected to the first signal wiring pattern 17, whereas the second electrode 32 is connected to the second signal wiring pattern 18. The third electrodes 34, 36 are connected to the ground pattern 19. The multilayer surge absorbing component 26 constructs a surge absorbing circuit by a conductor pattern formed within the multilayer body 28.

Thus, the connector 10 comprises the first terminal 20, second terminal 22, ground terminal 24, and surge absorbing circuit, whereby an instrument or external connector connected to the first terminal 20 and an instrument or external connector connected to the second terminal 22 can be connected to each other.

Figure 2:
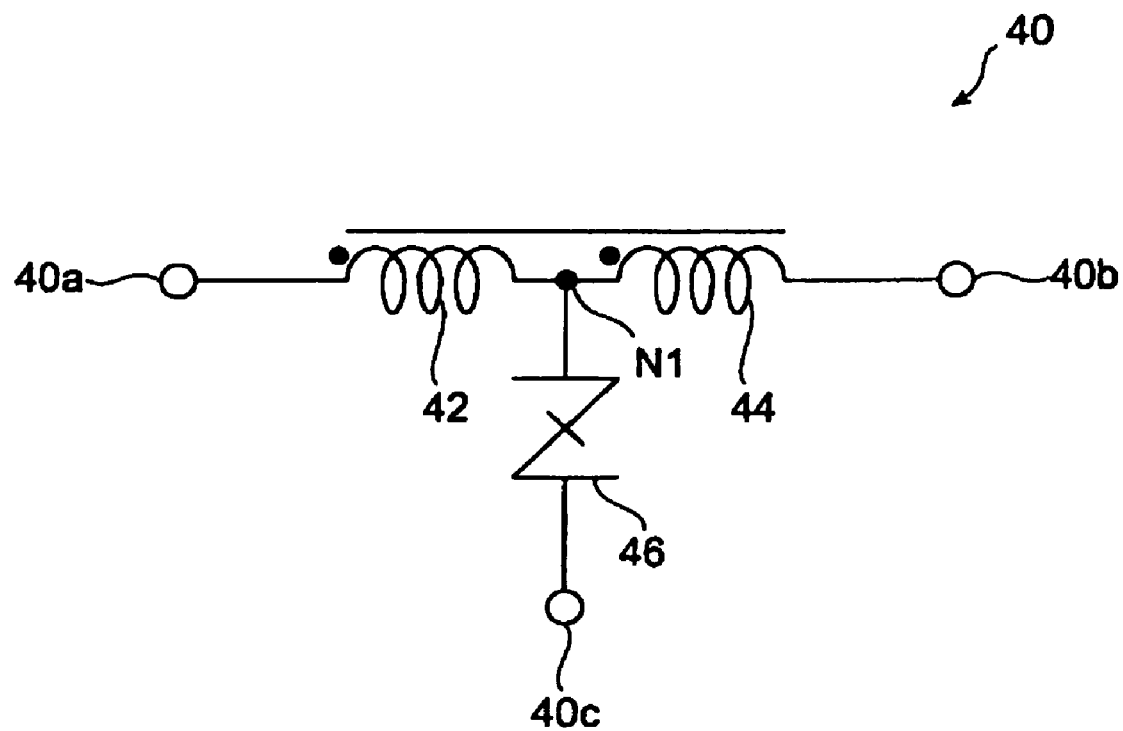
FIG. 2 is a circuit diagram showing a surge absorbing circuit employable in the connector in accordance with the first embodiment.

A surge absorbing circuit employable in the connector 10 in accordance with the first embodiment will now be explained. FIG. 2 is a circuit diagram showing a surge absorbing circuit employable in the connector in accordance with the first embodiment. The surge absorbing circuit 40 shown in FIG. 2 has a first I/O terminal 40a, a second I/O terminal 40b, a third I/O terminal 40c, a first inductor 42, a second inductor 44, and a surge absorbing element 46.

The first I/O terminal 40a corresponds to the first electrode 30 of the multilayer surge absorbing component 26, whereas the second I/O terminal 40b corresponds to the second electrode 32 of the multilayer surge absorbing component 26. The third I/O terminal 40c corresponds to the third electrodes 34, 36 of the multilayer surge absorbing component 26.

The first inductor 42 has one end connected to the first I/O terminal 40a and the other end connected to a node N1. The second inductor 44 has one end connected to the node N1 and the other end connected to the second I/O terminal 40b. The first inductor 42 and second inductor 44 are electromagnetically coupled together. Specifically, the first inductor 42 and second inductor 44 are magnetically coupled so as to increase each other's inductance. Namely, they are coupled such that, when a current is directed from the first I/O terminal 40a to the second I/O terminal 40b or vice versa, the respective magnetic fields generated in the first inductor 42 and second inductor 44 by this current are oriented in the same direction, whereby their inductances increase. Preferably, the coupling factor between the first inductor 42 and second inductor 44 is greater than 0.01 but not exceeding 1.

The first surge absorbing element 46 has one end connected to the node N1. The other end of the first surge absorbing element 46 is connected to the third I/O terminal 40c. The first surge absorbing element 46 is a varistor made of a metal oxide such as ZnO in this embodiment. The first surge absorbing element 46 exhibits a large resistance value between terminals when the voltage between the terminals is lower than a predetermined voltage. When the voltage between the terminals is higher than the predetermined voltage, on the other hand, the first surge absorbing element 46 lowers the resistance value between the terminals, so as to allow a current to flow between the terminals, thereby clamping the voltage between the terminals at a predetermined voltage. The predetermined voltage is a value determined by a characteristic of the first surge absorbing element 46. 100691 Therefore, when a signal with a lower voltage level is fed to the first I/O terminal 40a, the surge absorbing circuit 40 outputs the signal to the second I/O terminal 40b, since the resistance value between the terminals of the first surge absorbing element 46 is greater. Similarly, when a signal with a lower voltage level is fed to the second I/O terminal 40b, the surge absorbing circuit 40 outputs the signal to the first I/O terminal 40a, since the resistance value between the terminals of the first surge absorbing element 46 is greater.

When an electrostatic surge is fed to the first I/O terminal 40a, on the other hand, the first surge absorbing element 46 lowers the resistance value between the first I/O terminal 40a and third I/O terminal 40c, whereby the surge absorbing circuit 40 allows a current to flow between the first I/O terminal 40a and third I/O terminal 40c and clamps the voltage of the node N1. Thus, even when an electrostatic surge is fed to the first I/O terminal 40a, the surge absorbing circuit 40 lowers the voltage outputted to the second I/O terminal 40b.

Similarly, when an electrostatic surge is fed to the second I/O terminal 40b, the first surge absorbing element 46 lowers the resistance value between the second I/O terminal 40b and third I/O terminal 40c, whereby the surge absorbing circuit 40 allows a current to flow between the second I/O terminal 40b and third I/O terminal 40c and clamps the voltage of the node N1. Thus, even when an electrostatic surge is fed to the second I/O terminal 40b, the surge absorbing circuit 40 lowers the voltage outputted to the first I/O terminal 40a.

Figure 3:
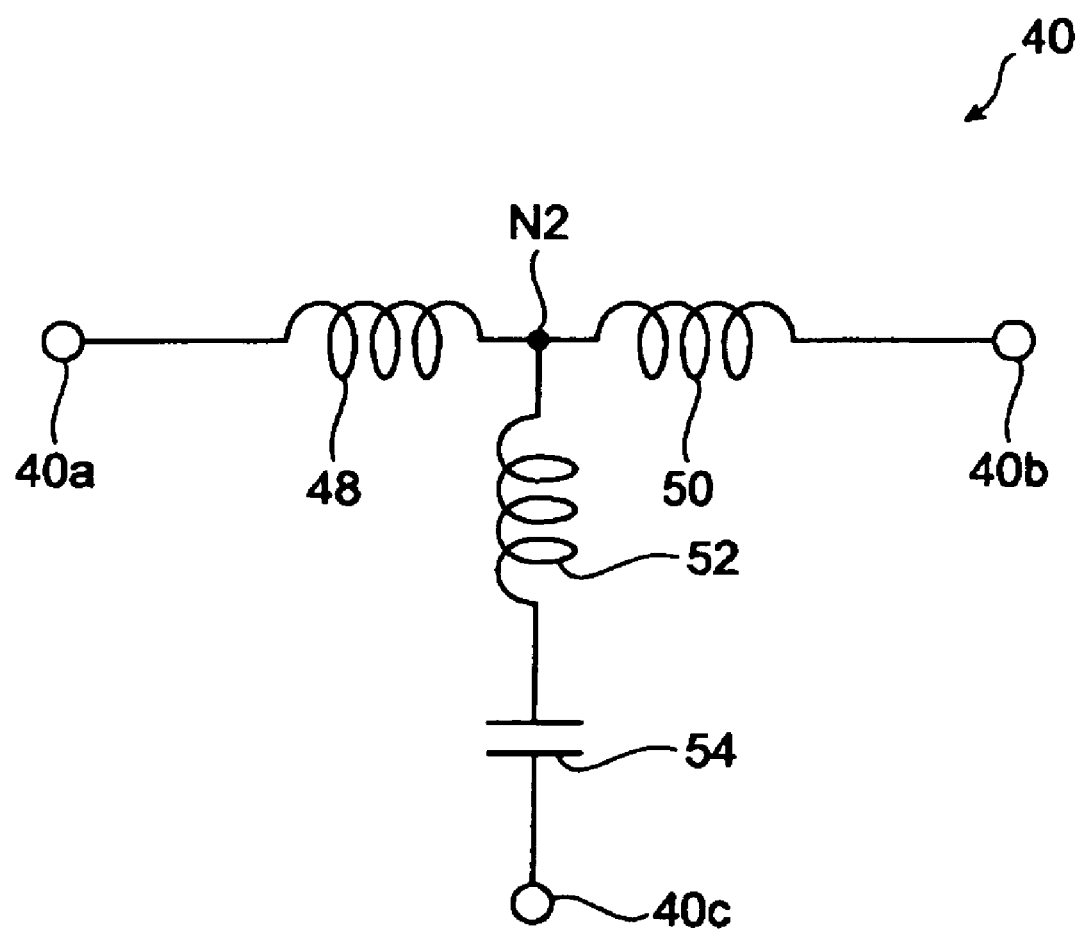
FIG. 3 is a circuit diagram equivalently illustrating the surge absorbing circuit shown in FIG. 2.

FIG. 3 is a circuit diagram equivalently illustrating the surge absorbing circuit shown in FIG. 2. The first inductor 42 and second inductor 44 are electromagnetically coupled together, and thus can be equivalently represented by two inductors 48, 50 and a negative inductor (negative inductance element) 52. The first surge absorbing element 46 can be equivalently represented by a variable resistance element and a stray capacitance element (stray capacitance component) 54 connected in parallel, and can be approximated by the stray capacitance element 54 alone for small high-speed signals.

In the equivalent circuit shown in FIG. 3, the inductor 48 has one end connected to the first I/O terminal 40a and the other end connected to a node N2. The inductor 50 has one end connected to the node N2 and the other end connected to the second I/O terminal 40b. The negative inductor 52 has one end connected to the node N2 and the other end connected to one end of the stray capacitance element 54. The stray capacitance element 54 is connected to the third I/O terminal 40c.

Letting Lz be each of the inductance of the first inductor 42 and the inductance of the second inductor 44, and Kz be the coupling factor between the first inductor 42 and second inductor 44, each of the inductance of the inductor 48 and the inductance of the inductor 50 becomes "(1+Kz)·Lz", whereas the inductance of the negative inductor 52 becomes "−Kz·Lz". Let Cz be the capacitance value of the stray capacitance element 54. Therefore, the input impedance of the surge absorbing circuit 40 shown in FIG. 3 is represented by the following expression (1):

[Expression 1] (1)

$$Zin = \sqrt{\frac{2(1+Kz)Lz}{Cz} + \omega^2 Lz^2(Kz^2-1)}$$

The above-mentioned expression (1) shows that, when Kz=±1, the second term including ω in the right side becomes 0, whereby the input impedance Zin is constant independently of frequency. However, the case where Kz=−1 is inappropriate, since Zin=0.

When Lz is set so as to satisfy the following expression (2) while letting Kz=1, the input impedance Zin of the surge absorbing circuit 40 can match a characteristic impedance Zo of a transmission line connected to the surge absorbing circuit 40.

[Expression 2] (2)

$$Lz = \frac{Z_0^2 Cz}{4}$$

Thus, the surge absorbing circuit 40 in accordance with this embodiment has the first surge absorbing element 46 excellent in reducing electrostatic surges, and consequently can lower the electrostatic surges. The surge absorbing circuit 40 in accordance with this embodiment has the first inductor 42 and second inductor 44 electromagnetically coupled together, and thus can set the coupling factor between the first inductor 42 and second inductor 44 such as to keep a constant input impedance over a wide band. Further, the surge absorbing circuit 40 of this embodiment can set the inductance of the first inductor 42 and the inductance of the second inductor 44 with respect to the stray capacitance component of the first surge absorbing element 46 such that the input impedance of the surge absorbing circuit 40 and a characteristic impedance of a transmission line match each other. Therefore, this surge absorbing circuit 40 is excellent in reducing electrostatic surges, and enables impedance matching over a wide band. Hence, the connector 10 equipped with the surge absorbing circuit 40 in accordance with this embodiment can reduce electrostatic surges without deteriorating transmitted/received signals.

Figure 4:
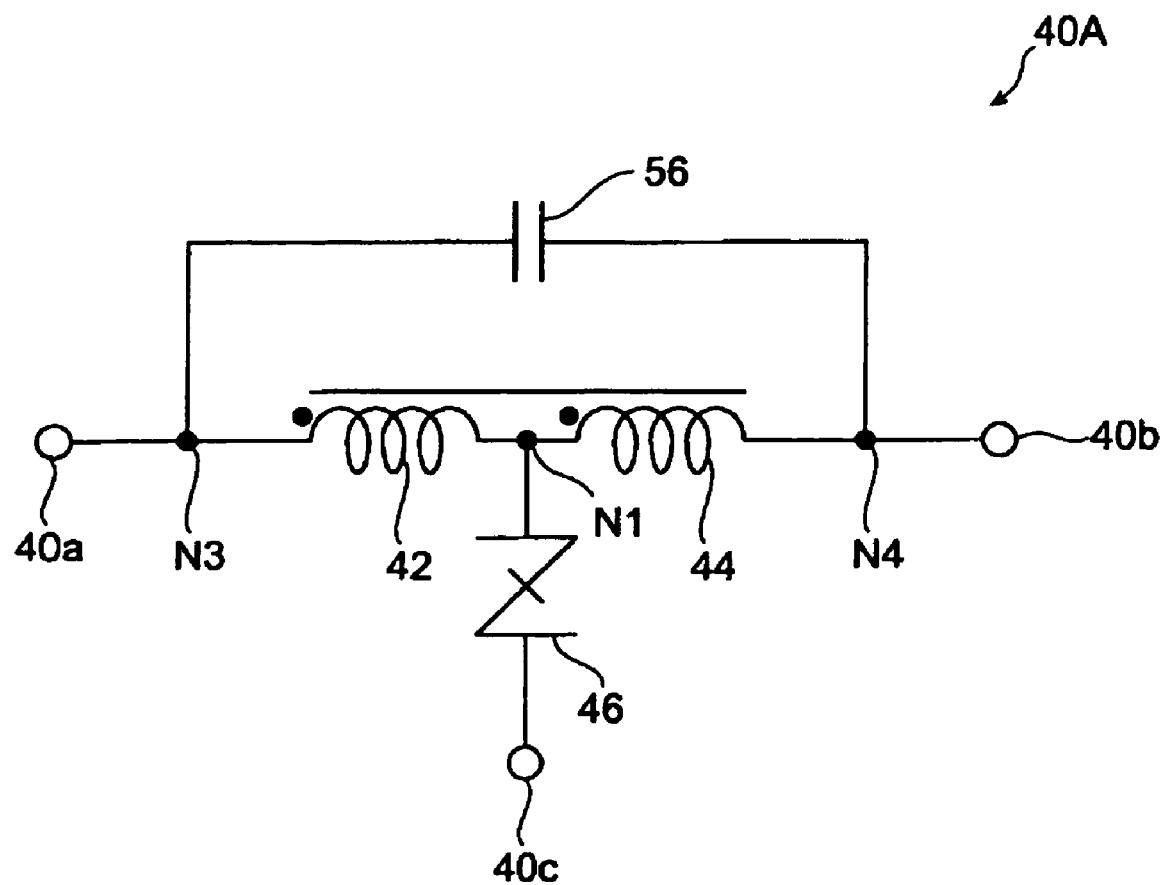
FIG. 4 is a circuit diagram showing the surge absorbing circuit in accordance with Modified Example 1 employable in the connector of the first embodiment.

[Modified Example 1 of surge absorbing circuit employable in the connector of the first embodiment] FIG. 4 is a circuit diagram showing the surge absorbing circuit in accordance with Modified Example 1 employable in the connector of the first embodiment. The surge absorbing circuit 40A shown in FIG. 4 further comprises a first capacitance element 56 in addition to elements similar to those of the surge absorbing circuit 40.

The first capacitance element 56 has one end connected to a node N3 for connecting the first I/O terminal 40a and one end of the first inductor 42 to each other. The other end of the first capacitance element 56 is connected to a node N4 for connecting the second I/O terminal 40b and the other end of the second inductor 44 to each other.

Figure 5:
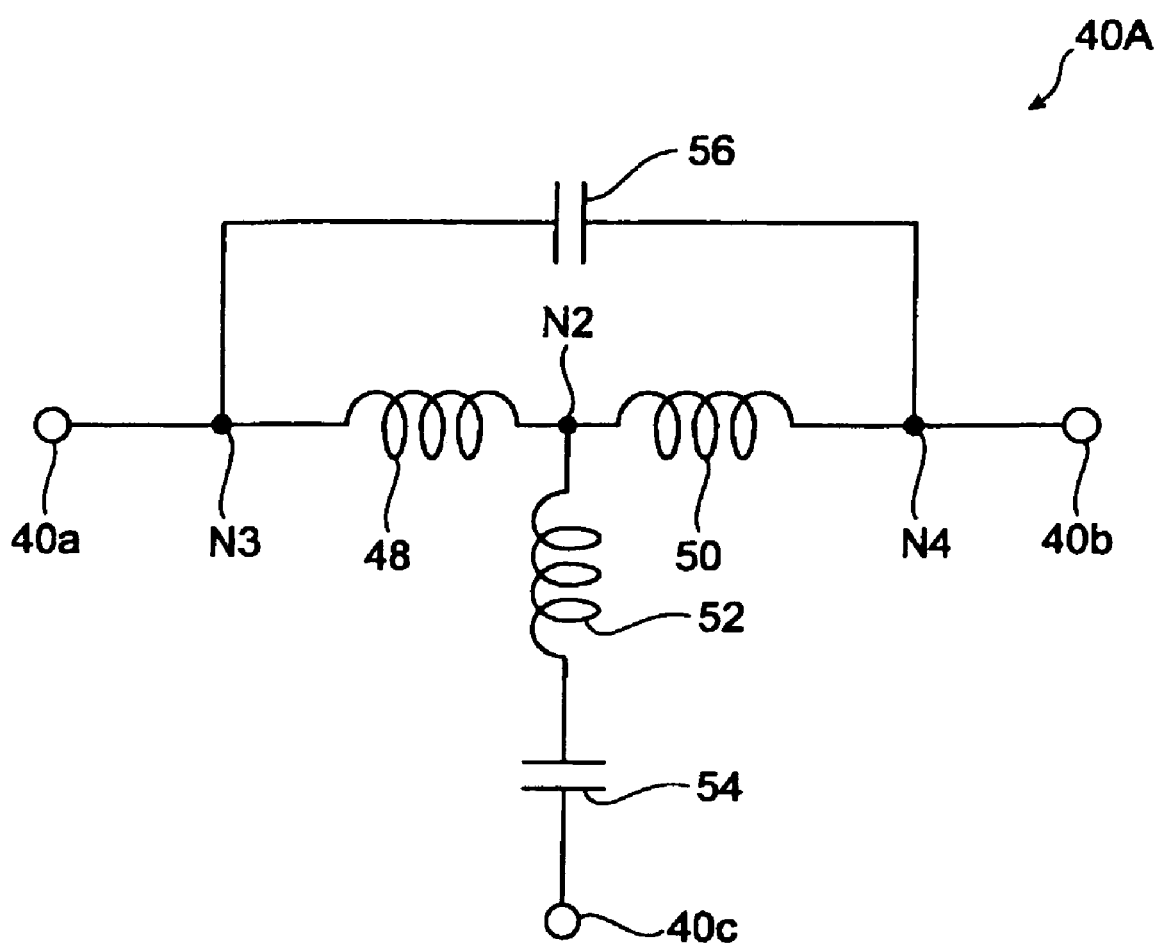
FIG. 5 is a circuit diagram equivalently illustrating the surge absorbing circuit shown in FIG. 4.

FIG. 5 is a circuit diagram equivalently illustrating the surge absorbing circuit shown in FIG. 4. As in the surge absorbing circuit 40, the first inductor 42 and second inductor 44 that are electromagnetically coupled together can be represented by two inductors 48, 50 and a negative inductor (negative inductance element) 52. The first surge absorbing element 46 can be approximated by a stray capacitance element (stray capacitance component) 54 alone for small high-speed signals.

Letting Lz be each of the inductance of the first inductor 42 and the inductance of the second inductor 44, and Kz be the coupling factor between the first inductor 42 and second inductor 44, each of the inductance of the inductor 48 and the inductance of the inductor 50 becomes "(1+Kz)·Lz", whereas the inductance of the negative inductor 52 becomes "−Kz·Lz". Let Cs and Cz be the respective capacitance values of the first capacitance element 56 and stray capacitance element 54. Therefore, the input impedance of the surge absorbing circuit 40A shown in FIG. 5 is represented by the following expression (3):

[Expression 3] (3)

$$Zin = \sqrt{\frac{2(1+Kz)Lz}{Cz} \frac{1 - \omega^2 Lz((1-Kz)Cz/2)}{1 - \omega^2 Lz(2(1+Kz)Cs)}}$$

The above-mentioned expression (3) shows that, when Cs is set so as to satisfy the following expression (4), the input impedance Zin is constant independently of frequency.

Further, when Cs is set so as to satisfy the following expression (4), while Lz is set so as to satisfy the following expression (5), the input impedance Zin of the surge absorbing circuit 40A can match the characteristic impedance Zo of a transmission line connected to the surge absorbing circuit 40A.

[Expression 4] (4)

$$Cs = \frac{1-Kz}{4(1+Kz)} Cz$$

[Expression 5] (5)

$$Lz = \frac{Z_0^2 Cz}{2(1+Kz)}$$

As the above-mentioned expressions (4) and (5) illustrate, the surge absorbing circuit 40A of Modified Example 1 can arbitrarily choose Kz. Namely, the surge absorbing circuit 40A of Modified Example 1 can change Cs and Lz by altering Kz, and thus makes it possible to design circuits with a higher flexibility than in the surge absorbing circuit 40.

Thus, the surge absorbing circuit 40A of Modified Example 1 can set the coupling factor between the first inductor 42 and second inductor 44 and the capacitance value of the first capacitance element 56 such as to keep a constant input impedance over a wide band. Further, the surge absorbing circuit 40A of Modified Example 1 can set the respective inductances of the first inductor 42 and second inductor 44 and the coupling actor between the first inductor 42 and second inductor 44 with respect to the stray capacitance component of the first surge absorbing element 46 such that the input impedance of the surge absorbing circuit 40A and a characteristic impedance of a transmission line match each other. Hence, the connector 10 in accordance with this embodiment equipped with the surge absorbing circuit 40A of Modified Example 1 in place of the surge absorbing circuit 40 can reduce electrostatic surges without deteriorating transmitted/received signals.

Figure 6:
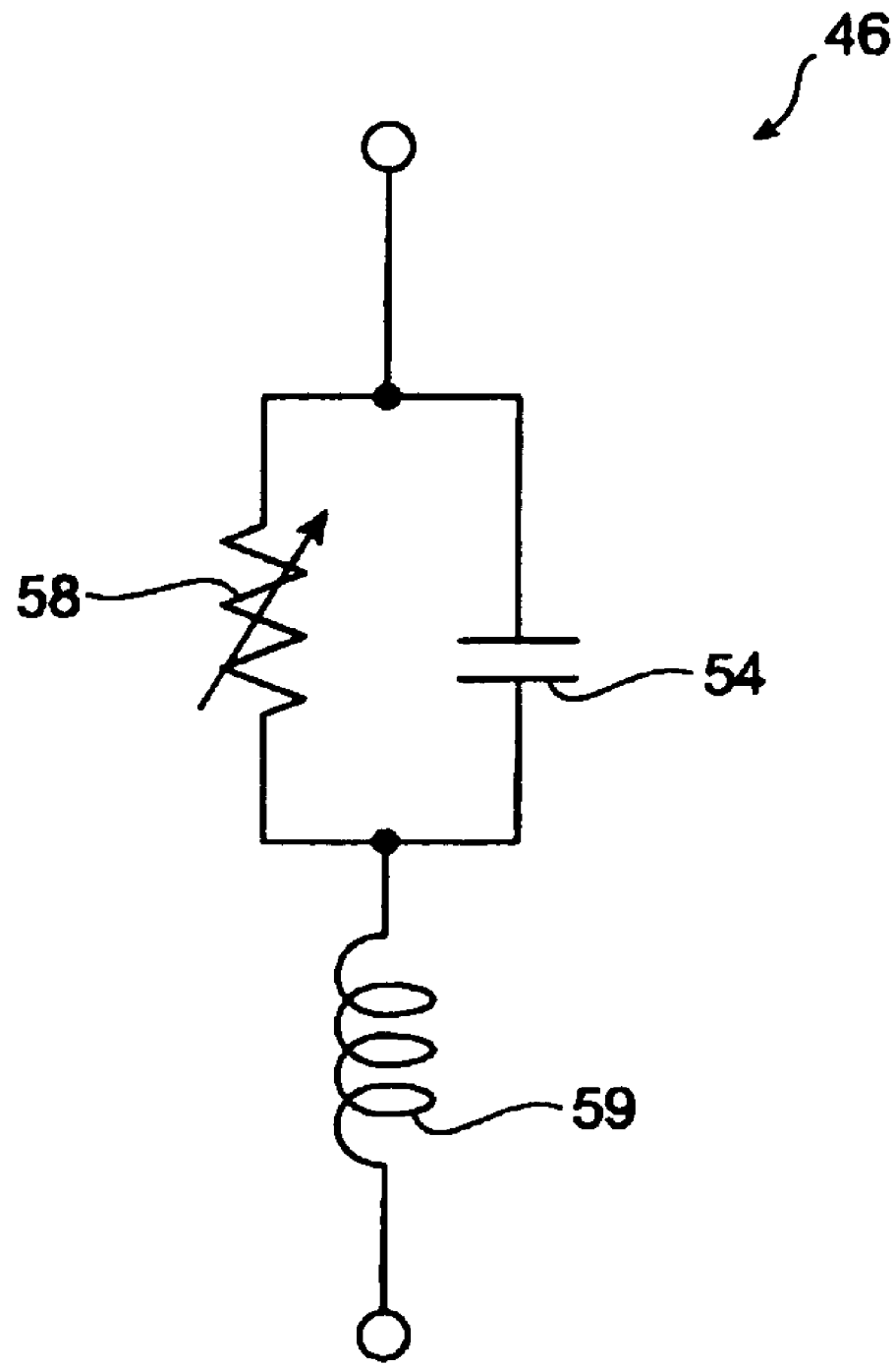
FIG. 6 is an equivalent circuit diagram of the first surge absorbing element.

The first surge absorbing element 46 is approximated by the stray capacitance element 54 alone in the foregoing explanation, but actually includes a stray inductance element (stray inductance component). FIG. 6 is an equivalent circuit diagram of a first surge absorbing element. The fist surge absorbing element 46 shown in FIG. 6 is represented by a variable resistance element 58 and a stray capacitance element 54 which are connected in parallel, and a stray inductance element 59 connected in series thereto. The stray inductance element 59 also causes the impedance of the surge absorbing circuit 40 to fluctuate with respect to frequency. Namely, the stray inductance element 59 also causes transmitted/received high-speed signals to deteriorate.

In the surge absorbing circuit 40A of Modified Example 1, however, the first inductor 42 and second inductor 44 that are electromagnetically coupled together have the negative inductor 52, which can cancel out the stray inductance element 59. Since the resulting state appears as if the coupling is made smaller, Kz and Lz are left as they are, whereas Cs is set as defined by the following expression (6):

[Expression 6] (6)

$$Cs = \frac{1 - Kz + 2Le/Lz}{4(1 + Kz)} Cz$$

Here, Le is the inductance of the stray inductance element 59, and $KzLz \geqq Le$. Setting Cs so as to satisfy the above-mentioned expression (6) allows the input impedance Zin of the surge absorbing circuit 40A to match the characteristic impedance Zo of a transmission line connected to the surge absorbing circuit 40A even when the first surge absorbing element 46 includes the stray capacitance element 54 and stray inductance element 59.

Thus, the surge absorbing circuit 40A of Modified Example 1 can attain a negative inductance component which cancels out the stray inductance component of the first surge absorbing element 46 by the electromagnetic coupling between the first inductor 42 and second inductor 44. Further, the respective inductances of the first inductor 42 and second inductor 44, their coupling factor, and the capacitance value of the first capacitance element 56 can be set such that the input impedance matches a characteristic impedance of the transmission line and is kept constant over a wide band. Therefore, the connector 10 in accordance with this embodiment equipped with the surge absorbing circuit 40A of Modified Example 1 in place of the surge absorbing circuit 40 can reduce electrostatic surges without deteriorating transmitted/received signals.

Figure 7:
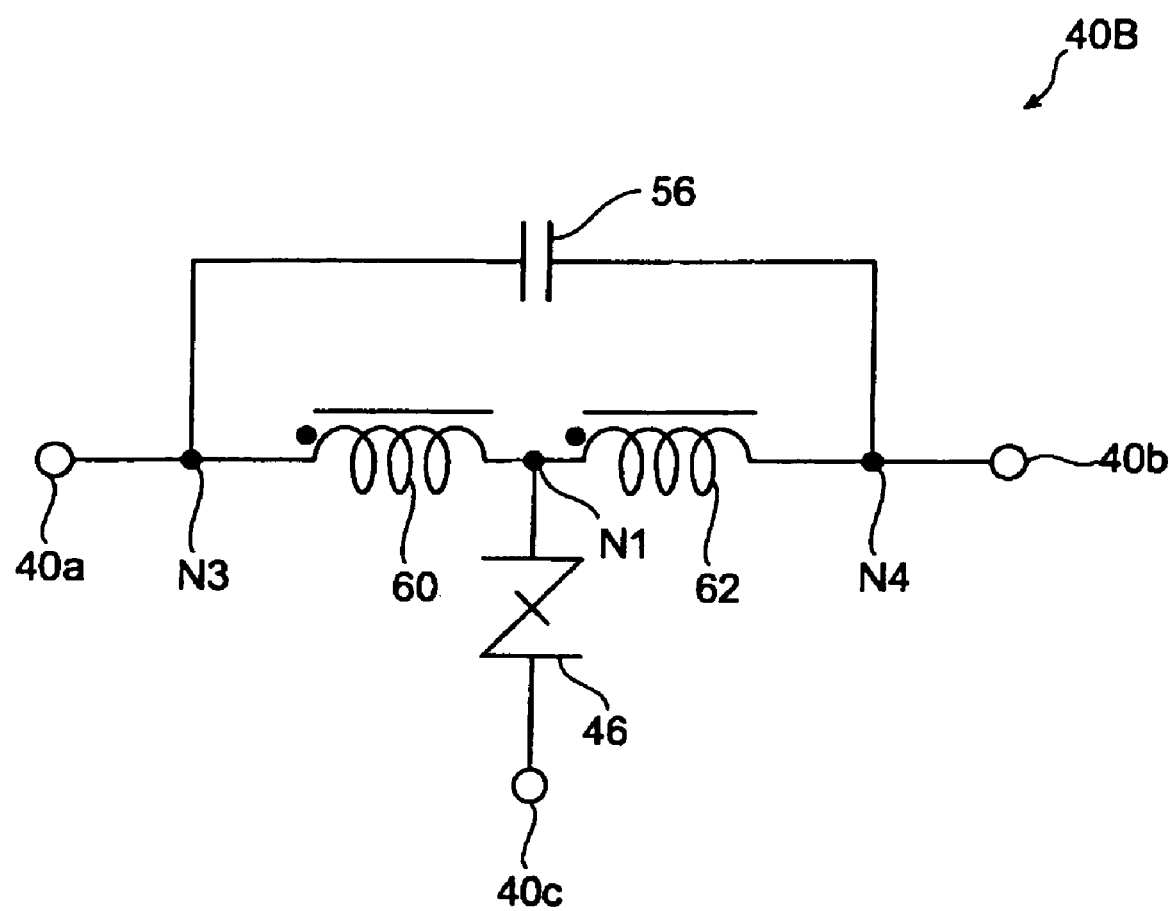
FIG. 7 is a circuit diagram showing the surge absorbing circuit in accordance with Modified Example 2 employable in the connector of the first embodiment.

[Modified Example 2 of surge absorbing circuit employable in the connector of the first embodiment] FIG. 7 is a circuit diagram showing the surge absorbing circuit in accordance with Modified Example 2 employable in the connector of the first embodiment. The surge absorbing circuit 40B shown in FIG. 7 differs from the surge absorbing circuit 40A of Modified Example 1 in that the first and second inductors are not electromagnetically coupled together. The other structure of the surge absorbing circuit 40B is the same as the surge absorbing circuit 40A of Modified Example 1.

The surge absorbing circuit 40B comprises a first inductor 60 and a second inductor 62 which are not electromagnetically coupled together in place of the first inductor 42 and second inductor 44 that are electromagnetically coupled together in the surge absorbing circuit 40A, respectively. Preferably, the coupling factor between the first inductor 60 and second inductor 62 is 0.01 or less.

Let Lx be each of the inductance of the first inductor 60 and the inductance of the second inductor 62, and Cx be the capacitance value of the first capacitance element 56. The first surge absorbing element 46 is approximated by the stray capacitance element (stray capacitance component) 54 alone for small high-speed signals, and Cz is assumed to be the capacitance value of the stray capacitance element 54. As a consequence, the input impedance of the surge absorbing circuit 40B shown in FIG. 7 is represented by the following expression (7):

[Expression 7] (7)

$$Zin = \sqrt{\frac{2Lx}{Cz} \frac{1 - \omega^2 Lx(Cz/2)}{1 - \omega^2 Lx(2Cx)}}$$

The above-mentioned expression (7) shows that, when Cx is set so as to satisfy the following expression (8), the input impedance Zin becomes constant independently of frequency.

Further, when Cx is set so as to satisfy the following expression (8), while Lx is set so as to satisfy the following expression (9), the input impedance Zin of the surge absorbing circuit 40B can match the characteristic impedance Zo of a transmission line connected to the surge absorbing circuit 40B.

[Expression 8] (8)

$$Cx = \frac{Cz}{4}$$

[Expression 9] (9)

$$Lx = \frac{Z_0^2 Cz}{2}$$

Thus, the surge absorbing circuit 40B of Modified Example 2 has the first surge absorbing element 46 excellent in reducing electrostatic surges and thus can lower the electrostatic surges. Also, the surge absorbing circuit 40B of Modified Example 2 can set the capacitance value of the first capacitance element 56 such as to keep a constant input impedance over a wide band. Further, the surge absorbing circuit 40B of Modified Example 2 can set the inductance of the first inductor 60 and the inductance of the second inductor 62 with respect to the stray capacitance component of the first surge absorbing element 46 such that the input impedance of the surge absorbing circuit 40B matches a characteristic impedance of a transmission line. Therefore, the surge absorbing circuit 40B of Modified Example 2 is excellent in reducing electrostatic surges and enables impedance matching over a wide band. Hence, the connector 10 in accordance with this embodiment equipped with the surge absorbing circuit 40B of Modified Example 2 in place of the surge absorbing circuit 40 can reduce electrostatic surges without deteriorating transmitted/received signals.

Second Embodiment

Figure 8:
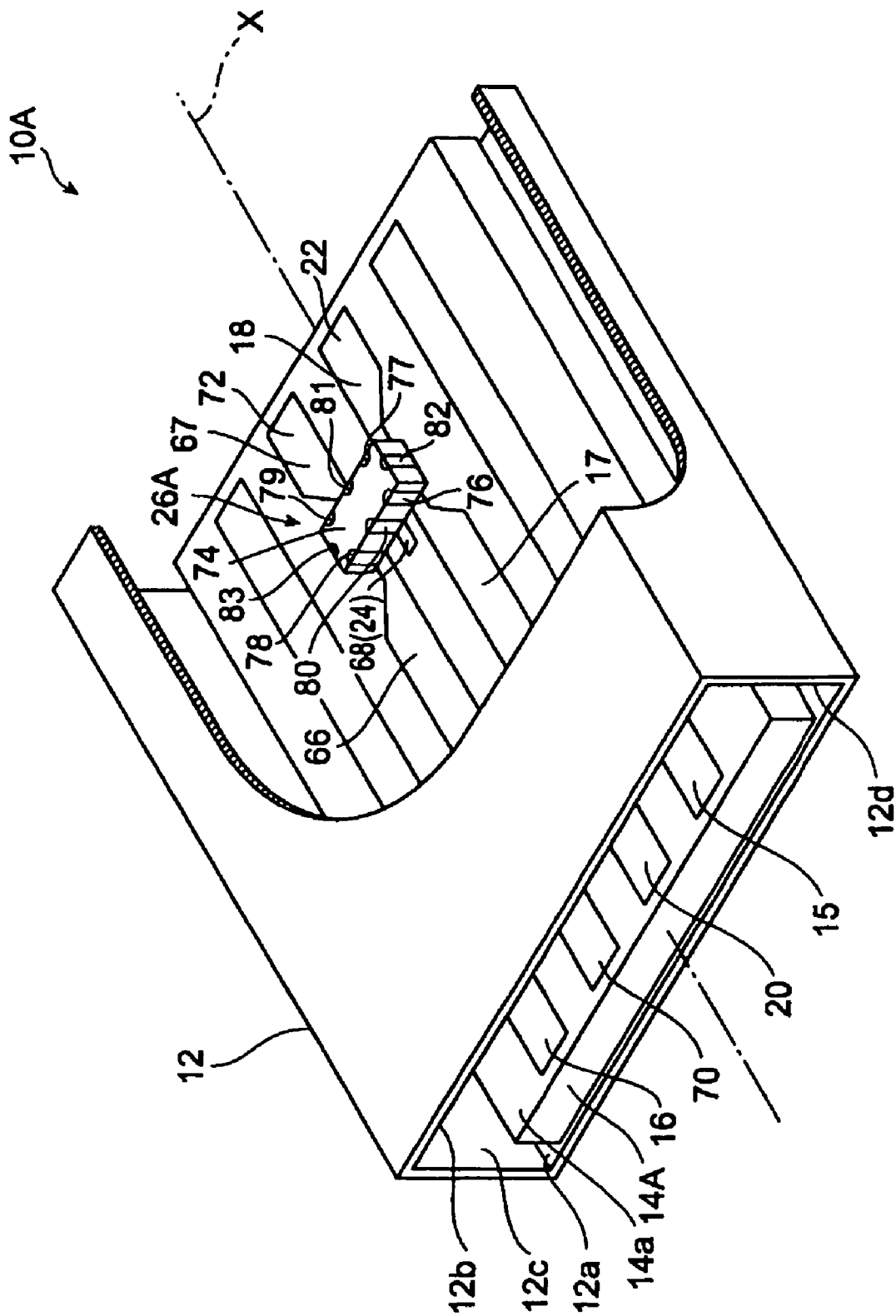
FIG. 8 is a partly broken perspective view showing the connector in accordance with a second embodiment of the present invention.

FIG. 8 is a partly broken perspective view showing the connector in accordance with a second embodiment of the present invention. This connector 10A differs from the connector 10 of the first embodiment in that it comprises a multilayer surge absorbing component 26A in place of the multilayer surge absorbing component 26. The other structure is the same as that of the connector 10. The connector 10A is a USB connector, for example.

The substrate 14A is fixed to an inner face 12a of a frame 12. One main face 14a of the substrate 14A is separated from an inner face 12b of the frame 12 opposing the inner face 12a. External connectors to connect with the connector 10A are inserted between the substrate 14A and the inner face 12b of the frame 12. Provided on the main face 14a of the substrate 14A are a first power wiring pattern 15, a second power wiring pattern (e.g., grounding pattern) 16, a first signal wiring pattern 17, a second signal wiring pattern 18, a third signal wiring pattern 66, a fourth signal wiring pattern 67, and a ground pattern 68 which are used for connecting with the external connectors.

The first power wiring pattern 15, second power wiring pattern (e.g., grounding pattern) 16, first signal wiring pattern 17, and second signal wiring pattern 18 are conductor patterns similar to their corresponding wiring patterns in the connector 10. Therefore, one end part of the first signal wiring pattern 17 in the direction of an axis X is used as a first terminal 20, whereas the other end part of the second signal wiring pattern 18 in the direction of the axis X is used as a second terminal 22.

The third signal wiring pattern 66 is provided between the first signal wiring pattern 17 and second power wiring pattern 16, whereas the fourth signal wiring pattern 67 is provided between the second signal wiring pattern 18 and second power wiring pattern 16. The third signal wiring pattern 66 and fourth signal wiring pattern 67 are conductor patterns extending along the axis X, and are successively provided along the axis X. One end part of the third signal wiring pattern 66 in the direction of the axis X is used as a third terminal 70. The other end part of the fourth signal wiring pattern 67 in the direction of the axis X is used as a fourth terminal 72.

The ground pattern 68 is provided between the other end part of the third signal wring pattern 66 and the other end part of the first signal wiring pattern 17 and between the fourth signal wiring pattern 67 and second signal wiring pattern 18. The ground pattern 68 is a conductor pattern extending along the axis X. The ground pattern 68 is used as a ground terminal 24. The, ground pattern 68 is connected to the second power wiring pattern 16 acting as a grounding pattern, for example, through a conductor pattern provided on the main face 14a of the substrate 14A. The ground pattern 68 may be connected to the second power wiring pattern 16 acting as a grounding pattern through a via and a conductor pattern provided on a main face opposing the main face 14a of the substrate 14A as well. The ground pattern 68 may also be connected to other grounding patterns through a via and a conductor pattern provided on the main face opposing the main face 14a of the substrate 14A.

A multilayer surge absorbing component 26A is mounted between the first signal wiring pattern 17 and second signal wiring pattern 18 and between the third signal wiring pattern 66 and fourth signal wiring pattern 67.

On surfaces of a rectangular parallelepiped multilayer body 74, the multilayer surge absorbing component 26A has a first electrode 76, a second electrode 77, a third electrode 78, a fourth electrode 79, fifth electrodes 80, 81, a sixth electrode 82, and a seventh electrode 83. The first electrode 76 is connected to the first signal wiring pattern 17, whereas the second electrode 77 is connected to the second signal wiring pattern 18. The third electrode 78 is connected to the third signal wiring pattern 66, whereas the fourth electrode 79 is connected to the fourth signal wiring pattern 67. The fifth electrodes 80, 81 are connected to the ground pattern 68. The sixth electrode 82 and seventh electrode 83 are provided for connecting with conductor patterns formed within the multilayer body 74. The multilayer surge absorbing component 26A constructs a surge absorbing circuit by conductor patterns formed within the multilayer body 74.

Thus, the connector 10A comprises the first terminal 20, second terminal 22, third terminal 70, fourth terminal 72, ground terminal 24, and surge absorbing circuit, whereby instruments or external connectors connected to the first terminal 20 and third terminal 70 can be connected to instruments or external connectors connected to the second terminal 22 and fourth terminal 72.

Figure 9:
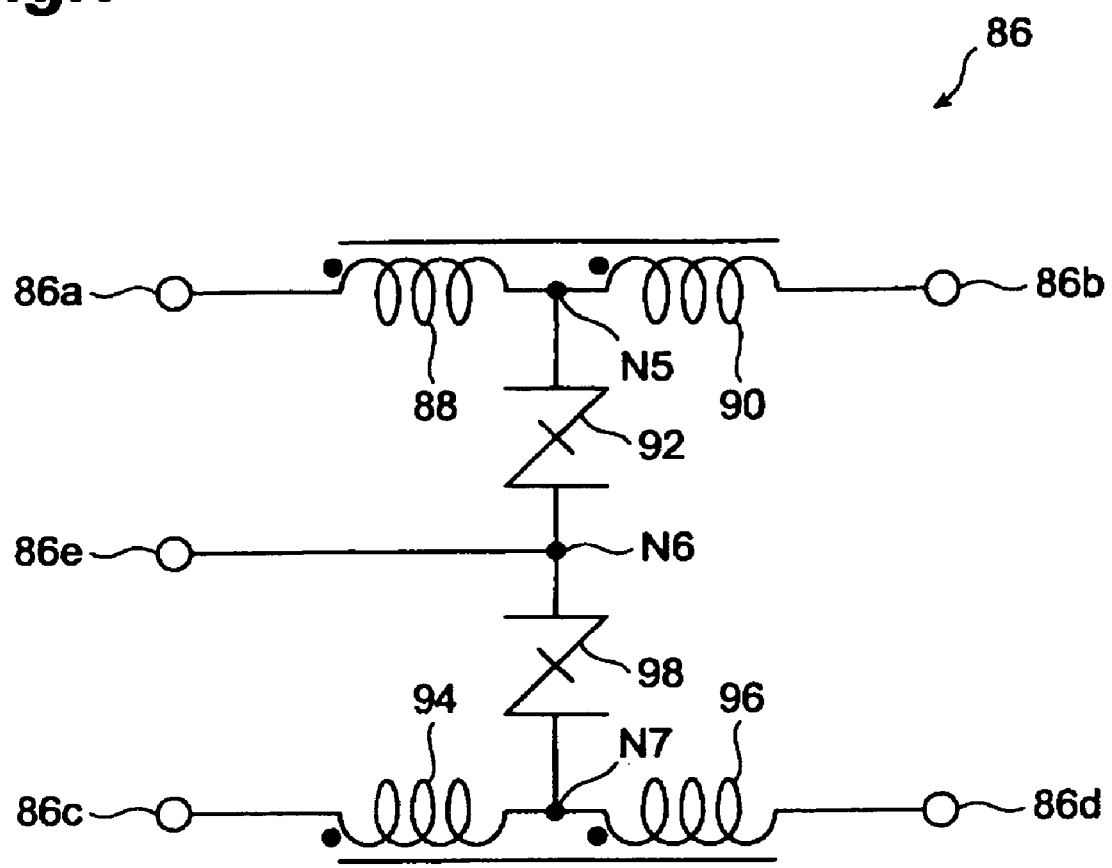
FIG. 9 is a circuit diagram showing a surge absorbing circuit employable in the connector in accordance with the second embodiment.

The surge absorbing circuit of the second embodiment will now be explained. FIG. 9 is a circuit diagram showing a surge absorbing circuit employable in the connector of the second embodiment. This surge absorbing circuit 86 has a first I/O terminal 86a, a second I/O terminal 86b, a third I/O terminal 86c, a fourth I/O terminal 86d, a fifth I/O terminal 86e, a first inductor 88, a second inductor 90, a first surge absorbing element 92, a third inductor 94, a fourth inductor 96, and a second surge absorbing element 98.

The first I/O terminal 86a corresponds to the first electrode 76 of the multilayer surge absorbing component 26A, whereas the second I/O terminal 86b corresponds to the second electrode 77 of the multilayer surge absorbing component 26A. The third I/O terminal 86c corresponds to the third electrode 78 of the multilayer surge absorbing component 26A, whereas the fourth I/O terminal 86d corresponds to the fourth electrode 79 of the multilayer surge absorbing component 26A. The fifth I/O terminal 86e corresponds to the fifth electrodes 80, 81 of the multilayer surge absorbing component 26A.

The first inductor 88 has one end connected to the first I/O terminal 86a and the other end connected to a node N5. The second inductor 90 has one end connected to the node N5 and the other end connected to the second I/O terminal 86b. The first inductor 88 and second inductor 90 are electromagnetically coupled together. Specifically, the first inductor 88 and second inductor 90 are magnetically coupled so as to increase each other's inductance. Namely, they are coupled such that, when a current is directed from the first I/O terminal 86a to the second I/O terminal 86b or vice versa, the respective magnetic fields generated in the first inductor 88 and second inductor 90 by this current are oriented in the same direction, whereby their inductances increase. Preferably, the coupling factor between the first inductor 88 and second inductor 90 is greater than 0.01 but not exceeding 1.

The first surge absorbing element 92 has one end connected to the node N5. The other end of the first surge absorbing element 92 is connected to a node N6, to which the fifth I/O terminal 86e is connected. As with the first surge absorbing element 46 of the first embodiment, the first surge absorbing element 92 is a varistor made of a metal oxide such as ZnO.

On the other hand, the third inductor 94 has one end connected to the third I/O terminal 86c and the other end connected to a node N7. The fourth inductor 96 has one end connected to the node N7 and the other end connected to the fourth I/O terminal 86d. The third inductor 94 and fourth inductor 96 are electromagnetically coupled together. Specifically, the third inductor 94 and fourth inductor 96 are magnetically coupled so as to increase each other's inductance. Namely, they are coupled such that, when a current is directed from the third I/O terminal 86c to the fourth I/O terminal 86d or vice versa, the respective magnetic fields generated in the third inductor 94 and fourth inductor 96 by this current are oriented in the same direction, whereby their inductances increase. Preferably, the coupling factor between the third inductor 94 and fourth inductor 96 is greater than 0.01 but not exceeding 1.

The second surge absorbing element 98 has one end connected to the node N7. The other end of the second surge absorbing element 98 is connected to the node N6. As with the first surge absorbing element 46 of the first embodiment, the second surge absorbing element 98 is a varistor made of a metal oxide such as ZnO.

Therefore, when a differential signal with a lower voltage level is fed to the first I/O terminal 86a and third I/O terminal 86c, the surge absorbing circuit 86 outputs the differential signal to the second I/O terminal 86b and fourth I/O terminal 86d, since the resistance value between the terminals of the first surge absorbing element 92 and the resistance value between the terminals of the second surge absorbing element 98 are greater. Similarly, when a differential signal with a lower voltage level is fed to the second I/O terminal 86b and fourth I/O terminal 86d, the surge absorbing circuit 86 outputs the differential signal to the first I/O terminal 86a and third I/O terminal 86c, since the resistance value between the terminals of the first surge absorbing element 92 and the resistance value between the terminals of the second surge absorbing element 98 are greater.

When an electrostatic surge is fed to the first I/O terminal 86a, on the other hand, the first surge absorbing element 92 lowers the resistance value between the first I/O terminal 86a and fifth I/O terminal 86e, whereby the surge absorbing circuit 86 allows a current to flow between the first I/O terminal 86a and fifth I/O terminal 86e and clamps the voltage of the node N5. When an electrostatic surge is fed to the third I/O terminal 86c, the second surge absorbing element 98 lowers the resistance value between the third I/O terminal 86c and fifth I/O terminal 86e, whereby the surge absorbing circuit 86 allows a current to flow between the third I/O terminal 86c and fifth I/O terminal 86e and clamps the voltage of the node N7. Thus, even when an electrostatic surge is fed to the fist 10 terminal 86a or third I/O terminal 86c, the surge absorbing circuit 86 lowers the voltage outputted to the second I/O terminal 86b or fourth I/O terminal 86d.

Similarly, when an electrostatic surge is fed to the second I/O terminal 86b, on the other hand, the first surge absorbing element 92 lowers the resistance value between the second I/O terminal 86b and fifth I/O terminal 86e, whereby the surge absorbing circuit 86 allows a current to flow between the second I/O terminal 86b and fifth I/O terminal 86e and clamps the voltage of the node N5. When an electrostatic surge is fed to the fourth I/O terminal 86d, the second surge absorbing element 98 lowers the resistance value between the fourth I/O terminal 86d and fifth I/O terminal 86e, whereby the surge absorbing circuit 86 allows a current to flow between the fourth I/O terminal 86d and fifth I/O terminal 86e and clamps the voltage of the node N7. Thus, even when an electrostatic surge is fed to the second I/O terminal 86b or fourth I/O terminal 86d, the surge absorbing circuit 86 lowers the voltage outputted to the first I/O terminal 86a or third I/O terminal 86c.

Figure 10:
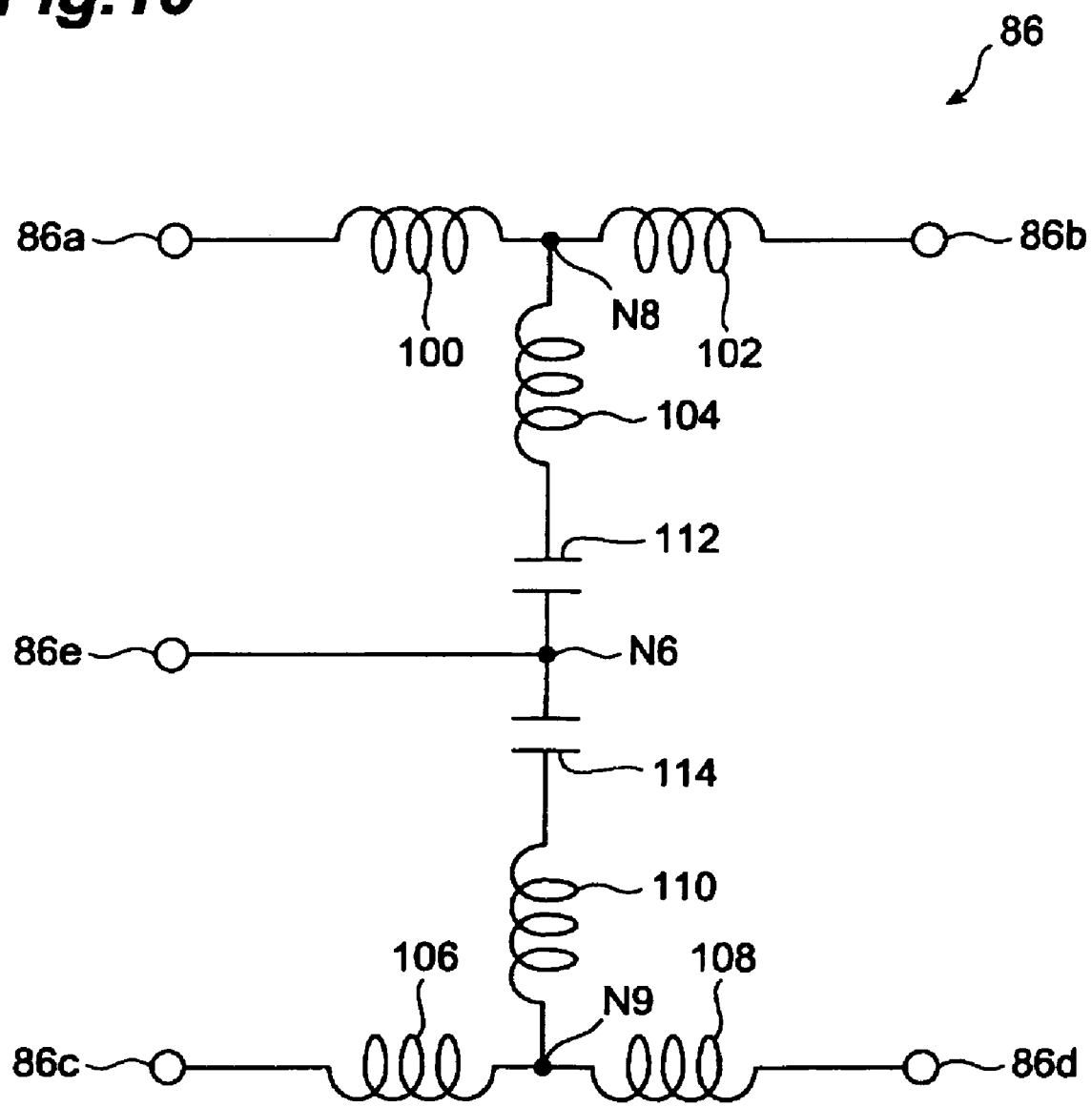
FIG. 10 is a circuit diagram equivalently illustrating the surge absorbing circuit shown in FIG. 9.

FIG. 10 is a circuit diagram equivalently illustrating the surge absorbing circuit shown in FIG. 9. The first inductor 88 and second inductor 90 are electromagnetically coupled together, and thus can be equivalently represented by two inductors 100, 102 and a negative inductor (negative inductance element) 104. Similarly, the third inductor 94 and fourth inductor 96 are electromagnetically coupled together, and thus can be equivalently represented by two inductors 106, 108 and a negative inductor (negative inductance element) 110. As mentioned above, the first surge absorbing element 92 can be approximated by a stray capacitance element (stray capacitance component) 112 alone for small high-speed signals. Similarly, the second surge absorbing element 98 can be approximated by a stray capacitance element (stray capacitance component) 114 alone for small high-speed signals.

In the equivalent circuit shown in FIG. 10, the inductor 100 has one end connected to the first I/O terminal 86a and the other end connected to a node N8. The inductor 102 has one end connected to the node N8 and the other end connected to the second I/O terminal 86b. The negative inductor 104 has one end connected to the node N8 and the other end connected to one end of the stray capacitance element 112. The other end of the stray capacitance element 112 is connected to the node N6, to which the fifth I/O terminal 86e is connected.

On the other hand, the inductor 106 has one end connected to the third I/O terminal 86c and the other end connected to a node N9. The inductor 108 has one end connected to the node N9 and the other end connected to the fourth I/O terminal 86d. The negative inductor 110 has one end connected to the node N9 and the other end connected to one end of the stray capacitance element 114. The other end of the stray capacitance element 114 is connected to the node N6.

Letting Lz be each of the inductances of the first inductor 88, second inductor 90, third inductor 94, and fourth inductor 96, and Kz be each of the coupling factor between the first inductor 88 and second inductor 90 and the coupling factor between the third inductor 94 and fourth inductor 96, each of the inductances of the inductors 100, 102, 106, and 108 becomes "$(1+Kz){\cdot}Lz$", whereas each of the inductances of the negative inductors 104 and 110 becomes "$-Kz{\cdot}Lz$". Let Cz be each of the capacitance values of the stray capacitance elements 112 and 114. Therefore, the input impedance between the first I/O terminal 86a and third I/O terminal 86c of the surge absorbing circuit 86 shown in FIG. 10 is represented by the following expression (10). The input impedance between the second I/O terminal 86b and fourth I/O terminal 86d of the surge absorbing circuit 86 is also represented by the following expression (10):

[Expression 10] (10)

$$Zin = 2 \times \sqrt{\frac{2(1+Kz)Lz}{Cz} + \omega^2 Lz^2 (Kz^2 - 1)}$$

The above-mentioned expression (10) shows that, when $Kz=\pm 1$, the second term including $\omega$ in the right side becomes 0, whereby the input impedance Zin is constant independently of frequency. However, the case where Kz=−1 is inappropriate, since Zin=0.

When Lz is set so as to satisfy the following expression (11) while letting Kz=1, the input impedance Zin of the surge absorbing circuit 86 can match an impedance which is twice the characteristic impedance Zo of a transmission line connected to the surge absorbing circuit 86.

[Expression 11] (11)
$$Lz = \frac{Z_0^2 Cz}{4}$$

Thus, the surge absorbing circuit 86 in accordance with this embodiment has the first surge absorbing element 92 and second surge absorbing element 98 that are excellent in reducing electrostatic surges, and consequently can lower the electrostatic surges. The surge absorbing circuit 86 in accordance with this embodiment has the first inductor 88 and second inductor 90 electromagnetically coupled together and the third inductor 94 and fourth inductor 96 electromagnetically coupled together, and thus can set the coupling factor between the first inductor 88 and second inductor 90 and the coupling factor between the third inductor 94 and fourth inductor 96 such as to keep a constant input impedance over a wide band. Further, the surge absorbing circuit 86 of this embodiment can set the inductance of the first inductor 88 and the inductance of the second inductor 90 with respect to the stray capacitance component of the first surge absorbing element 92 and the inductance of the third inductor 94 and the inductance of the fourth inductor 96 with respect to the stray capacitance component of the second surge absorbing element 98 such that the input impedance of the surge absorbing circuit 86 and a characteristic impedance of a transmission line match each other. Therefore, the surge absorbing circuit 86 in accordance with this embodiment is excellent in reducing electrostatic surges, and enables impedance matching over a wide band. Hence, the connector 10A equipped with this surge absorbing circuit 86 in accordance with this embodiment can reduce electrostatic surges without deteriorating transmitted/received signals.

Figure 11:
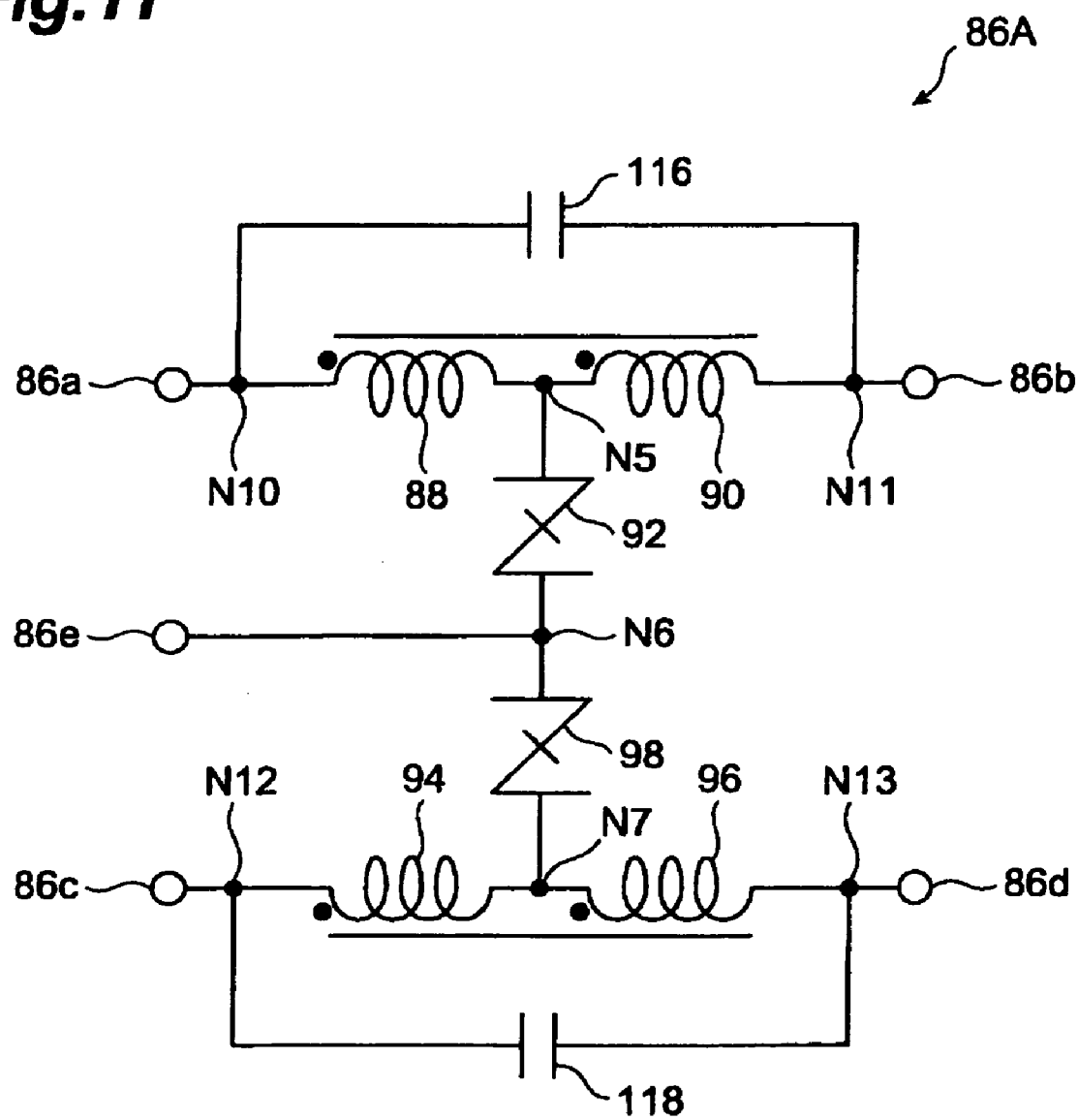
FIG. 11 is a circuit diagram showing the surge absorbing circuit in accordance with Modified Example 1 employable in the connector of the second embodiment.

[Modified Example 1 of surge absorbing circuit employable in the connector of the second embodiment] FIG. 11 is a circuit diagram showing the surge absorbing circuit in accordance with Modified Example 1 employable in the connector of the second embodiment. The surge absorbing circuit 86A shown in FIG. 11 further comprises a first capacitance element 116 and a second capacitance element 118 in addition to elements similar to those of the surge absorbing circuit 86.

The first capacitance element 116 has one end connected to a node N10 for connecting the first I/O terminal 86a and one end of the first inductor 88 to each other. The other end of the first capacitance element 116 is connected to a node N11 for connecting the second I/O terminal 86b and the other end of the second inductor 90 to each other.

The second capacitance element 118 has one end connected to a node N12 for connecting the third I/O terminal 86c and one end of the third inductor 94 to each other. The other end of the second capacitance element 118 is connected to a node N13 for connecting the fourth I/O terminal 86d and the other end of the fourth inductor 96 to each other.

Figure 12:
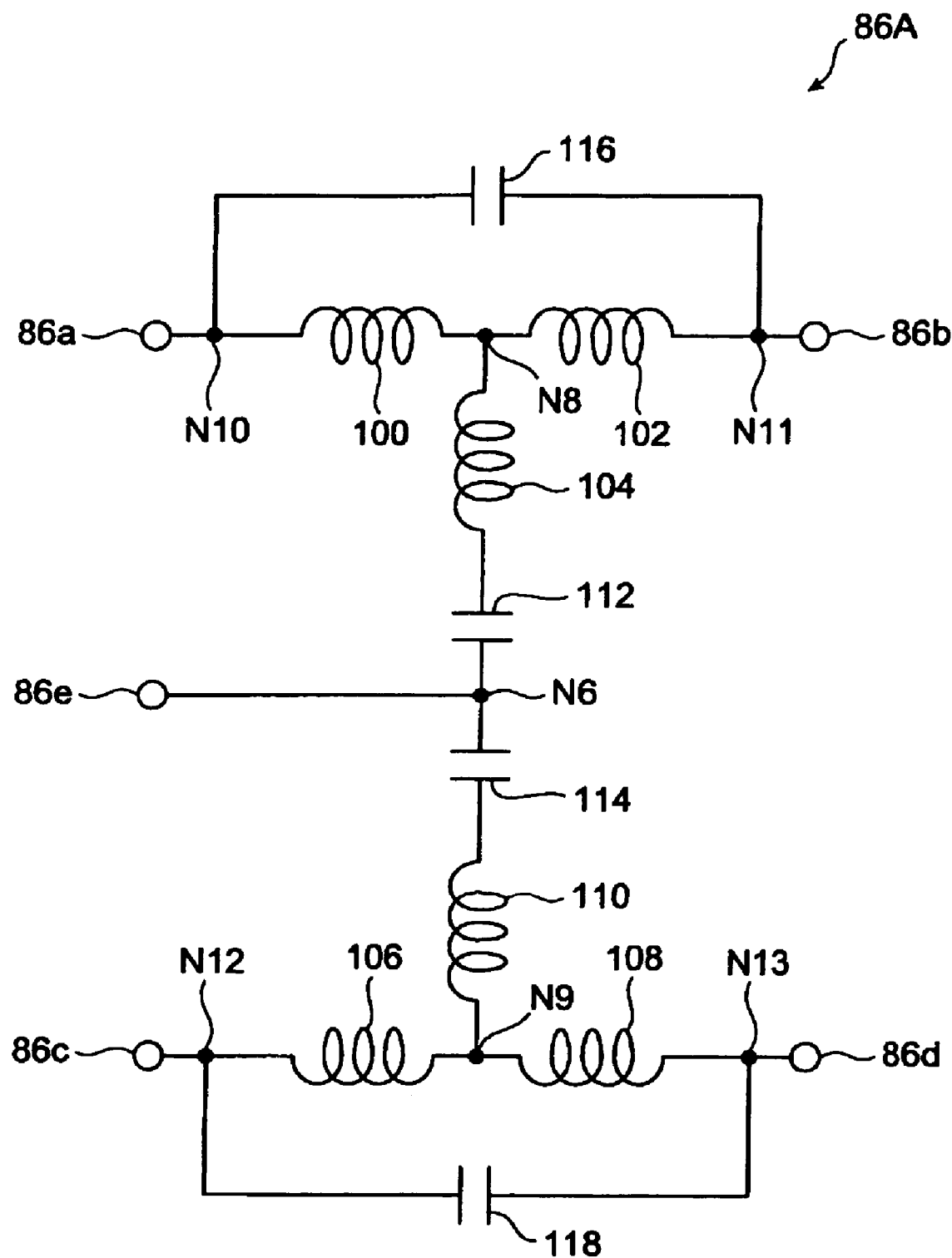
FIG. 12 is a circuit diagram equivalently illustrating the surge absorbing circuit shown in FIG. 11.

FIG. 12 is a circuit diagram equivalently illustrating the surge absorbing circuit shown in FIG. 11. As in the surge absorbing circuit 86, the first inductor 88 and second inductor 90 that are electromagnetically coupled together can be represented by two inductors 100, 102 and a negative inductor (negative inductance element) 104. The third inductor 94 and fourth inductor 96 that are electromagnetically coupled together can be represented by two inductors 106, 108 and a negative inductor (negative inductance element) 110. The first surge absorbing element 92 can be approximated by a stray capacitance element (stray capacitance component) 112 alone for small high-speed signals, whereas the second surge absorbing element 98 can be approximated by a stray capacitance element (stray capacitance component) 114 alone for small high-speed signals.

Letting Lz be each of the inductances of the first inductor 88, second inductor 90, third inductor 94, and fourth inductor 96, and Kz be each of the coupling factors between the first inductor 88 and second inductor 90 and between the third inductor 94 and fourth inductor 96, each of the inductances of the inductors 100, 102, 106, 108 becomes "(1+Kz)·Lz", whereas each of the inductances of the negative inductors 104 and 110 becomes "−Kz·Lz". Let Cs be each of the capacitance values of the first capacitance element 116 and second capacitance element 118, and Cz be each of the capacitance values of the stray capacitance elements 112 and 114. Consequently, the input impedance between the first I/O terminal 86a and third I/O terminal 86c of the surge absorbing circuit 86A shown in FIG. 12 is represented by the following expression (12). The input impedance between the second I/O terminal 86b and fourth I/O terminal 86d of the surge absorbing circuit 86A is also represented by the following expression (12):

[Expression 12] (12)
$$Zin = 2 \times \sqrt{\frac{2(1+Kz)Lz}{Cz} \frac{1-\omega^2 Lz((1-Kz)Cz/2)}{1-\omega^2 Lz(2(1+Kz)Cs)}}$$

The above-mentioned expression (12) shows that, when Cs is set so as to satisfy the following expression (13), the input impedance Zin is constant independently of frequency.

Further, when Cs is set so as to satisfy the following expression (13), while Lz is set so as to satisfy the following expression (14), the input impedance Zin of the surge absorbing circuit 86A can match an impedance which is twice the characteristic impedance Zo of a transmission line connected to each I/O terminal in the surge absorbing circuit 86A.

[Expression 13] (13)
$$Cs = \frac{1-Kz}{4(1+Kz)} Cz$$

[Expression 14] (14)
$$Lz = \frac{Z_0^2 Cz}{2(1+Kz)}$$

As the above-mentioned expressions (13) and (14) illustrate, the surge absorbing circuit 86A of Modified Example 1 can arbitrarily choose Kz. Namely, the surge absorbing circuit 86A of Modified Example 1 can change Cs and Lz by altering Kz, and thus makes it possible to design circuits with a higher flexibility than in the surge absorbing circuit 86.

Thus, the surge absorbing circuit 86A of Modified Example 1 can set the coupling factor between the first inductor 88 and second inductor 90, the coupling factor between the third inductor 94 and fourth inductor 96, the capacitance value of the first capacitance element 116, and the capacitance value of the first capacitance element 118 such as to keep a constant input impedance over a wide band. Further, the surge absorbing circuit 86A of Modified Example 1 can set the respective inductances of the first inductor 88, second inductor 90, third inductor 94, and fourth inductor 96, the coupling factor between the first inductor 88 and second inductor 90, and the coupling factor between the third inductor 94 and fourth inductor 96 with respect to the stray capacitance component of the first surge absorbing element 92 and the stray capacitance component of the second surge absorbing element 98 such that the input impedance of the surge absorbing circuit 86A and a characteristic impedance of a transmission line match each other. Hence, the connector 10A in accordance with this embodiment equipped with the surge absorbing circuit 86A of Modified Example 1 in place of the surge absorbing circuit 86 can reduce electrostatic surges without deteriorating differential transmitted/received signals.

The first surge absorbing element 92 and second surge absorbing element 98 are approximated by the stray capacitance elements 112 and 114 alone, respectively, in the foregoing explanation, but actually include a stray inductance element (stray inductance component) as shown in FIG. 6. This stray inductance element also causes the impedance of the surge absorbing circuit 86 to fluctuate with respect to frequency. Namely, the stray inductance element also causes transmitted/received high-speed signals to deteriorate.

In the surge absorbing circuit 86A of Modified Example 1, however, the first inductor 88 and second inductor 90 that are electromagnetically coupled together have the negative inductor 104, which can cancel out the stray inductance element included in the first surge absorbing element 92. Also, in the surge absorbing circuit 86A of Modified Example 1, the third inductor 94 and fourth inductor 96 that are electromagnetically coupled together have the negative inductor 110, which can cancel out the stray inductance element included in the second surge absorbing element 98. Since the resulting state appears as if the coupling is made smaller, Kz and Lz are left as they are, whereas Cs is set as defined by the following expression (15):

[Expression 15] (15)
$$Cs = \frac{1 - Kz + 2Le/Lz}{4(1 + Kz)} Cz$$

where Le is the inductance of the stray inductance element, and $KzLz \geqq Le$. Setting Cs so as to satisfy the above-mentioned expression (15) allows the input impedance Zin of the surge absorbing circuit 86A to match an impedance which is twice the characteristic impedance Zo of a transmission line connected to each I/O terminal in the surge absorbing circuit 86A even when the first surge absorbing element 92 and second surge absorbing element 98 include the stray capacitance element and stray inductance element.

Thus, the surge absorbing circuit 86A of Modified Example 1 can attain a negative inductance component which cancels out the stray inductance component of the first surge absorbing element 92 by the electromagnetic coupling between the first inductor 88 and second inductor 90, and a negative inductance component which cancels out the stray inductance component of the second surge absorbing element 98 by the electromagnetic coupling between the third inductor 94 and fourth inductor 96. Further, the respective inductances of the first inductor 88 and second inductor 90, their coupling factor, the respective inductances of the third inductor 94 and fourth inductor 96, their coupling factor, and the respective capacitance values of the first capacitance element 116 and second capacitance element 118 can be set such that the input impedance matches a characteristic impedance of the transmission line and is kept constant over a wide band. Therefore, the connector in accordance with this embodiment equipped with the surge absorbing circuit 86A of Modified Example 1 in place of the surge absorbing circuit 86 can reduce electrostatic surges without deteriorating differential transmitted/received signals.

Figure 13:
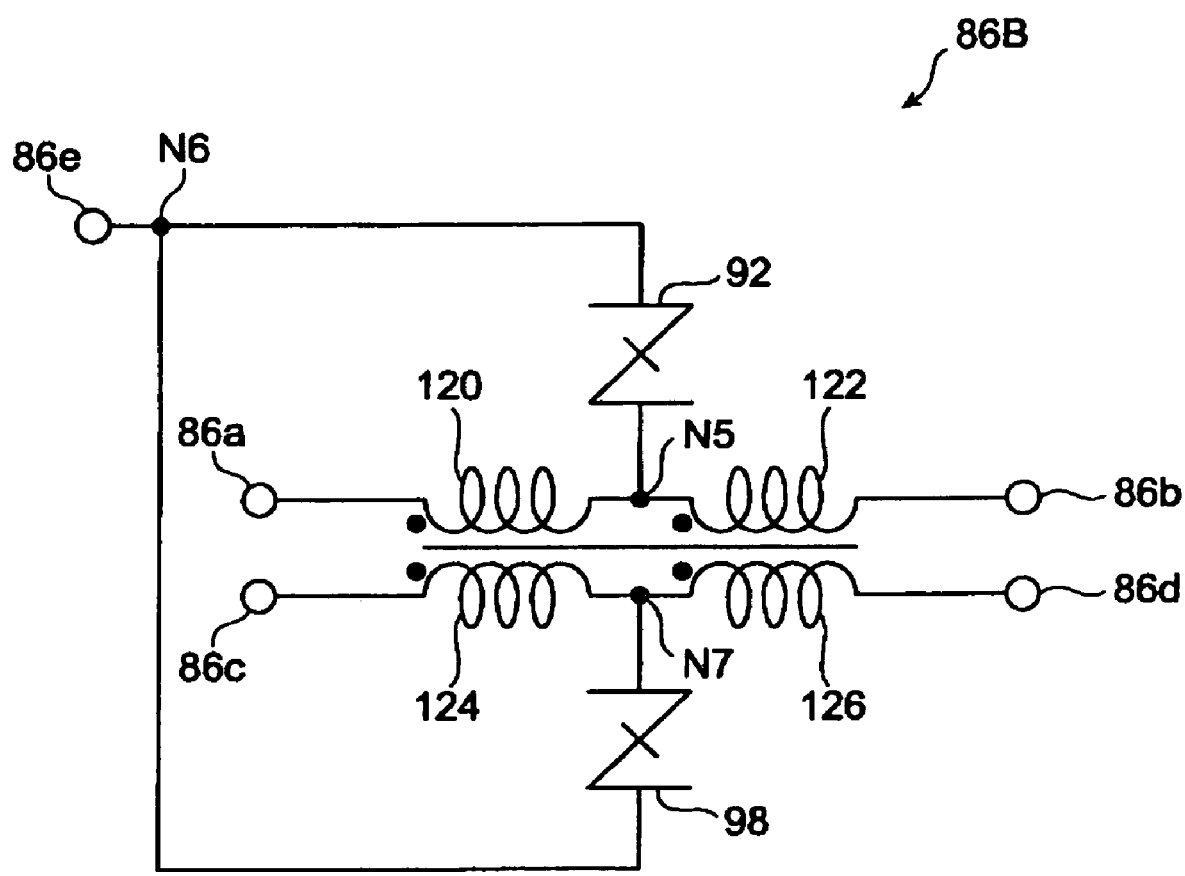
FIG. 13 is a circuit diagram showing the surge absorbing circuit in accordance with Modified Example 2 employable in the connector of the second embodiment.

[Modified Example 2 of surge absorbing circuit employable in the connector of the second embodiment] FIG. 13 is a circuit diagram showing the surge absorbing circuit in accordance with Modified Example 2 employable in the connector of the second embodiment. The surge absorbing circuit 86B shown in FIG. 13 differs from the surge absorbing circuit 86 in that it has a first inductor 120, a second inductor 122, a third inductor 124, and a fourth inductor 126 in place of the first inductor 88, second inductor 90, third inductor 94, and fourth inductor 96, respectively. The first inductor 120, second inductor 122, third inductor 124, and fourth inductor 126 are electromagnetically coupled together.

The first inductor 120 has one end connected to the first I/O terminal 86a and the other end connected to a node N5. The second inductor 122 has one end connected to the node N5 and the other end connected to the second I/O terminal 86b.

The third inductor 124 has one end connected to the third I/O terminal 86c and the other end connected to a node N7. The fourth inductor 126 has one end connected to the node N7 and the other end connected to the fourth I/O terminal 86d.

The first inductor 120, second inductor 122, third inductor 124, and fourth inductor 126 are electromagnetically coupled together. Specifically, the first inductor 120 and second inductor 122 are magnetically coupled together so as to increase each other's inductance, while the third inductor 124 and fourth inductor 126 are magnetically coupled together so as to increase each other's inductance. Also, the first inductor 120 and third inductor 124 are magnetically coupled together so as to increase each other's inductance when a differential signal is applied thereto, while the second inductor 122 and fourth inductor 126 are magnetically coupled together so as to increase each other's inductance when a differential signal is applied thereto. Preferably, the coupling factor among the first inductor 120, second inductor 122, third inductor 124, and fourth inductor 126 is greater than 0.01 but not exceeding 1.

Figure 14:
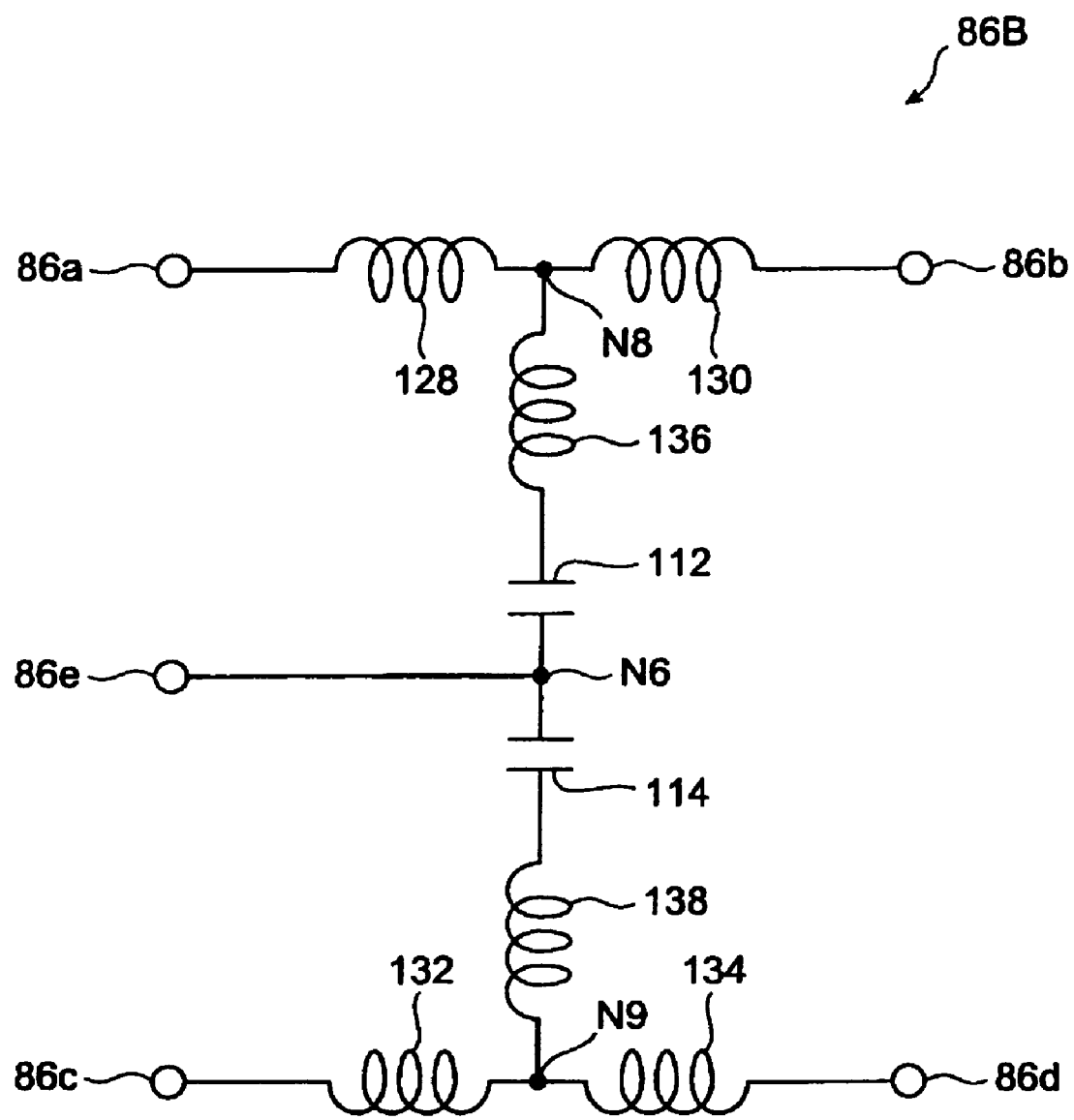
FIG. 14 is a circuit diagram equivalently illustrating the surge absorbing circuit shown in FIG. 13.

FIG. 14 is a circuit diagram equivalently illustrating the surge absorbing circuit shown in FIG. 13. As in the surge absorbing circuit 86, the first inductor 120, second inductor 122, third inductor 124, and fourth inductor 126 electromagnetically coupled together can be represented by inductors 128, 130, 132, 134 and negative inductors (negative inductance elements) 136, 138. The first surge absorbing element 92 can be approximated by the stray capacitance element (stray capacitance component) 112 alone for small high-speed signals, whereas the second surge absorbing element 98 can be approximated by the stray capacitance element (stray capacitance component) 114 alone for small high-speed signals.

In the equivalent circuit shown in FIG. 14, the inductor 128 has one end connected to the first I/O terminal 86a and the other end connected to a node N8. The inductor 130 has one end connected to the node N8 and the other end connected to the second I/O terminal 86*b*. The negative inductor 136 has one end connected to the node N8 and the other end connected to one end of the stray capacitance element 112.

The inductor 132 has one end connected to the third I/O terminal 86*c* and the other end connected to a node N9. The inductor 134 has one end connected to the node N9 and the other end connected to the fourth I/O terminal 86*d*. The negative inductor 138 has one end connected to the node N9 and the other end connected to one end of the stray capacitance element 114.

Letting Lz be each of the inductances of the first inductor 120, second inductor 122, third inductor 124, and fourth inductor 126, Kz be each of the coupling factors between the first inductor 120 and second inductor 122 and between the third inductor 124 and fourth inductor 126, and Kc be each of the coupling factors between the first inductor 120 and third inductor 124 and between the second inductor 122 and fourth inductor 126, each of the inductances of the inductors 128, 130, 132, 134 becomes "(1+Kz+Kc)·Lz", whereas each of the inductances of the negative inductors 136 and 138 becomes "−Kz·Lz". Let Cz be each of the capacitance values of the stray capacitance elements 112 and 114. Consequently, the input impedance between the fist I/O terminal 86*a* and third I/O terminal 86*c* of the surge absorbing circuit 86B shown in FIG. 14 is represented by the following expression (16). The input impedance between the second I/O terminal 86*b* and fourth I/O terminal 86*d* of the surge absorbing circuit 86B is also represented by the following expression (16):

[Expression 16]

$$Zin = 2 \times \sqrt{\frac{2(1+Kz+Kc)Lz}{Cz}(1-\omega^2 Lz((1-Kz+Kc)Cz/2))} \quad (16)$$

The above-mentioned expression (16) shows that, when Kz and Kc are set so as to satisfy the following expression (17), the input impedance Zin is constant independently of frequency.

Further, when Kz and Kc are set so as to satisfy the following expression (17), while Lz is set so as to satisfy the following expression (18), the input impedance Zin of the surge absorbing circuit 86B can match an impedance which is twice the characteristic impedance Zo of a transmission line connected to each I/O terminal in the surge absorbing circuit 86B.

[Expression 17]

$$Kz - Kc = 1 \quad (17)$$

[Expression 18]

$$Lz = \frac{Z_0^2 Cz}{2(1+Kz+Kc)} \quad (18)$$

As the above-mentioned expressions (17) and (18) illustrate, the surge absorbing circuit 86B of Modified Example 2 can arbitrarily choose Kz and Kc. Namely, the surge absorbing circuit 86B of Modified Example 2 can change Lz by altering Kz and Kc, and thus makes it possible to design circuits with a higher flexibility than in the surge absorbing circuit 86.

Thus, the surge absorbing circuit 86B of Modified Example 2 has the first surge absorbing element 92 and second surge absorbing element 98 excellent in reducing electrostatic surges, and thus can lower the electrostatic surges. The surge absorbing circuit 86B of the second Modified Example 2 has the first inductor 120, second inductor 122, third inductor 124, and fourth inductor 126 electromagnetically coupled together, and thus can set the coupling factor among the first inductor 120, second inductor 122, third inductor 124, and fourth inductor 126 such as to keep a constant input impedance over a wide band. Further, the surge absorbing circuit 86B of Modified Example 2 can set the respective inductances of the first inductor 120, second inductor 122, third inductor 124, and fourth inductor 126 and their coupling factor with respect to the respective stray capacitance components of the first surge absorbing element 92 and second surge absorbing element 98 such that the input impedance of the surge absorbing circuit 86B and a characteristic impedance of a transmission line match each other. Therefore, the surge absorbing circuit 86B of Modified Example 2 is excellent in reducing electrostatic surges and enables impedance matching over a wide band. Hence, the connector 10A in accordance with this embodiment equipped with the surge absorbing circuit 86B of Modified Example 2 in place of the surge absorbing circuit 86 can reduce electrostatic surges without deteriorating differential transmitted/received signals.

The first surge absorbing element 92 and second surge absorbing element 98 are approximated by the stray capacitance elements 112 and 114 alone, respectively, in the foregoing explanation, but actually include a stray inductance element (stray inductance component) as shown in FIG. 6. Letting Le be the inductance of this stray inductance element, the input impedance between the first I/O terminal 86*a* and third I/O terminal 86*c* of the surge absorbing circuit 86B shown in FIG. 13 is represented by the following expression (19):

[Expression 19]

$$Zin = \quad (19)$$
$$2 \times \sqrt{\frac{2(1+Kz+Kc)Lz}{Cz}\left(1-\omega^2 Lz\left(\left(1-Kz+Kc+\frac{2Le}{Lz}\right)Cz/2\right)\right)}$$

The above-mentioned expression (19) shows that, when Kz, Kc, and Lz are set so as to satisfy the following expression (20), the input impedance Zin is constant independently of frequency.

[Expression 20]

$$Kz - Kc - \frac{2Le}{Lz} = 1 \quad (20)$$

Setting Kz, Kc, and Lz so as to satisfy the above-mentioned expression (20) allows the input impedance Zin of the surge absorbing circuit 86B to match an impedance which is twice the characteristic impedance Zo of a transmission line connected to each I/O terminal in the surge absorbing circuit 86B even when the first surge absorbing element 92 and second surge absorbing element 98 include the stray capacitance element and stray inductance element.

Thus, the surge absorbing circuit 86B of Modified Example 2 can set the respective inductances of the first inductor 120, second inductor 122, third inductor 124, and fourth inductor 126 and their coupling factor with respect to the stray capacitance component and stray inductance component of each of the first surge absorbing element 92 and second surge absorbing element 98 such that the input impedance of the surge absorbing circuit 86B matches a characteristic impedance of a transmission line and is kept constant over a wide band.

Figure 15:
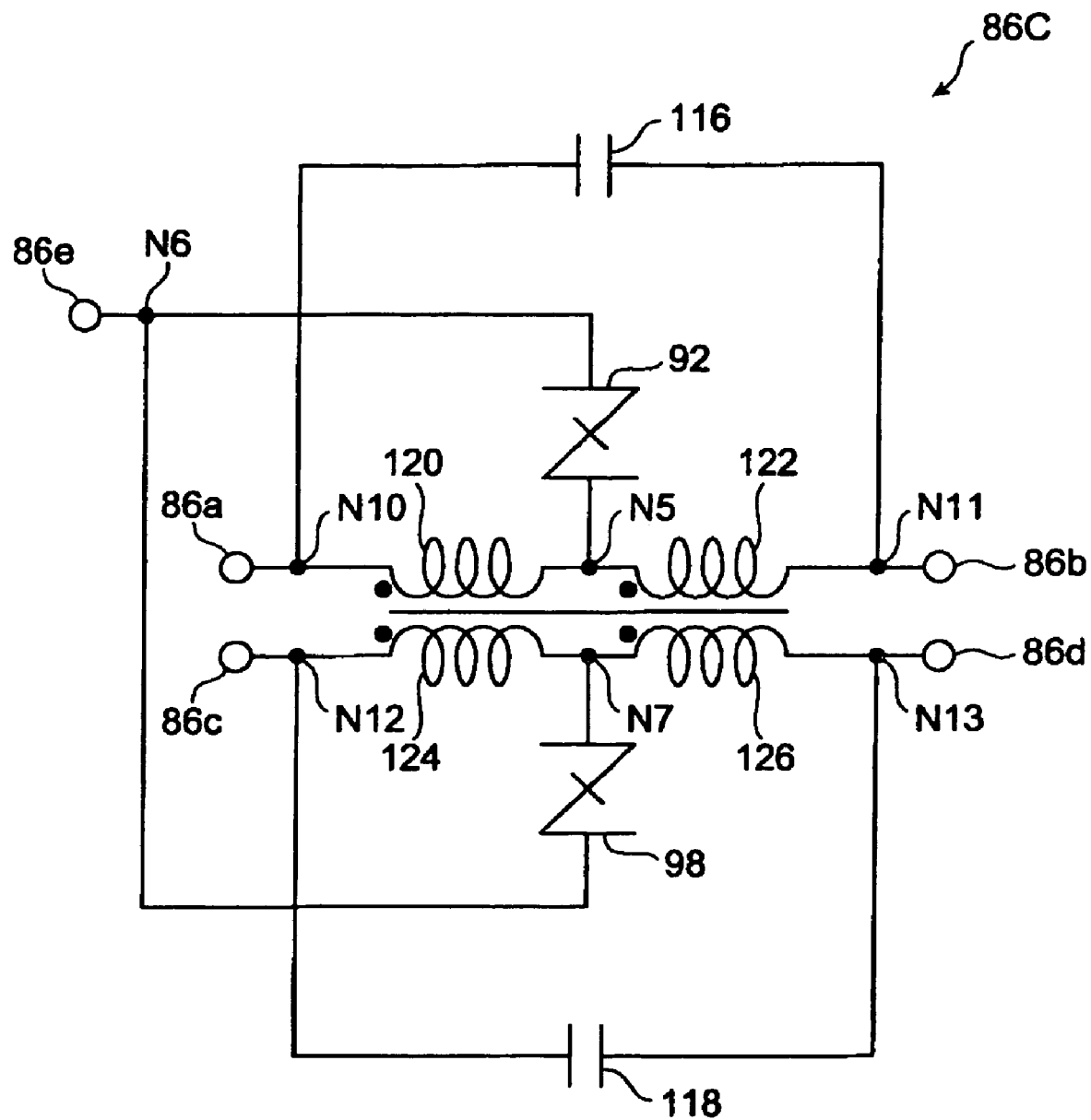
FIG. 15 is a circuit diagram showing the surge absorbing circuit in accordance with Modified Example 3 employable in the connector of the second embodiment.

[Modified Example 3 of surge absorbing circuit employable in the connector of the second embodiment] FIG. 15 is a circuit diagram showing the surge absorbing circuit in accordance with Modified Example 3 employable in the connector of the second embodiment. The surge absorbing circuit 86C shown in FIG. 15 further comprises a first capacitance element 116 and a second capacitance element 118 in addition to elements similar to those of the surge absorbing circuit 86B of Modified Example 2.

The first capacitance element 116 has one end connected to a node N10 for connecting the first I/O terminal 86a and one end of the first inductor 120 to each other. The other end of the first capacitance element 116 is connected to a node N11 for connecting the second I/O terminal 86b and the other end of the second inductor 122 to each other.

The second capacitance element 118 has one end connected to a node N12 for connecting the third I/O terminal 86c and one end of the third inductor 124 to each other. The other end of the second capacitance element 118 is connected to a node N13 for connecting the fourth I/O terminal 86d and the other end of the fourth inductor 126 to each other.

Figure 16:
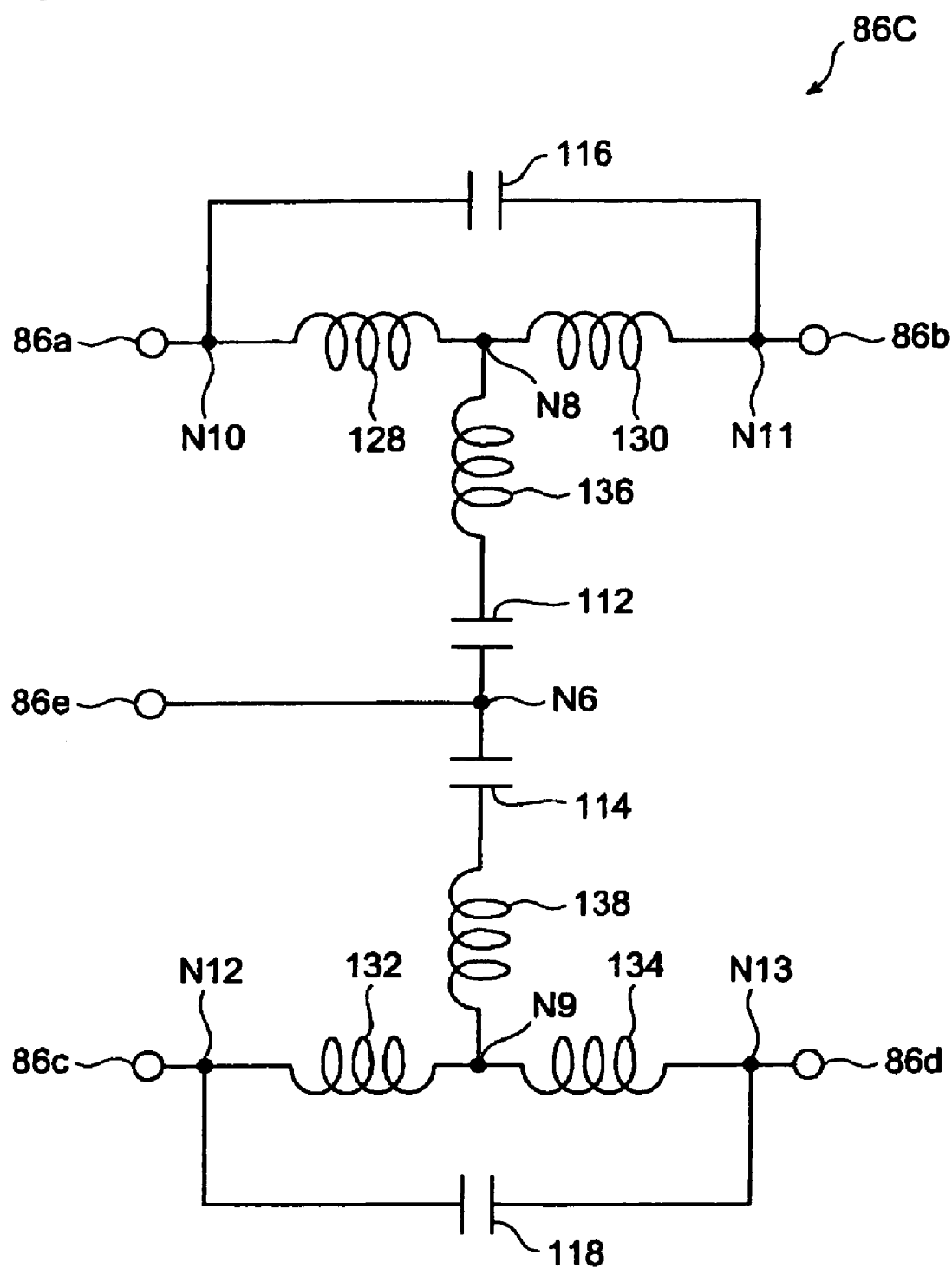
FIG. 16 is a circuit diagram equivalently illustrating the surge absorbing circuit shown in FIG. 15.

FIG. 16 is a circuit diagram equivalently illustrating the surge absorbing circuit shown in FIG. 15. As in the surge absorbing circuit 86B, the first inductor 120, second inductor 122, third inductor 124, and fourth inductor 126 that are electromagnetically coupled together can be represented by inductors 128, 130, 132, 134 and negative inductors (negative inductance elements) 136, 138. The first surge absorbing element 92 can be approximated by a stray capacitance element (stray capacitance component) 112 alone for small high-speed signals, whereas the second surge absorbing element 98 can be approximated by a stray capacitance element (stray capacitance component) 114 alone for small high-speed signals.

Letting Lz be each of the inductances of the first inductor 120, second inductor 122, third inductor 124, and fourth inductor 126, Kz be each of the coupling factors between the first inductor 120 and second inductor 122 and between the third inductor 124 and fourth inductor 126, and Kc be each of the coupling factors between the first inductor 120 and third inductor 124 and between the second inductor 122 and fourth inductor 126, each of the inductances of the inductors 128, 130, 132, 134 becomes "(1+Kz+Kc)·Lz", whereas each of the inductances of the negative inductors 136 and 138 becomes "−Kz·Lz". Let Cs be each of the capacitance values of the first capacitance element 116 and second capacitance element 118, and Cz be each of the capacitance values of the stray capacitance elements 112 and 114. Consequently, the input impedance between the first I/O terminal 86a and third I/O terminal 86c of the surge absorbing circuit 86C shown in FIG. 16 is represented by the following expression (21). The input impedance between the second I/O terminal 86b and fourth I/O terminal 86d of the surge absorbing circuit 86C is also represented by the following expression (21):

[Expression 21]

$$Zin = 2 \times \sqrt{\frac{2(1 + Kz + Kc)Lz}{Cz} \frac{1 - \omega^2 Lz((1 - Kz + Kc)Cz/2)}{1 - \omega^2 Lz(2(1 + Kz + Kc)Cs)}} \quad (21)$$

The above-mentioned expression (21) shows that, when Cs is set so as to satisfy the following expression (22), the input impedance Zin is constant independently of frequency.

Further, when Cs is set so as to satisfy the following expression (22), while Lz is set so as to satisfy the following expression (23), the input impedance Zin of the surge absorbing circuit 86C can match an impedance which is twice the characteristic impedance Zo of a transmission line connected to each I/O terminal in the surge absorbing circuit 86C.

[Expression 22]

$$Cs = \frac{1 - Kz + Kc}{4(1 + Kz + Kc)} Cz \quad (22)$$

[Expression 23]

$$Lz = \frac{Z_0^2 Cz}{2(1 + Kz + Kc)} \quad (23)$$

As the above-mentioned expressions (22) and (23) illustrate, the surge absorbing circuit 86C of Modified Example 3 can arbitrarily choose Kz and Kc. Namely, the surge absorbing circuit 86C of Modified Example 3 can change Cs and Lz by altering Kz and Kc, and thus makes it possible to design circuits with a higher flexibility than in the surge absorbing circuit 86.

Thus, the surge absorbing circuit 86C of Modified Example 3 can set the coupling factor among the first inductor 120, second inductor 122, third inductor 124, and fourth inductor 126 and the respective capacitance values of the first capacitance element 116 and second capacitor element 118 such as to keep a constant input impedance over a wide band. Further, the surge absorbing circuit 86C of Modified Example 3 can set the respective inductances of the first inductor 120, second inductor 122, third inductor 124, and fourth inductor 126 and their coupling factor with respect to the stray capacitance component of the first surge absorbing element 92 and the second surge absorbing element 98 such that the input impedance of the surge absorbing circuit 86C and a characteristic impedance of a transmission line match each other. Hence, the connector in accordance with this embodiment equipped with the surge absorbing circuit 86C of Modified Example 3 in place of the surge absorbing circuit 86 can reduce electrostatic surges without deteriorating differential transmitted/received signals.

The first surge absorbing element 92 and second surge absorbing element 98 are approximated by the stray capacitance elements 112 and 114 alone, respectively, in the foregoing explanation, but actually include a stray inductance element (stray inductance component) as shown in FIG. 6.

In the surge absorbing circuit 86C of Modified Example 3, however, the first inductor 120, second inductor 122, third inductor 124, and fourth inductor 126 that are electromagnetically coupled together have the negative inductors 136, 138, whereby the negative inductor 136 can cancel out the stray inductance element included in the first surge absorbing element 92, whereas the negative inductor 138 can cancel out the stray inductance element included in the second surge absorbing element 98. Since the resulting state appears as if the coupling is made smaller, Kz and Lz are left as they are, whereas Cs is set as defined by the following expression (24):

[Expression 24]

$$Cs = \frac{1 - Kz + Kc + 2Le/Lz}{4(1 + Kz + Kc)} Cz \quad (24)$$

Here, Le is the inductance of the stray inductance element, and $KzLz \geqq Le$. Setting Cs so as to satisfy the above-mentioned expression (24) allows the input impedance Zin of the surge absorbing circuit 86C to match an impedance which is twice the characteristic impedance Zo of a transmission line connected to each I/O terminal in the surge absorbing circuit 86C even when the first surge absorbing element 92 and second surge absorbing element 98 include the stray capacitance element and stray inductance element.

Thus, the surge absorbing circuit 86C of Modified Example 3 can attain negative inductance components which cancel out the stray inductance component of the first surge absorbing element 92 and the stray inductance component of the second surge absorbing element 98 by the electromagnetic coupling among the first inductor 120, second inductor 122, third inductor 124, and fourth inductor 126. Further, the respective inductances of the first inductor 120, second inductor 122, third inductor 124, and fourth inductor 126, their coupling factor, and the respective capacitance values of the first capacitance element 116 and second capacitance element 118 can be set such that the input impedance matches a characteristic impedance of a transmission line and is kept constant over a wide band. Therefore, the connector 10A in accordance with this embodiment equipped with the surge absorbing circuit 86C of Modified Example 3 in place of the surge absorbing circuit 86 can reduce electrostatic surges without deteriorating differential transmitted/received signals.

Figure 17:
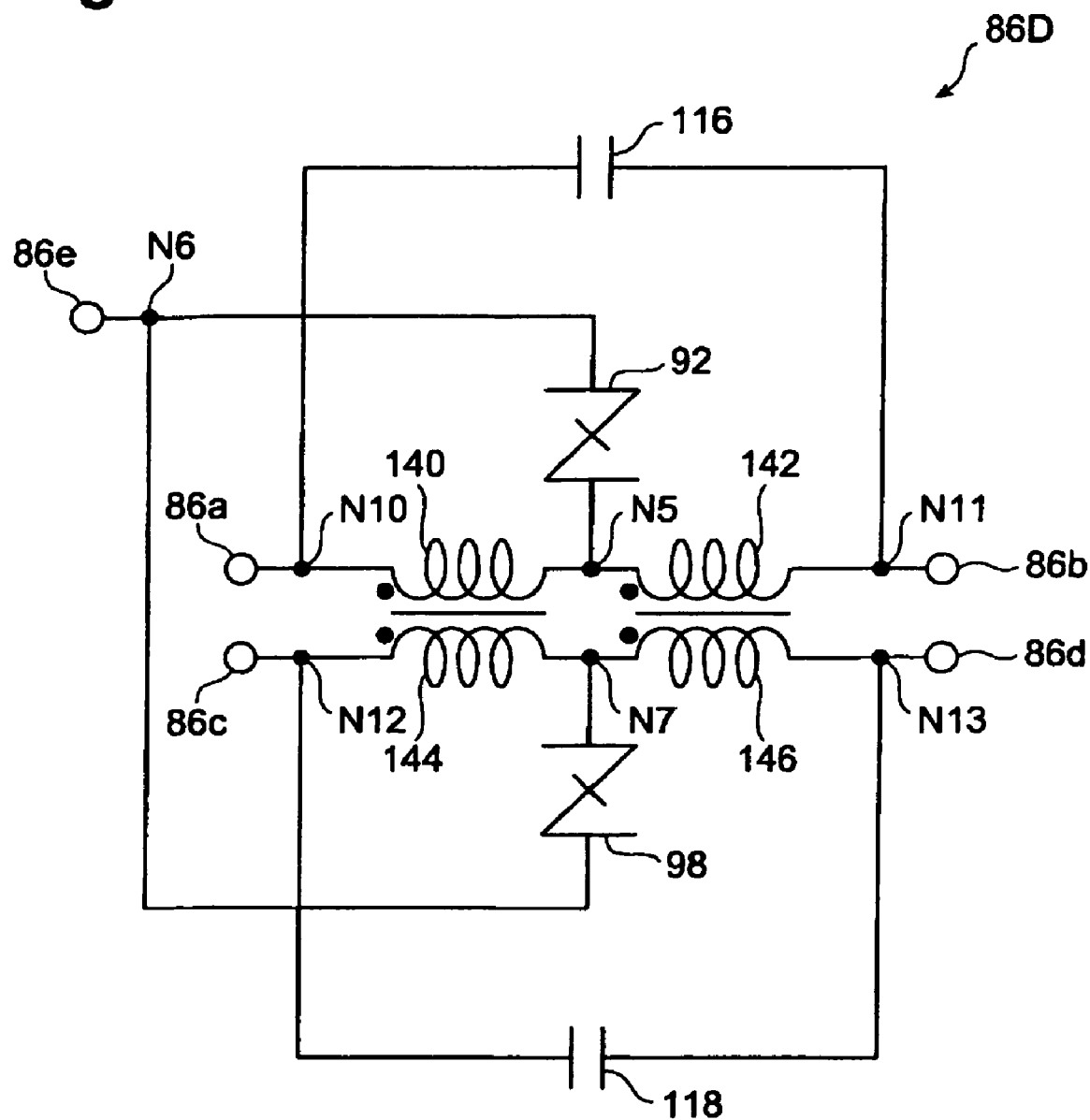
FIG. 17 is a circuit diagram showing the surge absorbing circuit in accordance with Modified Example 4 employable in the connector of the second embodiment.

[Modified Example 4 of surge absorbing circuit employable in the connector of the second embodiment] FIG. 17 is a circuit diagram showing the surge absorbing circuit in accordance with Modified Example 4 employable in the connector of the second embodiment. The surge absorbing circuit 86D shown in FIG. 17 differs from the surge absorbing circuit 86A in that it has a first inductor 140, a second inductor 142, a third inductor 144, and a fourth inductor 146 in place of the first inductor 88, second inductor 90, third inductor 94, and fourth inductor 96, respectively. In the surge absorbing circuit 86D, the first inductor 140 and third inductor 144 are electromagnetically coupled together, whereas the second inductor 142 and fourth inductor 146 are electromagnetically coupled together.

The first inductor 140 has one end connected to the first I/O terminal 86a and the other end connected to a node N5. The second inductor 142 has one end connected to the node N5 and the other end connected to the second I/O terminal 86b.

The third inductor 144 has one end connected to the third I/O terminal 86c and the other end connected to a node N7. The fourth inductor 146 has one end connected to the node N7 and the other end connected to the fourth I/O terminal 86d.

The first inductor 140 and third inductor 144 are electromagnetically coupled together, whereas the second inductor 142 and fourth inductor 146 are electromagnetically coupled together. Specifically, the first inductor 140 and third inductor 144 are magnetically coupled together so as to increase each other's inductance when a differential signal is applied thereto, whereas the second inductor 142 and fourth inductor 146 are magnetically coupled together so as to increase each other's inductance when a differential signal is applied thereto. Preferably, each of the coupling factors between the first inductor 140 and third inductor 144 and between the second inductor 142 and fourth inductor 146 is greater than 0.01 but not exceeding 1.

Let Lz be each of the inductances of the first inductor 140, second inductor 142, third inductor 144, and fourth inductor 146, and Kc be each of the coupling factors between the first inductor 140 and second inductor 142 and between the third inductor 144 and fourth inductor 146. Let Cs be each of the capacitance values of the first capacitance element 116 and second capacitance element 118. The first surge absorbing element 92 and second surge absorbing element 98 can be approximated by a stray capacitance element (stray capacitance component) alone for small high-speed signals, and Cz is assumed to be the capacitance value of the stray capacitance element. Consequently, the input impedance between the first I/O terminal 86a and third I/O terminal 86c of the surge absorbing circuit 86D shown in FIG. 17 is represented by the following expression (25). The input impedance between the second I/O terminal 86b and fourth I/O terminal 86d of the surge absorbing circuit 86D is also represented by the following expression (25):

[Expression 25]

$$Zin = 2 \times \sqrt{\frac{2(1+Kc)Lz}{Cz} \frac{1 - \omega^2 Lz((1+Kc)Cz/2)}{1 - \omega^2 Lz(2(1+Kc)Cs)}} \quad (25)$$

The above-mentioned expression (25) shows that, when Cs is set so as to satisfy the following expression (26), the input impedance Zin is constant independently of frequency.

Further, when Cs is set so as to satisfy the following expression (26), while Lz is set so as to satisfy the following expression (27), the input impedance Zin of the surge absorbing circuit 86D can match an impedance which is twice the characteristic impedance Zo of a transmission line connected to each I/O terminal in the surge absorbing circuit 86D.

[Expression 26]

$$Cs = \frac{Cz}{4} \quad (26)$$

[Expression 27]

$$Lz = \frac{Z_0^2 Cz}{2(1 + Kz)} \quad (27)$$

As the above-mentioned expression (27) illustrates, the surge absorbing circuit 86D of Modified Example 4 can arbitrarily choose Kc. Namely, the surge absorbing circuit 86D of Modified Example 4 can change Lz by altering Kc, and thus makes it possible to design circuits with a higher flexibility than in the surge absorbing circuit 86.

Thus, the surge absorbing circuit 86D of Modified Example 4 has the first surge absorbing element 92 and second surge absorbing element 98 excellent in reducing electrostatic surges, and consequently can lower the electrostatic surges. The surge absorbing circuit 86D of Modified Example 4 can set the respective capacitance values of the first capacitance element 116 and second capacitance element 118 such as to keep a constant input impedance over a wide band. Further, the surge absorbing circuit 86D of Modified Example 4 has the first inductor 140 and third inductor 144 electromagnetically coupled together and the second inductor 142 and fourth inductor 146 electromagnetically coupled together, and thus can set the respective inductances of the first inductor 140, second inductor 142, third inductor 144, and fourth inductor 146, the coupling factor between the first inductor 140 and third inductor 144, and the coupling factor between the second inductor 142 and fourth inductor 146 with respect to the respective stray capacitance components of the first surge absorbing element 92 and second surge absorbing element 98 such that the input impedance of the surge absorbing circuit 86D and a characteristic impedance of a transmission line match each other. Therefore, the surge absorbing circuit 86D of Modified Example 4 is excellent in reducing electrostatic surges, and enables impedance matching over a wide band. Hence, the connector 10A in accordance with this embodiment equipped with the surge absorbing circuit 86D of Modified Example 4 in place of the surge absorbing circuit 86 can reduce electrostatic surges without deteriorating differential transmitted/received signals.

Figure 18:
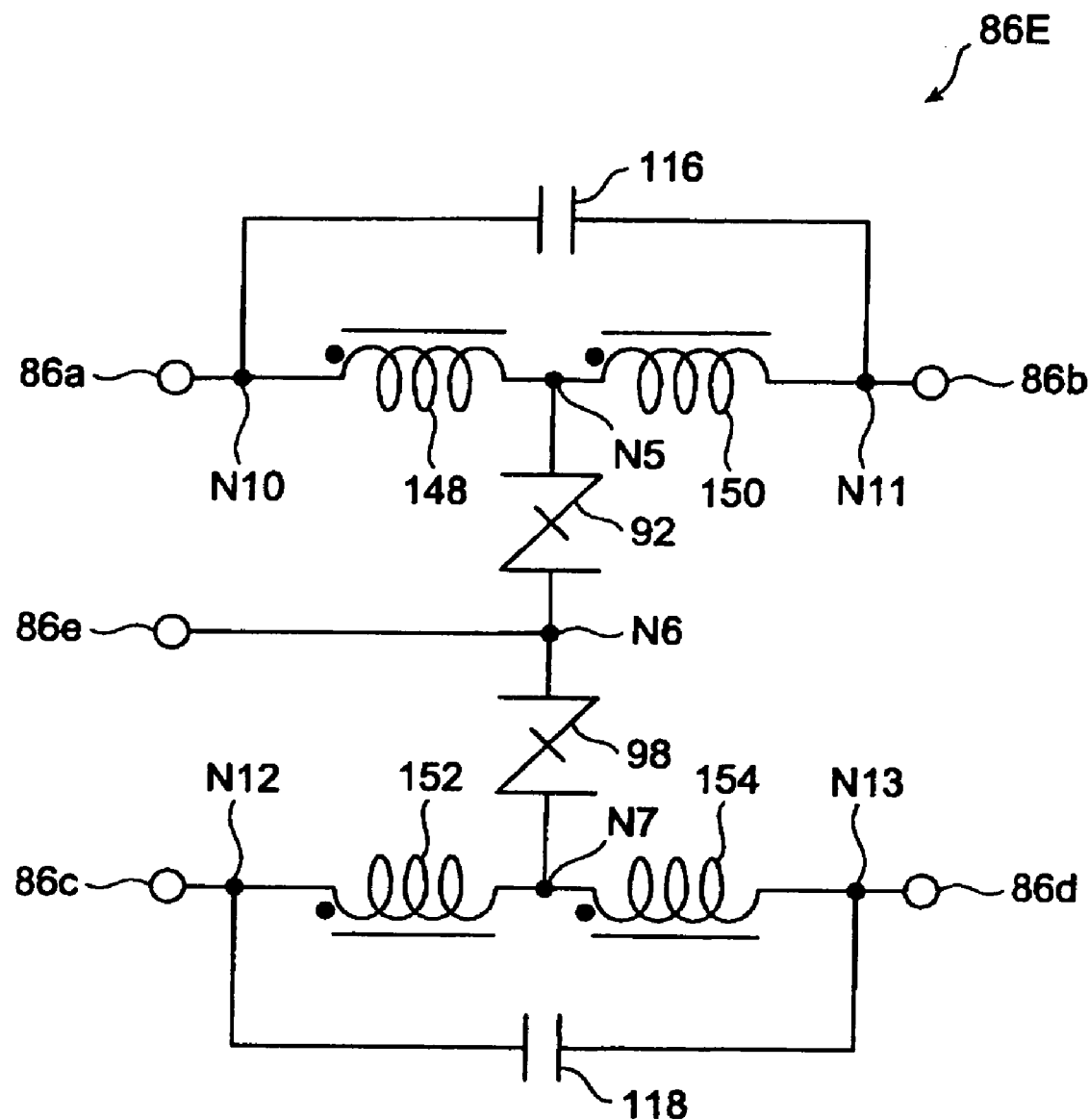
FIG. 18 is a circuit diagram showing the surge absorbing circuit in accordance with Modified Example 5 employable in the connector of the second embodiment.

[Modified Example 5 of surge absorbing circuit employable in the connector of the second embodiment] FIG. 18 is a circuit diagram showing the surge absorbing circuit in accordance with Modified Example 5 employable in the connector of the second embodiment. The surge absorbing circuit 86E shown in FIG. 18 differs from the surge absorbing circuit 86A in that the first inductor, second inductor, third inductor, and fourth inductor are not electromagnetically coupled together. The other structure of the surge absorbing circuit 86E is the same as the surge absorbing circuit 86A of Modified Example 1.

In the surge absorbing circuit 86E, the coupling factor between the first inductor 148 and second inductor 150 is preferably 0.01 or less, whereas the coupling factor between the third inductor 152 and fourth inductor 154 is preferably 0.01 or less.

Let Lx be each of the inductances of the first inductor 148, second inductor 150, third inductor 152, and fourth inductor 154, and Cx be each of the capacitance values of the first capacitance element 116 and second capacitance element 118. The first surge absorbing element 92 is approximated by a stray capacitance element (stray capacitance component) alone for small high-speed signals, and Cz is assumed to be the capacitance value of the stray capacitance element 54. Consequently, the input impedance between the first I/O terminal 86a and third I/O terminal 86c of the surge absorbing circuit 86E shown in FIG. 18 is represented by the following expression (28). The input impedance between the second I/O terminal 86b and fourth I/O terminal 86d of the surge absorbing circuit 86E is also represented by the following expression (28):

[Expression 28]

$$Zin = 2 \times \sqrt{\frac{2Lx}{Cz} \frac{1 - \omega^2 Lx(Cz/2)}{1 - \omega^2 Lx(2Cx)}} \quad (28)$$

The above-mentioned expression (28) shows that, when Cs is set so as to satisfy the following expression (29), the input impedance Zin becomes constant independently of frequency.

Further, when Cx is set so as to satisfy the following expression (29), while Lx is set so as to satisfy the following expression (30), the input impedance Zin of the surge absorbing circuit 86E can match an impedance which is twice the characteristic impedance Zo of a transmission line connected to each I/O terminal in the surge absorbing circuit 86E.

[Expression 29]

$$Cx = \frac{Cz}{4} \quad (29)$$

[Expression 30]

$$Lz = \frac{Z_0^2 Cz}{2} \quad (30)$$

Thus, the surge absorbing circuit 86E of Modified Example 5 has the first surge absorbing element 92 and second surge absorbing element 98 excellent in reducing electrostatic surges, and consequently can lower the electrostatic surges. The surge absorbing circuit 86E of Modified Example 5 can set the respective capacitance values of the first capacitance element 116 and second capacitance element 118 such as to keep a constant input impedance over a wide band. Further, the surge absorbing circuit 86E of Modified Example 5 can set the inductance of the first inductor 148 and the inductance of the second inductor 150 with respect to the stray capacitance component of the first surge absorbing element 92 and the inductance of the third inductor 152 and the inductance of the fourth inductor 154 with respect to the stray capacitance component of the second surge absorbing element 98 such that the input impedance of the surge absorbing circuit 86E and a characteristic impedance of a transmission line match each other. Therefore, the surge absorbing circuit 86E of Modified Example 5 is excellent in reducing electrostatic surges, and enables impedance matching over a wide band. Hence, the connector 10A in accordance with this embodiment equipped with the surge absorbing circuit 86E of Modified Example 5 in place of the surge absorbing circuit 86 can reduce electrostatic surges without deteriorating differential transmitted/received signals.

Structures of multilayer surge absorbing components constituting the above-mentioned surge absorbing circuits will now be explained in detail.

[Structure of a multilayer surge absorbing component for the surge absorbing circuit of Modified Example 1 of the first embodiment]

Figure 19:
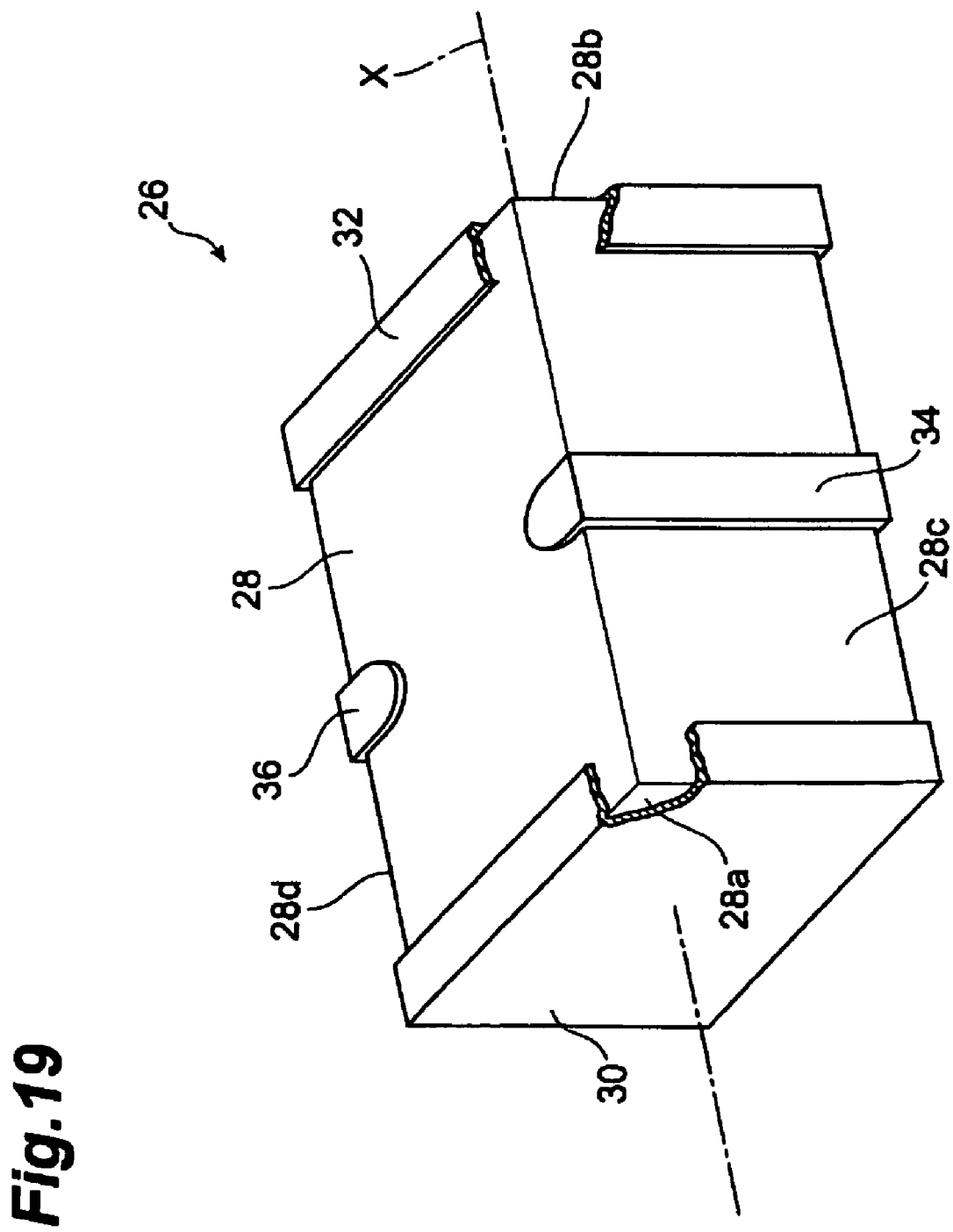
FIG. 19 is a perspective view showing in a partly broken fashion a multilayer surge absorbing component for the surge absorbing circuit in accordance with Modified Example 1 in the connector of the first embodiment.

FIG. 19 is a perspective view showing in a partly broken fashion a multilayer surge absorbing component for the surge absorbing circuit in accordance with Modified Example 1 in the connector of the first embodiment. The multilayer surge absorbing component 26 shown in FIG. 19 is constructed by a substantially rectangular parallelepiped multilayer body 28, a first electrode 30, a second electrode 32, and third electrodes 34, 36.

The first electrode 30 is provided on a first surface 28a orthogonal to an axis X of the multilayer body 28 and respective parts on the first surface 28a side of four surfaces orthogonal to the first surface 28a.

The second electrode 32 is provided on a second surface 28b opposing the first surface 28a along the axis X of the multilayer body 28 and respective parts on the second surface 28b side of four surfaces orthogonal to the second surface 28b.

The third electrode 34 is provided so as to extend along the laminating direction of the multilayer body 28 at the center part of a third surface 28c parallel to the axis X of the multilayer body 28. Similarly, the fourth electrode 36 is provided so as to extend along the laminating direction of the multilayer body 28 at the center part of a fourth surface 28d parallel to the axis X of the multilayer body 28. Conductors such as gold, platinum, silver, copper, lead, and their alloys are usable as materials for the first electrode 30, second electrode 32, and third electrodes 34, 36.

Figure 20:
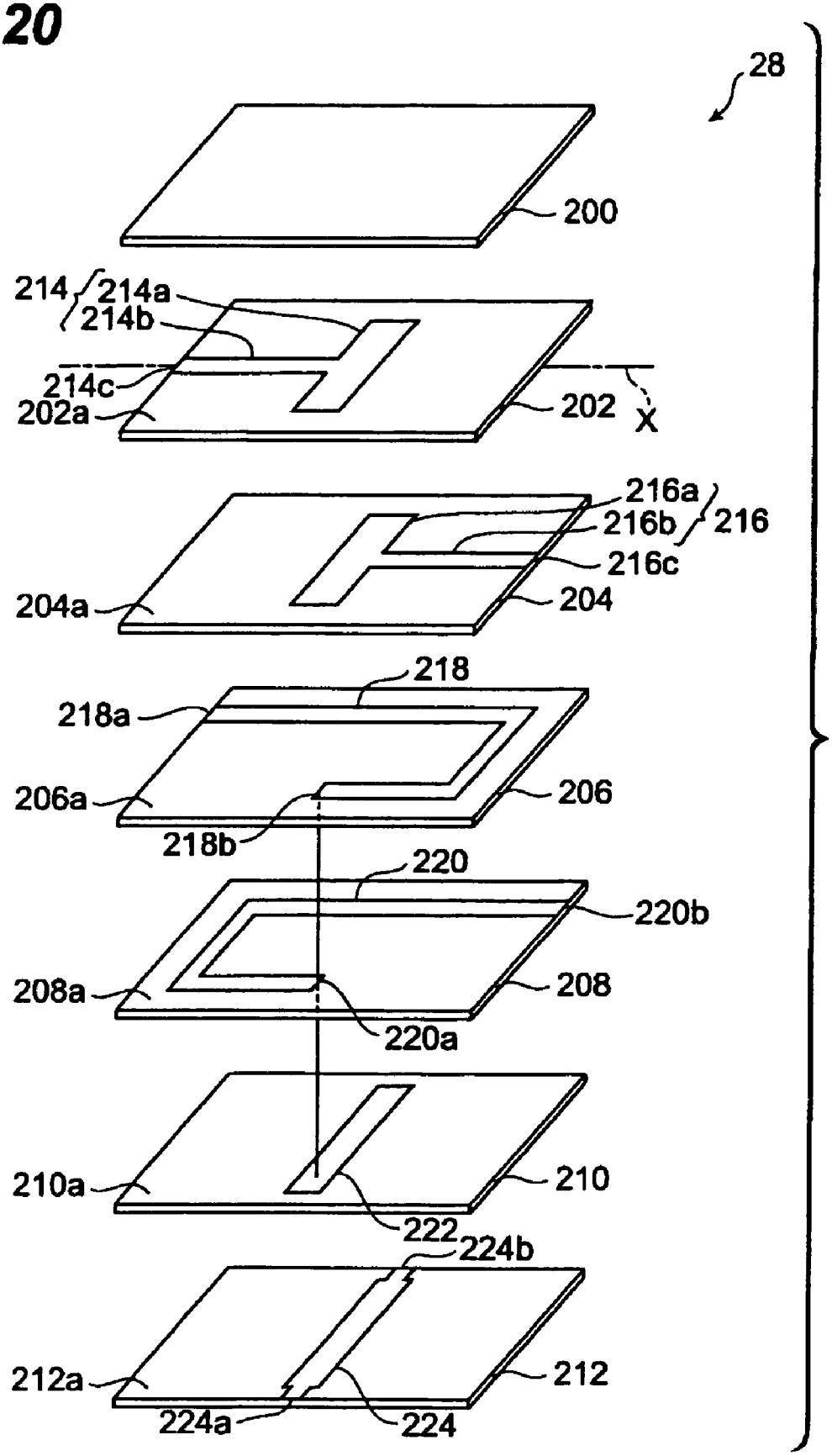
FIG. 20 is an exploded perspective view illustrating layer by layer the multilayer body shown in FIG. 19.

FIG. 20 is an exploded perspective view illustrating layer by layer the multilayer body shown in FIG. 19. The multilayer body 28 is constructed by insulating layers 200, 202, 204, 206, 208, a semiconductor layer 210, an insulating layer 212, and conductor patterns provided on the insulating layers and semiconductor layer.

The insulating layer 200 is made of an insulating material, examples of which include dielectric materials such as glass epoxy resins, fluorine resins, and ceramics. The insulating layer 200 is provided on one main face 202a of the insulating layer 202.

The insulating layer 202 is made of the same material as that of the insulating layer 200, for example. A conductor pattern 214 is formed on one main face 202a of the insulating layer 200. The conductor pattern 214 is covered with the insulating layer 200. The conductor pattern 214 is constructed by a substantially rectangular conductor pattern 214a and a narrow conductor pattern 214b extending along the axis X. One end 214c of the conductor pattern 214b is provided along one edge of the insulating layer 202 forming a part of the first surface 28a of the multilayer body 28, and is connected to the first electrode 30. The other end of the conductor pattern 214b is connected to the conductor pattern 214a. The insulating layer 202 provided with the conductor pattern 214 is disposed on one main face 204a of the insulating layer 204.

A conductor pattern 216 is provided on one main face 204a of the insulating layer 204. The conductor pattern 216 includes conductor patterns 216a and 216b. The conductor pattern 216a is disposed so as to oppose the conductor pattern 214a. One end 216c of the conductor pattern 216b is provided along one edge of the insulating layer 204 forming the second surface 28b of the multilayer body 28, and is connected to the second electrode 32. The other end of the conductor pattern 216b is connected to the conductor pattern 216a.

Examples of materials forming the conductor patterns 214 and 216 include conductors such as gold, platinum, silver, copper, lead, and their alloys. The insulating layers 202 and 204 are made of the same material as that of the insulating layer 200, for example.

The conductor pattern 214a of the conductor pattern 214 and the conductor pattern 216a of the conductor pattern 216 overlie each other in the laminating direction of the multilayer body 28. Thus, the conductor patterns 214 and 216 and the insulating layer 202 form a first capacitance element 56.

The insulating layer 204 provided with the conductor pattern 216 is disposed on one main face 206a of the insulating layer 206. A coil 218 is provided on one main face 206a of the insulating layer 206. The coil 218 is constructed as a conductor pattern. This conductor pattern is made of the same material as that of the conductor pattern 214, whereas the insulating layer 206 is made of the same material as that of the insulating layer 200.

The coil 218 has one end 218a and the other end 218b. One end 218a of the coil 218 is provided along one edge of the insulating layer 206 constructing a part of the first surface 28a of the multilayer body 28, and is connected to the first electrode 30. The coil 218 is used as the above-mentioned first inductor 42 and has the other end 218b connected to one end 220a of a coil 220 through a via. This coil 220 is used as the second inductor 44.

The coil 220 is a conductor pattern provided on one main face 208a of the insulating layer 208. The insulating layer 208 is constructed by the same material as that of the insulating layer 200, whereas the coil 220 is constructed by the same material as that of the conductor pattern 214.

The coil 220 is provided such as to overlap the coil 218 at least partly in the laminating direction orthogonal to the axis X. Namely, the coils 218 and 220 are electromagnetically coupled together so as to yield a desirable coupling factor.

The other end 220b of the coil 220 is provided along one edge of the insulating layer 208 constructing a part of the second surface 28b of the multilayer body 28, and is connected to the second electrode 32. One end 220a of the coil 220 is connected to a conductor pattern 222 through a via.

The conductor pattern 222 is provided on one main face 210a of the semiconductor layer 210. The conductor pattern 222 extends in a direction orthogonal to the axis X. A conductor pattern 224 is provided on one main face 212a of the insulating layer 212 so as to oppose the conductor pattern 222 by way of the semiconductor layer 210. The conductor pattern 224 extends in a direction orthogonal to the axis X, while having one end 224a and the other end 224b provided along the third surface 28c and fourth surface 28d of the multilayer body 28, respectively, and connected to the third electrodes 34 and 36, respectively.

The conductor patterns 222, 224 are made of the same material as that of the conductor pattern 214, for example, whereas the insulating layer 212 is made of the same material as that of the insulating layer 200, for example. The semiconductor layer 210 is made of a semiconductor ceramic material mainly composed of ZnO. Thus, the conductor patterns 222, 224 and the semiconductor layer 210 held therebetween construct a varistor, i.e., surge absorbing element 46.

The multilayer body 28 is formed by laminating the layers formed with the conductor patterns as mentioned above, bonding them together under pressure, and then firing them together. The conductor patterns are each formed by a printing or etching technique, for example. Forming the first electrode 30, second electrode 32, and third electrodes 34, 36 on surfaces of the multilayer body 28 yields the multilayer surge absorbing component 26 shown in FIG. 19.

Since the inductors, surge absorbing elements, and capacitance elements are formed integrally, the surge absorbing circuit 40A of Modified Example 1 made of such a multilayer surge absorbing component 26 is small in size and can reduce the stray capacitance component.

A surge absorbing component for the surge absorbing circuit 40 in the connector in accordance with the first embodiment may have a structure excluding the insulating layer 202 provided with the conductor pattern 214 and the insulating layer 204 provided with the conductor pattern 216 from the above-mentioned multilayer body 28.

[Structure of a multilayer surge absorbing component for the surge absorbing circuit of Modified Example 2 of the first embodiment]

A multilayer surge absorbing component for the surge absorbing circuit 40B in accordance with Modified Example 2 in the connector of the first embodiment will now be explained. The multilayer surge absorbing component for the surge absorbing circuit 40B comprises the first electrode 30, second electrode 32, and third electrodes 34, 36 provided on surfaces of a substantially rectangular parallelepiped multilayer body 28A as with the multilayer surge absorbing component 26 shown in FIG. 19.

Figure 21:
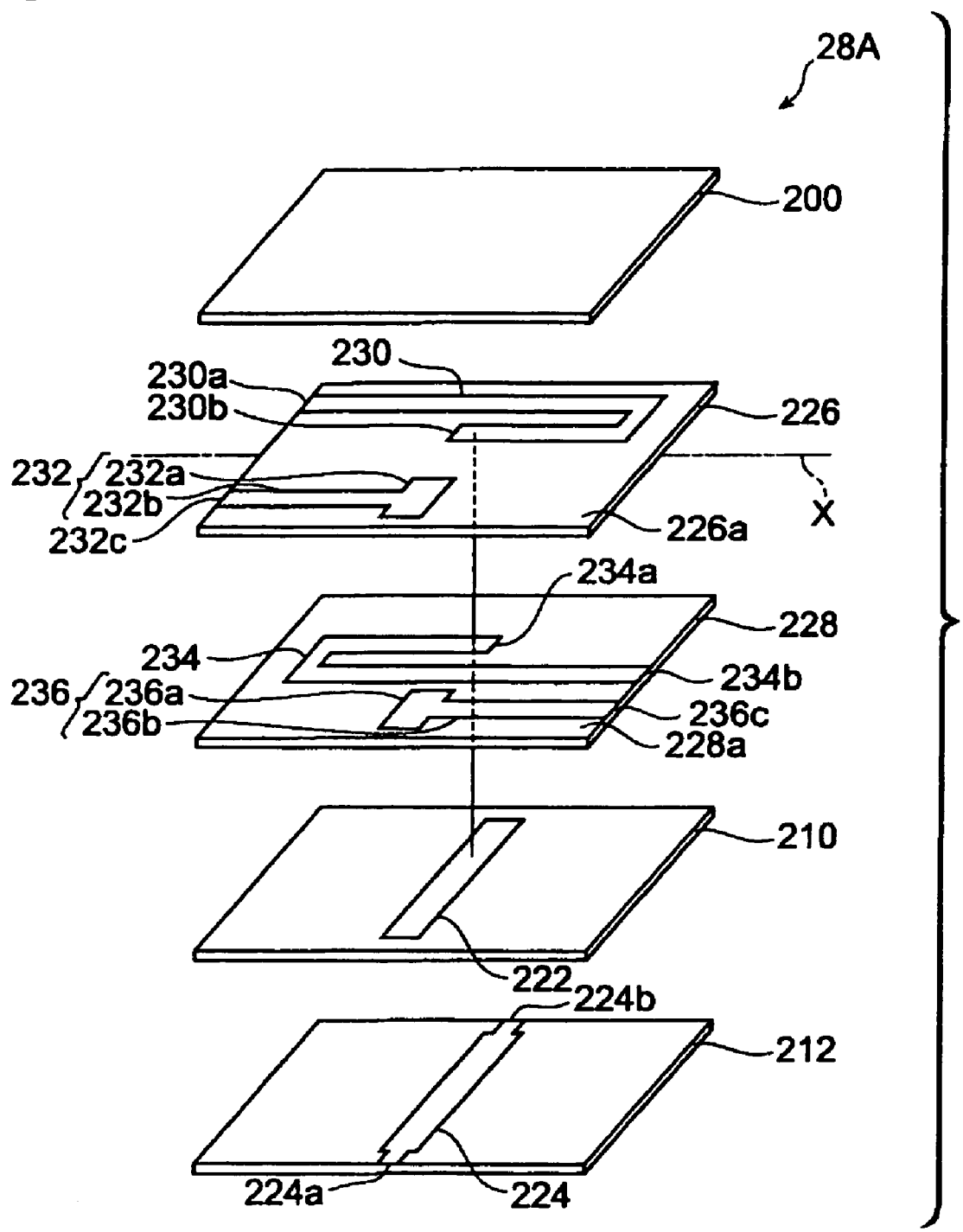
FIG. 21 is an exploded perspective view illustrating layer by layer the multilayer body of the multilayer surge absorbing component for the surge absorbing circuit in accordance with Modified Example 2 in the connector of the first embodiment.

FIG. 21 is an exploded perspective view illustrating layer by layer the multilayer body of the multilayer surge absorbing component for the surge absorbing circuit in accordance with Modified Example 2 in the connector of the first embodiment. The multilayer body 28A shown in FIG. 21 differs from the multilayer body 28 in that it has an insulating layer 226 provided with a coil 230 and a conductor pattern 232 in place of the insulating layer 206 provided with the coil 218, and an insulating layer 228 provided with a coil 234 and a conductor pattern 236 in place of the insulating layer 208 provided with the coil 220. The multilayer body 28A has a structure excluding the insulating layer 202 provided with the conductor pattern 214 and the insulating layer 204 provided with the conductor pattern 216. The other structure of the multilayer body 28A is the same as that of the multilayer body 28.

The coil 230 is provided on one main face 226a of the insulating layer 226. The coil 230 is constructed as a conductor pattern. The coil 230 is used as the above-mentioned first inductor 60. One end 230a of the coil 230 is provided along one edge of the insulating layer 226 constructing a part of one surface orthogonal to the axis X, and is connected to the first electrode 30. The other end 230b of the coil 230 is connected to one end 234a of the coil 234 through a via The coil 234 is provided on one main face 228a of the insulating layer 228. The coil 234 is constructed as a conductor pattern. The coil 234 is used as the above-mentioned second inductor 62. The other end 234b of the coil 234 is provided along one edge of the insulating layer 228 constructing a part of the other surface orthogonal to the axis X, and is connected to the second electrode 32.

The coils 230 and 234 are provided such as to be kept from overlapping each other in the laminating direction orthogonal to the axis X. Namely, the coils 230 and 234 are formed such that the magnetic field generated by the coil 230 and the magnetic field generated by the coil 234 do not influence each other and that their coupling factor becomes 0.01 or less.

The conductor pattern 232 is further provided on one main face 226a of the insulating layer 226. The conductor pattern 232 includes a substantially rectangular conductor pattern 232a and a conductor pattern 232b. One end 232c of the conductor pattern 232b is connected to the first electrode 30, for example, whereas the other end of the conductor pattern 232b is connected to the conductor pattern 232a.

The conductor pattern 236 is further provided on one main face 228a of the insulating layer 228. The conductor pattern 236 includes a substantially rectangular conductor pattern 236a and a conductor pattern 236b. One end 236c of the conductor pattern 236b is connected to the second electrode 32, for example, whereas the other end of the conductor pattern 236b is connected to the conductor pattern 236a.

The conductor patterns 232a and 236a overlie each other in the laminating direction orthogonal to the axis X. Thus, the conductor patterns 232 and 236 opposing each other along the axis X and the insulating layer 226 held between the conductor patterns 232 and 236 construct the capacitance element 56.

The insulating layers 226 and 228 are made of the same material as that of the insulating layer 200, for example, whereas the coil 230, conductor pattern 232, coil 234, and conductor pattern 236 are made of the same material as that of the conductor pattern 214, for example.

Since the inductors, surge absorbing elements, and capacitance elements are formed integrally, the surge absorbing circuit 40B of Modified Example 2 made of such a multilayer surge absorbing component is small in size and can reduce the stray capacitance component.

Figure 22:
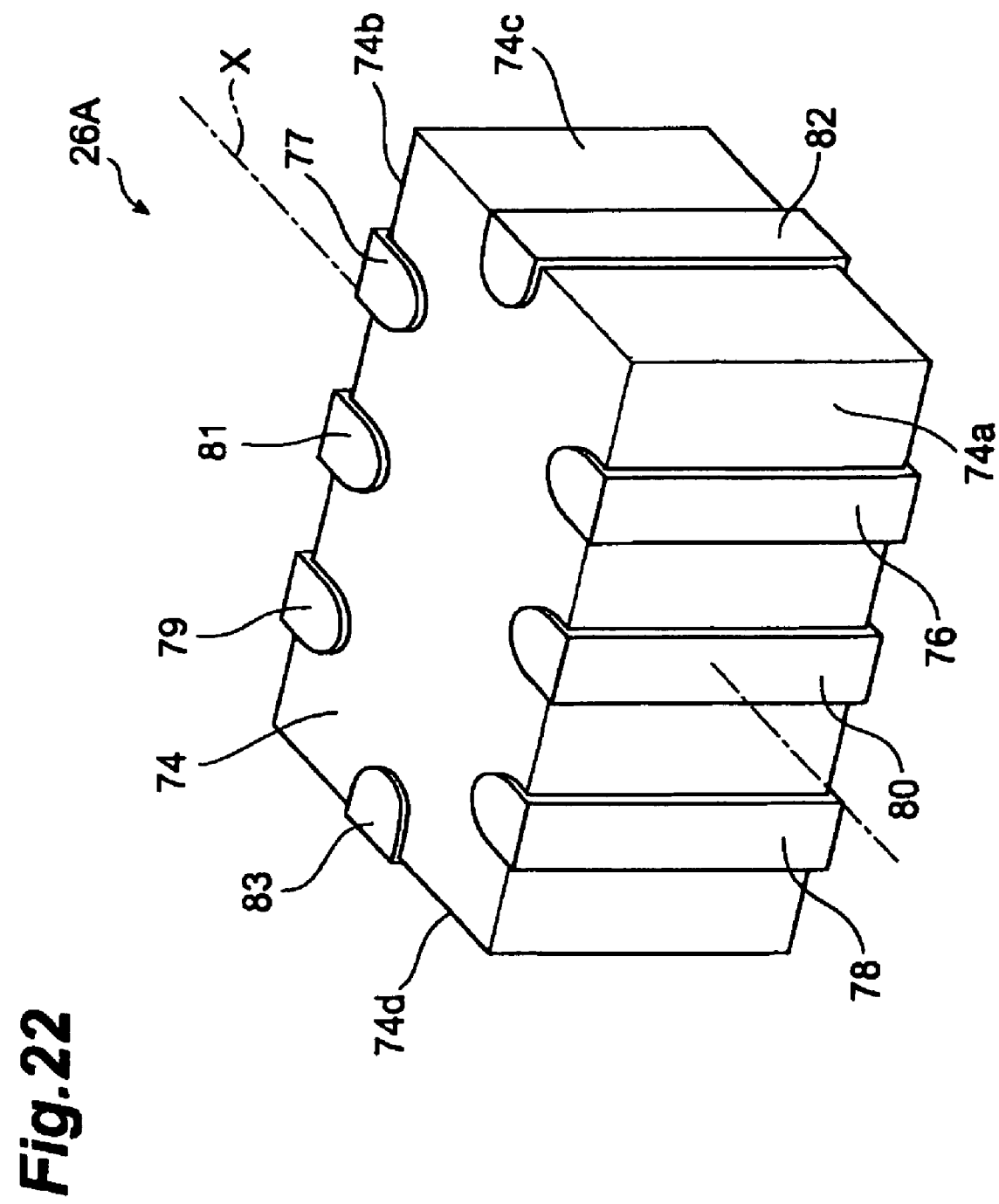
FIG. 22 is a perspective view showing the multilayer surge absorbing component for the surge absorbing circuit in accordance with Modified Example 1 in the connector of the second embodiment.

[Structure of a multilayer surge absorbing component for the surge absorbing circuit of Modified Example 1 of the second embodiment] FIG. 22 is a perspective view showing a multilayer surge absorbing component for the surge absorbing circuit in accordance with Modified Example 1 in the connector of the second embodiment. The multilayer surge absorbing component 26A shown in FIG. 22 is constructed by a substantially rectangular parallelepiped multilayer body 74, a first electrode 76, a second electrode 77, a third electrode 78, a fourth electrode 79, fifth electrodes 80, 81, a sixth electrode 82, and a seventh electrode 83.

The first electrode 76, fifth electrode 80, and third electrode 78 are provided successively on a first surface 74a orthogonal to an axis X of the multilayer body 74. The first electrode 76, fifth electrode 80, and third electrode 78 are formed so as to extend in the laminating direction orthogonal to the axis X.

On the other hand, the second electrode 77, fifth electrode 81, and fourth electrode 79 are provided successively on a second surface 74b opposing the first surface 74a along the axis X. The second electrode 77, fifth electrode 81, and fourth electrode 79 are formed so as to extend in the laminating direction orthogonal to the axis X.

At the center part of a third surface 74c parallel to the axis X of the multilayer body 74, the sixth electrode 82 is provided so as to extend in the laminating direction of the multilayer body 74. Similarly, at the center part of a fourth surface 74d opposing the third surface 74c parallel to the axis X of the multilayer body 74, the seventh electrode 83 is provided so as to extend in the laminating direction of the multilayer body 74. Conductors such as gold, platinum, silver, copper, lead, and their alloys are usable as materials for the first electrode 76, second electrode 77, third electrode 78, fourth electrode 79, fifth electrodes 80, 81, sixth electrode 82, and seventh electrode 83.

Figure 23:
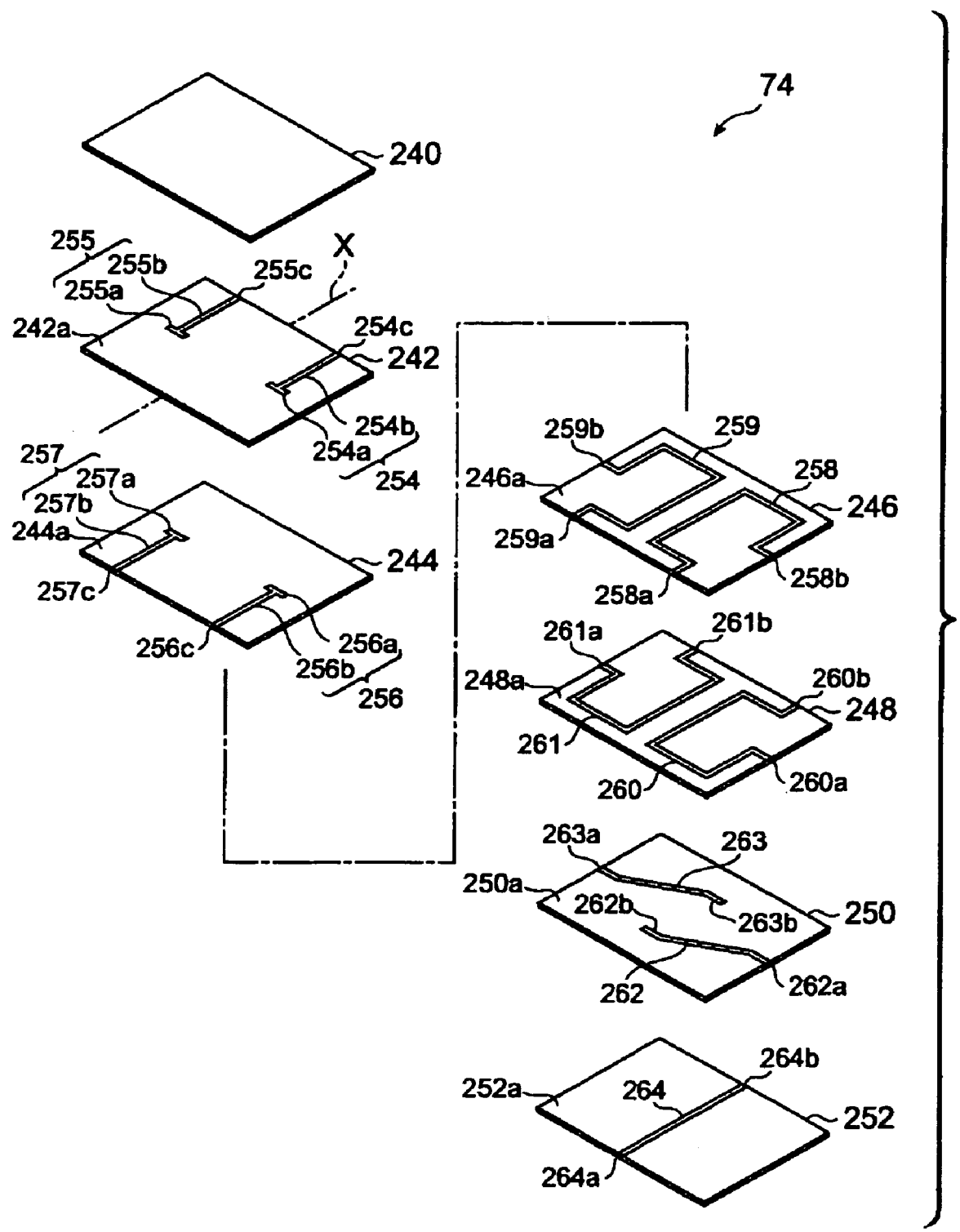
FIG. 23 is an exploded perspective view illustrating layer by layer the multilayer body shown in FIG. 22.

FIG. 23 is an exploded perspective view illustrating layer by layer the multilayer body shown in FIG. 22. The multilayer body 74 is constructed by insulating layers 240, 242, 244, 246, 248, a semiconductor layer 250, an insulating layer 252, and conductor patterns provided on the insulating layers and semiconductor layer.

The insulating layer 240 is made of an insulating material, examples of which include dielectric materials such as glass epoxy resins, fluorine resins, and ceramics. The insulating layer 240 is provided on one main face 242a of the insulating layer 242.

The insulating layer 242 is made of the same material as that of the insulating layer 240, for example. Conductor patterns 254, 255 are formed on one main face 242a of the insulating layer 242. The conductor patterns 254, 255 are covered with the insulating layer 240. The conductor pattern 254 is constructed by a substantially rectangular conductor pattern 254a and a narrow conductor pattern 254b extending along the axis X. One end 254c of the conductor pattern 254b is provided along one edge of the insulating layer 242 forming a part of the second surface 74b of the multilayer body 74, and is connected to the second electrode 77. The other end of the conductor pattern 254b is connected to the conductor pattern 254a.

On the other hand, the conductor pattern 255 is constructed by a substantially rectangular conductor pattern 255a and a narrow conductor pattern 255b extending along the axis X. One end 255c of the conductor pattern 255b is provided along one edge of the insulating layer 242 forming a part of the second surface 74b of the multilayer body 74, and is connected to the fourth electrode 79. The other end of the conductor pattern 255b is connected to the conductor pattern 255a. The insulating layer 242 provided with the conductor patterns 254, 255 is disposed on one main face 244a of the insulating layer 244.

Conductor patterns 256, 257 are provided on one main face 244a of the insulating layer 244. The conductor pattern 256 includes conductor patterns 256a and 256b. The conductor pattern 256a is disposed so as to oppose the conductor pattern 254a. One end 256c of the conductor pattern 256b is provided along one edge of the insulating layer 244 forming the first surface 74a of the multilayer body 74, and is connected to the first electrode 76. The other end of the conductor pattern 256b is connected to the conductor pattern 256a.

On the other hand, the conductor pattern 257 includes conductor patterns 257a and 257b. The conductor pattern 257a is disposed so as to oppose the conductor pattern 255a. One end 257c of the conductor pattern 257b is provided along one edge of the insulating layer 244 forming the first surface 74a of the multilayer body 74, and is connected to the third electrode 78. The other end of the conductor pattern 257b is connected to the conductor pattern 257a.

The conductor patterns 254, 255 and conductor patterns 256, 257 are made of conductors such as gold, platinum, silver, copper, lead, and their alloys, for example. The insulating layers 242 and 244 are made of the same material as that of the insulating layer 240, for example.

The conductor pattern 254a of the conductor pattern 254 and the conductor pattern 256a of the conductor pattern 256 overlie each other in the laminating direction of the multilayer body 74. Thus, the conductor patterns 254 and 256 and the insulating layer 242 held therebetween form the first capacitance element 116.

The conductor pattern 255a of the conductor pattern 255 and the conductor pattern 257a of the conductor pattern 257 overlie each other in the laminating direction of the multilayer body 74. Thus, the conductor patterns 255 and 257 and the insulating layer 242 held therebetween form the second capacitance element 118.

The insulating layer 244 provided with the conductor patterns 256, 257 is disposed on one main face 246a of the insulating layer 246. Coils 258, 259 are formed on one main face 246a of the insulating layer 246. The coils 258, 259 are constructed as respective conductor patterns. These conductor patterns are made of the same material as that of the conductor pattern 254, whereas the insulating layer 246 is made of the same material as that of the insulating layer 240.

The coil 258 has one end 258a and the other end 258b. One end 258a of the coil 258 is provided along one edge of the insulating layer 246 constructing a part of the first surface 74a of the multilayer body 74, and is connected to the fist electrode 76. The coil 258 is used as the above-mentioned first inductor 88. The other end 258b of the coil 258 is provided along one edge of the insulating layer 246 constructing a part of the third surface 74c of the multilayer body 74, and is connected to one end 260a of a coil 260 through the sixth electrode 82. The coil 260 is used as the second inductor 90.

The coil 259 has one end 259a and the other end 259b. One end 259a of the coil 259 is provided along one edge of the insulating layer 246 constructing a part of the first surface 74a of the multilayer body 74, and is connected to the third electrode 78. The coil 259 is used as the above-mentioned third inductor 94. The other end 259b of the coil 259 is provided along one edge of the insulating layer 246 constructing a part of the fourth surface 74d of the multilayer body 74, and is connected to one end 261a of a coil 261 through the seventh electrode 83. The coil 261 is used as the fourth inductor 96.

The coils 260, 261 are conductor patterns provided on one main face 248a of the insulating layer 248. The insulating layer 248 is constructed by the same material as that of the insulating layer 240, whereas the coils 260, 261 are constructed by the same material as that of the conductor pattern 254.

The coil 260 is provided such as to overlap the coil 258 at least partly in the laminating direction orthogonal to the axis X. Namely, the coils 258 and 260 are electromagnetically coupled together so as to yield a desirable coupling factor. The coil 261 is provided such as to overlap the coil 259 at least partly in the laminating direction orthogonal to the axis X. Namely, the coils 259 and 261 are electromagnetically coupled together so as to yield a desirable coupling factor.

The other end 260b of the coil 260 is provided along one edge of the insulating layer 248 constructing a part of the second surface 74b of the multilayer body 74, and is connected to the second electrode 77. One end 260a of the coil 260 is connected to one end 262a of the a conductor pattern 262 through the sixth electrode 82.

On the other hand, the other end 261b of the coil 261 is provided along one edge of the insulating layer 248 constructing a part of the second surface 74b of the multilayer body 74, and is connected to the fourth electrode 79. One end 261a of the coil 261 is connected to one end 263a of the a conductor pattern 263 through the seventh electrode 83.

The conductor patterns 262, 263 are provided on one main face 250a of the semiconductor layer 250. The conductor pattern 262 extends in a direction intersecting the axis X. Similarly, the conductor pattern 263 extends in a direction intersecting the axis X. A conductor pattern 264 is provided on one main face 252a of the insulating layer 252 so as to oppose the other end part 262b of the conductor pattern 262 and the other end part 263b of the conductor pattern 263 by way of the semiconductor layer 250. The conductor pattern 264 extends along the axis X, while having one end 264a and the other end 264b provided along the first surface 74a and second surface 74b of the multilayer body 74, respectively, and connected to the fifth electrodes 80 and 81, respectively.

The conductor patterns 262, 263, 264 are made of the same material as that of the conductor pattern 254, for example, whereas the insulating layer 252 is made of the same material as that of the insulating layer 240, for example. The semiconductor layer 250 is made of a semiconductor ceramic material mainly composed of ZnO. Thus, the other end part 262b of the conductor pattern 262, a part of the conductor pattern 264 opposing the other end part 262b, and the semiconductor layer 250 held between the conductor patterns 262 and 264 construct a varistor, i.e., first surge absorbing element 92.

Similarly, the other end part 263b of the conductor pattern 263, a part of the conductor pattern 264 opposing the other end part 263b, and the semiconductor layer 250 held between the conductor patterns 263 and 264 construct a varistor, i.e., second surge absorbing element 98.

Since the inductors, surge absorbing elements, and capacitance elements are formed integrally, the surge absorbing circuit 86A of Modified Example 1 made of such a multilayer surge absorbing component 26A is small in size and can reduce the stray capacitance component.

It will be sufficient if the surge absorbing circuit 86 in accordance with the second embodiment is constructed by a multilayer surge absorbing component excluding the insulating layer 242 provided with the conductor patterns 254, 255 and the insulating layer 244 provided with the conductor pattern 256, 257 from the above-mentioned multilayer body 74.

[Structure of a multilayer surge absorbing component for the surge absorbing circuit of Modified Example 3 of the second embodiment] A multilayer surge absorbing component for the surge absorbing circuit 86C in accordance with Modified Example 3 in the second embodiment will now be explained. As with the multilayer surge absorbing component 26A shown in FIG. 22, the multilayer surge absorbing component for the surge absorbing circuit 86C comprises a first electrode 76, a second electrode 77, a third electrode 78, a fourth electrode 79, fifth electrodes 80, 81, a sixth electrode 82, and a seventh electrode 83 which are provided on surfaces of a substantially rectangular parallelepiped multilayer body 74A.

Figure 24:
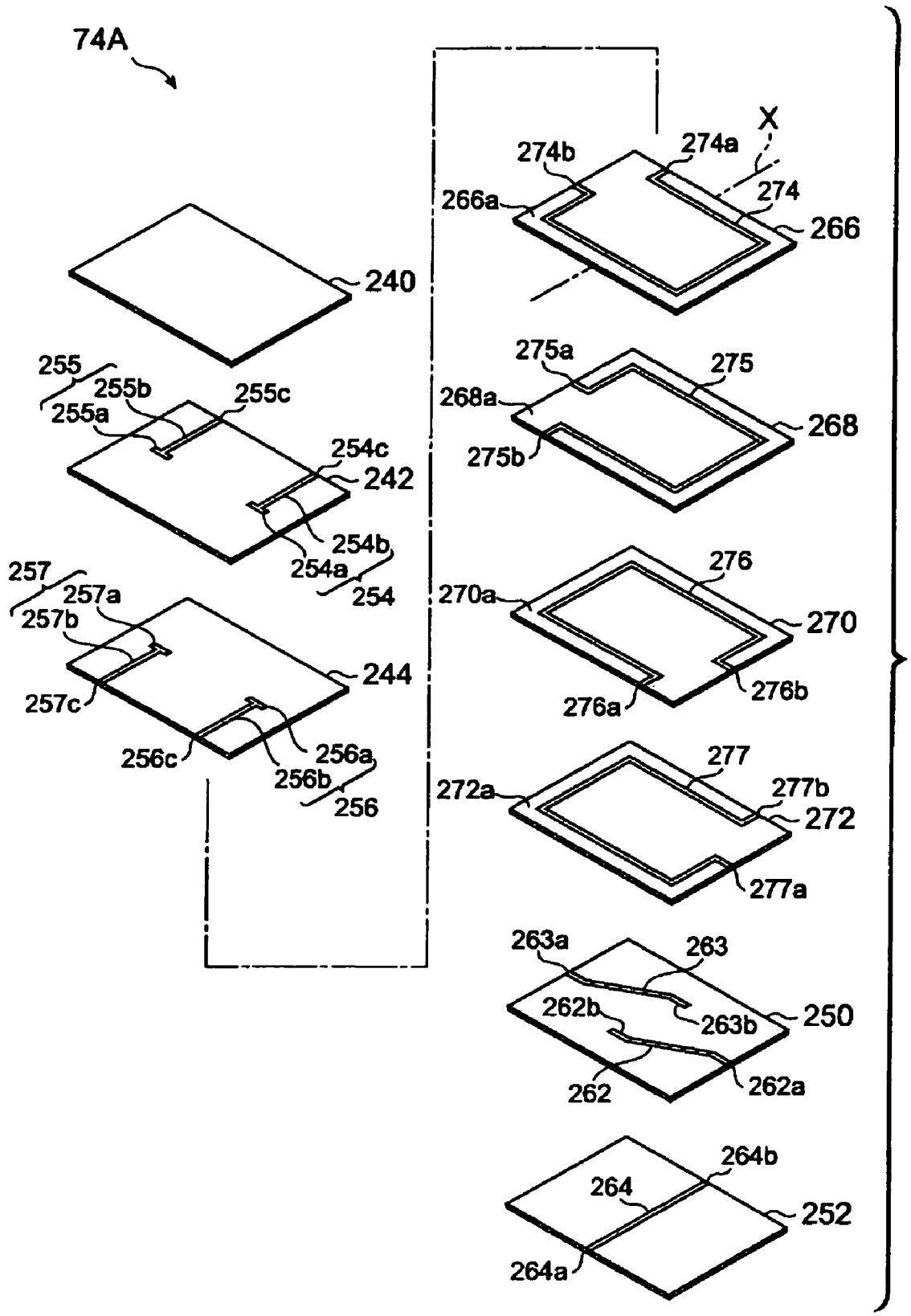
FIG. 24 is an exploded perspective view illustrating layer by layer the multilayer body of the multilayer surge absorbing component for the surge absorbing circuit in accordance with Modified Example 3 in the connector of the second embodiment.

FIG. 24 is an exploded perspective view illustrating layer by layer the multilayer body of the multilayer surge absorbing component for the surge absorbing circuit in accordance with Modified Example 3 in the connector of the second embodiment. This multilayer body 74A differs from the multilayer body 74 in that it has an insulating layer 266 provided with a coil 274, an insulating layer 268 provided with a coil 275, an insulating layer 270 provided with a coil 276, and an insulating layer 272 provided with a coil 277 in place of the insulating layer 246 provided with the coils 258, 259 and the insulating layer 248 provided with the coils 260, 261. The other structure of the multilayer body 74A is the same as that of the multilayer body 74.

The coil 274 is provided on one main face 266a of the insulating layer 266. The coil 274 is constructed as a conductor pattern. The coil 274 is used as the above-mentioned fourth inductor 126. One end 274a of the coil 274 is provided along one edge of the insulating layer 266 constructing a part of one surface orthogonal to the axis X, and is connected to the fourth electrode 79. The other end 274b of the coil 274 is provided along one edge of the insulating layer 266 constructing a part of one surface parallel to the axis X, and is connected to one end 275a of the coil 275 through the seventh electrode 83.

The coil 275 is provided on one main face 268a of the insulating layer 268. The coil 275 is constructed as a conductor pattern. The coil 275 is used as the above-mentioned third inductor 124. The other end 275b of the coil 275 is provided along one edge of the insulating layer 268 constructing a part of the other surface orthogonal to the axis X, and is connected to the third electrode 78. The insulating layer 268 formed with the coil 275 is provided on one main face 270a of the insulating layer 270.

The coil 276 is provided on one main face 270a of the insulating layer 270. The coil 276 is constructed as a conductor pattern. The coil 276 is used as the above-mentioned first inductor 120. One end 276a of the coil 276 is provided along one edge of the insulating layer 270 constructing a part of one surface orthogonal to the axis X and is connected to the first electrode 76. The other end 276b of the coil 276 is provided along one edge of the insulating layer 270 constructing a part of the other surface parallel to the axis X, and is connected to one end 277a of the coil 277 through the sixth electrode 82.

The coil 277 is provided on one main face 272a of the insulating layer 272. The coil 277 is constructed as a conductor pattern. The coil 277 is used as the above-mentioned second inductor 122. The other end 277b of the coil 277 is provided along one edge of the insulating layer 272 constructing a part of the other surface orthogonal to the axis X, and is connected to the second electrode 77.

The coils 274, 275, 276, and 277 are provided such as to overlap each other at least partly in the laminating direction orthogonal to the axis X. Namely, the coils 274, 275, 276, and 277 are electromagnetically coupled together so as to yield a desirable coupling factor.

The coils 274, 275, 276, and 277 are made of the same material as that of the conductor pattern 254, for example, whereas the insulating layers 266, 268, 270, 272 are made of the same material as that of the insulating layer 240, for example.

Since the inductors, surge absorbing elements, and capacitance elements are formed integrally, the surge absorbing circuit 86C of Modified Example 3 made of such a multilayer surge absorbing component is small in size and can reduce the stray capacitance component.

It will be sufficient if the surge absorbing circuit 86B in accordance Modified Example 2 in the second embodiment is constructed by a multilayer surge absorbing component excluding the insulating layer 242 provided with the conductor patterns 254, 255 and the insulating layer 244 provided with the conductor patterns 256, 257 from the above-mentioned multilayer body 74A.

[Structure of a multilayer surge absorbing component for the surge absorbing circuit of Modified Example 4 of the second embodiment] A multilayer surge absorbing component for the surge absorbing circuit 86E in accordance with Modified Example 4 in the second embodiment will now be explained. As with the multilayer surge absorbing component 26A shown in FIG. 22, the multilayer surge absorbing component for the surge absorbing circuit 86D comprises a first electrode 76, a second electrode 77, a third electrode 78, a fourth electrode 79, fifth electrodes 80, 81, a sixth electrode 82, and a seventh electrode 83 which are provided on surfaces of a substantially rectangular parallelepiped multilayer body 74B.

Figure 25:
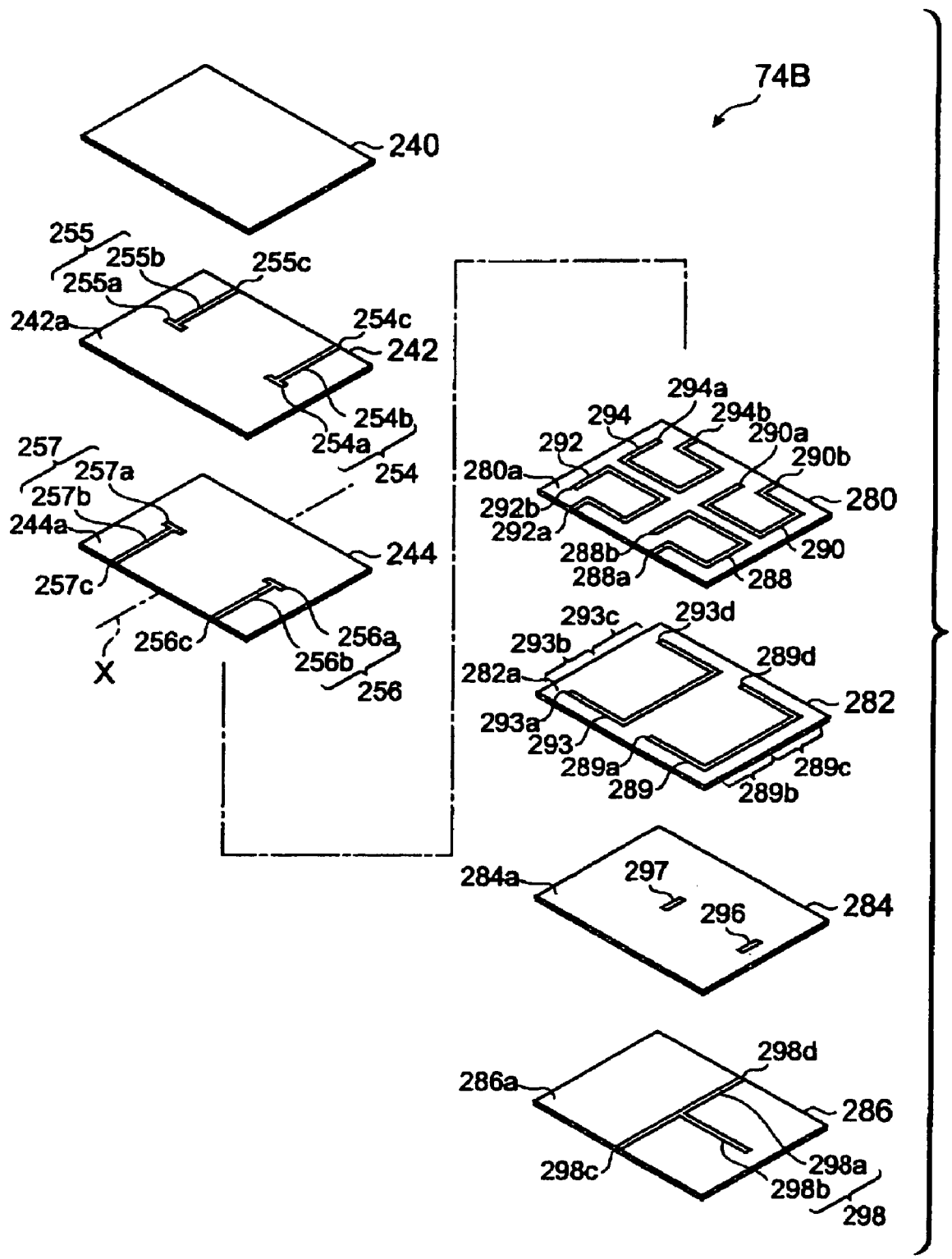
FIG. 25 is an exploded perspective view illustrating layer by layer the multilayer body of the multilayer surge absorbing component for the surge absorbing circuit in accordance with Modified Example 4 in the connector of the second embodiment.

FIG. 25 is an exploded perspective view illustrating layer by layer the multilayer body of the multilayer surge absorbing component for the surge absorbing circuit in accordance with Modified Example 4 in the connector of the second embodiment. This multilayer body 74B differs from the multilayer body 74 in that it has an insulating layer 280 provided with coils 288, 290, 292, 294, an insulating layer 282 provided with coils 289, 293, an insulating layer 284 provided with conductor patterns 296, 297, and an insulating layer 286 provided with a conductor pattern 298 in place of the insulating layer 246 provided with the coils 258, 259, the insulating layer 248 provided with the coils 260, 261, the semiconductor layer 250 provided with the conductor patterns 262, 263, and the insulating layer 252 provided with the conductor pattern 264. The other structure of the multilayer body 74B is the same as that of the multilayer body 74.

The coils 288, 290, 292, 294 are provided on one main face 280a of the insulating layer 280. The coils 288, 290, 292, 294 are constructed as respective conductor patterns. One end 288a of the coil 288 is provided along one edge of the insulating layer 280 constructing a part of one surface orthogonal to the axis X, and is connected to the first electrode 76. The other end 288b of the coil 288 is connected to one end 289a of the coil 289 through a via.

On the other hand, one end 292a of the coil 292 is provided along one edge of the insulating layer 280 constructing a part of one surface orthogonal to the axis X and is connected to the third electrode 78. The other end 292b of the coil 292 is connected to one end 293a of the coil 293 through a via.

The coils 289 and 293 are provided on one main face 282a of the insulating layer 282. The coils 289 and 293 are constructed as conductor patterns. The coil 289 is substantially equally divided into a first part 289b and a second part 289c. Similarly, the coil 293 is substantially equally divided into a first part 293b and a second part 293c. The first part 289b of the coil 289 and the coil 288 are used as the first inductor 140, whereas the first part 293b of the coil 293 and the coil 292 are used as the third inductor 144.

The other end 289d of the coil 289 is connected through a via to one end 290a of the coil 290 provided on the insulating layer 280. The other end 293d of the coil 293 is connected through a via to one end 294a of the coil 294 provided on the insulating layer 280. The other end 290b of the coil 290 is provided along one edge of the insulating layer 280 constructing a part of the other surface orthogonal to the axis X, and is connected to the second electrode 77. The other end 294b of the coil 294 is provided along one edge of the insulating layer 280 constructing a part of the other surface orthogonal to the axis X, and is connected to the fourth electrode 79. The coil 290 and the second part 289c of the coil 289 are used as the second inductor 142, whereas the coil 294 and the second part 293c of the coil 293 are used as the fourth inductor 146.

The coils 288 and 292 are provided close to each other. Namely, the coils 288 and 292 are electromagnetically coupled together so as to yield a desirable coupling factor. Similarly, the coils 290 and 294 are close to each other, and are electromagnetically coupled together so as to yield a desirable coupling factor.

The coils 288, 289, 290, 292, 293, 294 are made of the same material as that of the conductor pattern 254, for example, whereas the insulating layers 280, 282 are made of the same material as that of the insulating layer 240, for example.

The part between the first part 289b and second part 289c of the coil 289 is connected to the conductor pattern 296 through a via, whereas the part between the first part 293b and second part 293c of the coil 293 is connected to the conductor pattern 297 through a via.

The conductor patterns 296, 297 are provided on one main face 284a of the semiconductor layer 284. The semiconductor layer 284 is provided on one main face 286a of the insulating layer 286. The conductor pattern 298 is provided on one main face 286a of the insulating layer 286. The conductor pattern 298 has a conductor pattern 298a extending along the axis X and a conductor pattern 298b orthogonal to the axis X. One end 298c and the other end 298d of the conductor pattern 298a are provided along one surface and the other surface orthogonal to the axis X of the multilayer body 74B and connected to the fifth electrodes 80, 81, respectively. The conductor pattern 298b is provided so as to overlie the conductor patterns 296 and 297 in the laminating direction orthogonal to the axis X. One end of the conductor pattern 298b is connected to the pattern 298a The conductor patterns 296, 297, 298 are made of the same material as that of the conductor pattern 294, for example, whereas the insulating layer 286 is made of the same material as that of the insulating layer 240, for example. The semiconductor layer 284 is made of a semiconductor ceramic material mainly composed of ZnO. Thus, the conductor pattern 296, a part of the conductor pattern 298 opposing the conductor pattern 296, and the semiconductor layer 284 held between the conductor patterns 296 and 298 construct a varistor, i.e., first surge absorbing element 92.

Similarly, the conductor pattern 297, a part of the conductor pattern 298 opposing the conductor pattern 297, and the semiconductor layer 284 held between the conductor patterns 297 and 298 construct a varistor, i.e., second surge absorbing element 98.

Since the inductors, surge absorbing elements, and capacitance elements are formed integrally, the surge absorbing circuit 86D of Modified Example 4 made of such a multilayer surge absorbing component is small in size and can reduce the stray capacitance component.

[Structure of a multilayer surge absorbing component for the surge absorbing circuit of Modified Example 5 of the second embodiment] A multilayer surge absorbing component for the surge absorbing circuit 86E in accordance with Modified Example 5 in the second embodiment will now be explained. As with the multilayer surge absorbing component 26A shown in FIG. 22, the multilayer surge absorbing component for the surge absorbing circuit 86E comprises a first electrode 76, a second electrode 77, a third electrode 78, a fourth electrode 79, fifth electrodes 80, 81, a sixth electrode 82, and a seventh electrode 83 which are provided on surfaces of a substantially rectangular parallelepiped multilayer body 74C.

Figure 26:
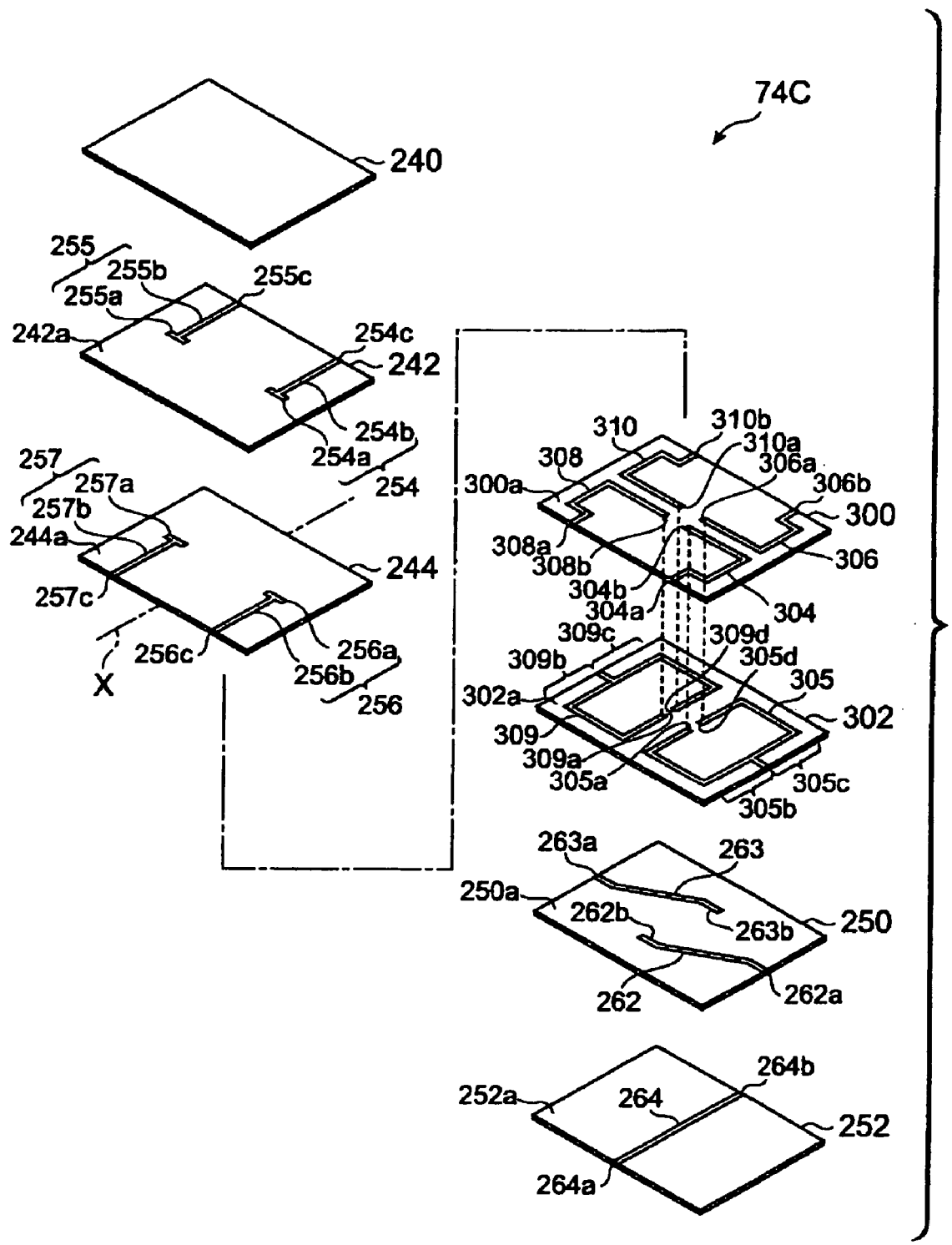
FIG. 26 is an exploded perspective view illustrating layer by layer the multilayer body of the multilayer surge absorbing component for the surge absorbing circuit in accordance with Modified Example 5 in the connector of the second embodiment.

FIG. 26 is an exploded perspective view illustrating layer by layer the multilayer body of the multilayer surge absorbing component for the surge absorbing circuit in accordance with Modified Example 5 in the connector of the second embodiment. This multilayer body 74C differs from the multilayer body 74 in that it has an insulating layer 300 provided with coils 304, 306, 308, 310 and an insulating layer 302 provided with coils 305, 309 in place of the insulating layer 246 provided with the coils 258, 259 and the insulating layer 248 provided with the coils 260, 261. The other structure of the multilayer body 74C is the same as that of the multilayer body 74.

The coils 304, 306, 308, 310 are provided on one main face 300a of the insulating layer 300. The coils 304, 306, 308, 310 are constructed as respective conductor patterns. One end 304a of the coil 304 is provided along one edge of the insulating layer 300 constructing a part of one surface orthogonal to the axis X, and is connected to the first electrode 76. The other end 304b of the coil 304 is connected to one end 305a of the coil 305 through a via.

On the other hand, one end 308a of the coil 308 is provided along one edge of the insulating layer 300 constructing a part of one surface orthogonal to the axis X, and is connected to the third electrode 78. The other end 308b of the coil 308 is connected to one end 309a of the coil 309 through a via.

The coils 305 and 309 are provided on one main face 302a of the insulating layer 302. The coils 305 and 309 are constructed as conductor patterns. The coil 305 is substantially equally divided into a first part 305b and a second part 305c. Similarly, the coil 309 is substantially equally divided into a first part 309b and a second part 309c. The first part 305b of the coil 305 and the coil 304 are used as the first inductor 148, whereas the first part 309b of the coil 309 and the coil 308 are used as the third inductor 152.

Through a via, the other end 305d of the coil 305 is connected to one end 306a of the coil 306 provided in the insulating layer 300. Through a via, the other end 309d of the coil 309 is connected to one end 310a of the coil 310 provided in the insulating layer 300. The other end 306b of the coil 306 is provided along one edge of the insulating layer 300 constructing a part of the other surface orthogonal to the axis X, and is connected to the second electrode 77. The other end 310b of the coil 310 is provided along one edge of the insulating layer 300 constructing a part of the other surface orthogonal to the axis X, and is connected to the fourth electrode 79. The coil 306 and the second part 305c of the coil 305 are used as the second inductor 150, whereas the coil 310 and the second part 309c of the coil 309 are used as the fourth inductor 154.

The coils 304, 306, 308, 310 are separated from each other, whereas the coils 305 and 309 are separated from each other. Namely, the coils 304, 306, 308, 310 are formed such that the respective magnetic fields generated by the coils 304, 306, 308, 310 are kept from influencing each other, while their coupling factor becomes 0.01 or less. The coils 305 and 309 are formed such that the respective magnetic fields generated by the coils 305 and 309 are kept from influencing each other, while their coupling factor becomes 0.01 or less.

The part between the first part 305b and second part 305c in the coil 305 is connected to the sixth electrode 82, whereas the part between the first part 309b and second part 309c in the coil 309 is connected to the seventh electrode 83.

The coils 304, 305, 306, 308, 309, 310 are made of the same material as that of the conductor pattern 254, for example, whereas the insulating layers 300, 302 are made of the same material as that of the insulating layer 240.

Since the inductors, surge absorbing elements, and capacitance elements are formed integrally, the surge absorbing circuit 86E of Modified Example 5 made of such a multilayer surge absorbing component is small in size and can reduce the stray capacitance component.

The present invention can be modified in various ways without being restricted to the above-mentioned embodiments.

Though the above-mentioned embodiments illustrate an example of USB connectors, the mode of the connector in accordance with the present invention is not limited to these embodiments. The surge absorbing circuits of the embodiments can be mounted to various forms of connectors.

Though the above-mentioned embodiments use a varistor made of a metal oxide such as ZnO, pn junction devices made of semiconductors such as Si, surge absorbing elements made of molybdenum, gap discharge devices utilizing discharges between electrodes, and the like are employable as the surge absorbing element.

Though these embodiments exemplify multilayer surge absorbing components which realize a surge absorbing circuit, methods of realizing a surge absorbing circuit are not limited to these embodiments. The structure of the multilayer body of the multilayer surge absorbing component may have various modes without being restricted to the embodiments. The surge absorbing circuit may directly be formed on the above-mentioned substrates 14, 14A.

What is claimed is:

1. A connector comprising:
a first terminal;
a second terminal connected to the first terminal;
a third terminal;
a fourth terminal connected to the third terminal; and
a surge absorbing circuit provided between the first and second terminals and between the third and fourth terminals;
the surge absorbing circuit comprising:
a first inductor having one end connected to the first terminal;
a second inductor having one end connected to the other end of the first inductor and the other end connected to the second terminal, the first and second inductors being electromagnetically coupled together so as to increase each other's inductance;
a third inductor having one end connected to the third terminal;
a fourth inductor having one end connected to the other end of the third inductor and the other end connected to the fourth terminal, the third and fourth inductors being electromagnetically coupled together so as to increase each other's inductance;
a first surge absorbing element having one end connected to the other end of the first inductor and the one end of the second inductor and the other end connected to a ground terminal; and
a second surge absorbing element having one end connected to the other end of the third inductor and the one end of the fourth inductor and the other end connected to the ground terminal.

2. A connector according to claim 1, wherein the surge absorbing circuit further comprises:
a first capacitance element provided between the one end of the first inductor and the other end of the second inductor; and
a second capacitance element provided between the one end of the third inductor and the other end of the fourth inductor.

3. A connector comprising:
a first terminal;
a second terminal connected to the first terminal;
a third terminal;
a fourth terminal connected to the third terminal; and
a surge absorbing circuit provided between the first and second terminals and between the third and fourth terminals;
the surge absorbing circuit comprising:
a first inductor having one end connected to the first terminal;
a second inductor having one end connected to the other end of the first inductor and the other end connected to the second terminal;
a third inductor having one end connected to the third terminal;
a fourth inductor having one end connected to the other end of the third inductor and the other end connected to the fourth terminal;
a first surge absorbing element having one end connected to the other end of the first inductor and the one end of the second inductor and the other end connected to a ground terminal; and
a second surge absorbing element having one end connected to the other end of the third inductor and the one end of the fourth inductor and the other end connected to the ground terminal;
the first, second, third, and fourth inductors being electromagnetically coupled together so as to increase each other's inductance when a differential signal is applied thereto.

4. A connector according to claim 3, wherein the surge absorbing circuit further comprises:
a first capacitance element provided between the one end of the first inductor and the other end of the second inductor; and
a second capacitance element provided between the one end of the third inductor and the other end of the fourth inductor.

5. A connector comprising:
a first terminal;
a second terminal connected to the first terminal;
a third terminal;
a fourth terminal connected to the third terminal; and
a surge absorbing circuit provided between the first and second terminals and between the third and fourth terminals;
the surge absorbing circuit comprising:
a first inductor having one end connected to the first terminal;
a second inductor having one end connected to the other end of the first inductor and the other end connected to the second terminal;
a third inductor having one end connected to the third terminal, the first and third inductors being electromagnetically coupled together so as to increase each other's inductance when a differential signal is applied thereto;
a fourth inductor having one end connected to the other end of the third terminal and the other end connected to the fourth terminal, the second and fourth inductors being electromagnetically coupled together so as to increase each other's inductance when a differential signal is applied thereto;

a first surge absorbing element having one end connected to the other end of the first inductor and the one end of the second inductor and the other end connected to a ground terminal;

a second surge absorbing element having one end connected to the other end of the third inductor and the one end of the fourth inductor and the other end connected to the ground terminal;

a first capacitance element provided between the one end of the first inductor and the other end of the second inductor; and a second capacitance element provided between the one end of the third inductor and the other end of the fourth inductor.

6. A connector comprising:

a first terminal;

a second terminal connected to the first terminal;

a third terminal;

a fourth terminal connected to the third terminal; and a surge absorbing circuit provided between the first and second terminals and between the third and fourth terminals;

the surge absorbing circuit comprising:

a first inductor having one end connected to the first terminal;

a second inductor having one end connected to the other end of the first inductor and the other end connected to the second terminal;

a third inductor having one end connected to the third terminal;

a fourth inductor having one end connected to the other end of the third inductor and the other end connected to the fourth terminal;

a first surge absorbing element having one end connected to the other end of the first inductor and the one end of the second inductor and the other end connected to a ground terminal;

a second surge absorbing element having one end connected to the other end of the third inductor and the one end of the fourth inductor and the other end connected to the ground terminal;

a first capacitance element provided between the one end of the first inductor and the other end of the second inductor; and a second capacitance element provided between the one end of the third inductor and the other end of the fourth inductor.

* * * * *